US009356054B2

(12) United States Patent
Miyairi et al.

(10) Patent No.: US 9,356,054 B2
(45) Date of Patent: May 31, 2016

(54) SEMICONDUCTOR DEVICE

(71) Applicant: Semiconductor Energy Laboratory Co., Ltd., Atsugi-shi, Kanagawa-ken (JP)

(72) Inventors: Hidekazu Miyairi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/578,919

(22) Filed: Dec. 22, 2014

(65) Prior Publication Data

US 2015/0187823 A1    Jul. 2, 2015

(30) Foreign Application Priority Data

Dec. 27, 2013   (JP) .................................. 2013-272190

(51) Int. Cl.
| | | |
|---|---|---|
| H01L 27/12 | (2006.01) | |
| H01L 29/78 | (2006.01) | |
| H01L 29/786 | (2006.01) | |

(52) U.S. Cl.
CPC ........ H01L 27/1255 (2013.01); H01L 27/1225 (2013.01); H01L 27/1251 (2013.01); H01L 29/7869 (2013.01); H01L 29/78606 (2013.01); H01L 29/78651 (2013.01)

(58) Field of Classification Search
CPC ............ H01L 27/1225; H01L 27/1251; H01L 27/1255; H01L 29/7869; H01L 29/78606; H01L 29/78651
USPC ........ 257/43, 57, 67, 296, E27.026, E27.062, 257/E29.296, E21.476, E21.614; 438/104, 438/149, 151, 199; 365/149, 154
See application file for complete search history.

(56) References Cited

U.S. PATENT DOCUMENTS

| | | |
|---|---|---|
| 5,282,162 A | 1/1994 | Ochii |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| CN | 103022012 A | 4/2013 |
| EP | 1737044 A | 12/2006 |

(Continued)

OTHER PUBLICATIONS

International Search Report (Application No. PCT/IB2014/066941) Dated Apr. 21, 2015.

(Continued)

*Primary Examiner* — Dao H Nguyen
(74) *Attorney, Agent, or Firm* — Fish & Richardson P.C.

(57) ABSTRACT

A semiconductor device that is suitable for miniaturization is provided. Alternatively, a highly reliable semiconductor device is provided. A semiconductor device including a capacitor and a transistor is provided. In the semiconductor device, the transistor includes a semiconductor layer, the semiconductor layer is positioned over the capacitor, and the capacitor includes a first electrode that is electrically connected to the transistor.

16 Claims, 43 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,183,630 B2 | 5/2012 | Batude et al. |
| 8,575,985 B2 | 11/2013 | Ohmaru et al. |
| 8,773,906 B2 * | 7/2014 | Ohmaru .................. 365/185.08 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294822 A1 | 12/2009 | Batude et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0227143 A1 | 9/2011 | Lee et al. |
| 2011/0248270 A1 | 10/2011 | Fukumoto et al. |
| 2012/0170355 A1 * | 7/2012 | Ohmaru et al. ............... 365/149 |
| 2013/0020570 A1 * | 1/2013 | Yamazaki .................. 257/43 |
| 2013/0048977 A1 | 2/2013 | Watanabe et al. |
| 2013/0069132 A1 | 3/2013 | Atsumi et al. |
| 2013/0140569 A1 * | 6/2013 | Yoneda et al. .................. 257/57 |
| 2013/0193433 A1 | 8/2013 | Yamazaki |
| 2013/0234131 A1 | 9/2013 | Tanaka et al. |
| 2013/0270552 A1 | 10/2013 | Yamazaki et al. |
| 2013/0299818 A1 | 11/2013 | Tanaka |
| 2013/0320330 A1 | 12/2013 | Yamazaki |
| 2014/0004656 A1 | 1/2014 | Sasagawa et al. |
| 2014/0048802 A1 | 2/2014 | Ohmaru et al. |
| 2014/0325249 A1 | 10/2014 | Toyotaka |
| 2014/0326992 A1 | 11/2014 | Hondo et al. |
| 2014/0326994 A1 | 11/2014 | Tanaka |
| 2014/0332802 A1 | 11/2014 | Hanaoka |
| 2015/0108470 A1 | 4/2015 | Yamazaki et al. |
| 2015/0187814 A1 * | 7/2015 | Miyairi ............... H01L 27/1207 257/43 |
| 2015/0214256 A1 * | 7/2015 | Miyairi ............... H01L 27/1248 257/43 |

FOREIGN PATENT DOCUMENTS

| | | |
|---|---|---|
| EP | 2131397 A | 12/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-275613 A | 10/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-200640 A | 7/2004 |
| JP | 2004-273614 A | 9/2004 |
| JP | 2004-273732 A | 9/2004 |
| JP | 2005-109063 A | 4/2005 |
| JP | 2007-096055 A | 4/2007 |
| JP | 2007-123861 A | 5/2007 |
| JP | 2009-302530 A | 12/2009 |
| JP | 2013-009297 A | 1/2013 |
| JP | 2013-102133 A | 5/2013 |
| JP | 2013-207771 A | 10/2013 |
| KR | 2012-0079817 A | 7/2012 |
| KR | 2013-0031794 A | 3/2013 |

(56) References Cited

FOREIGN PATENT DOCUMENTS

| TW | 201239882 | 10/2012 |
|---|---|---|
| TW | 201330231 | 7/2013 |
| WO | WO-2004/114391 | 12/2004 |

OTHER PUBLICATIONS

Written Opinion (Application No. PCT/IB2014/066941) Dated Apr. 21, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advancwed Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(AnO)3, and Ga2O3(AnO)m (m=7,8,9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest D9 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphouse In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633, 636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

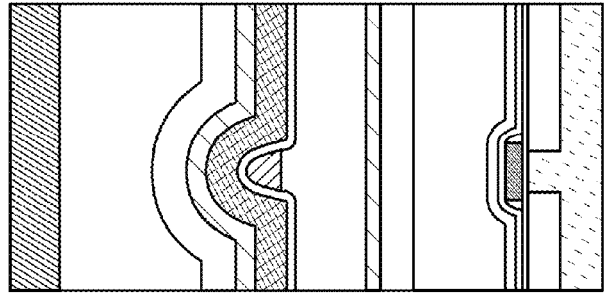
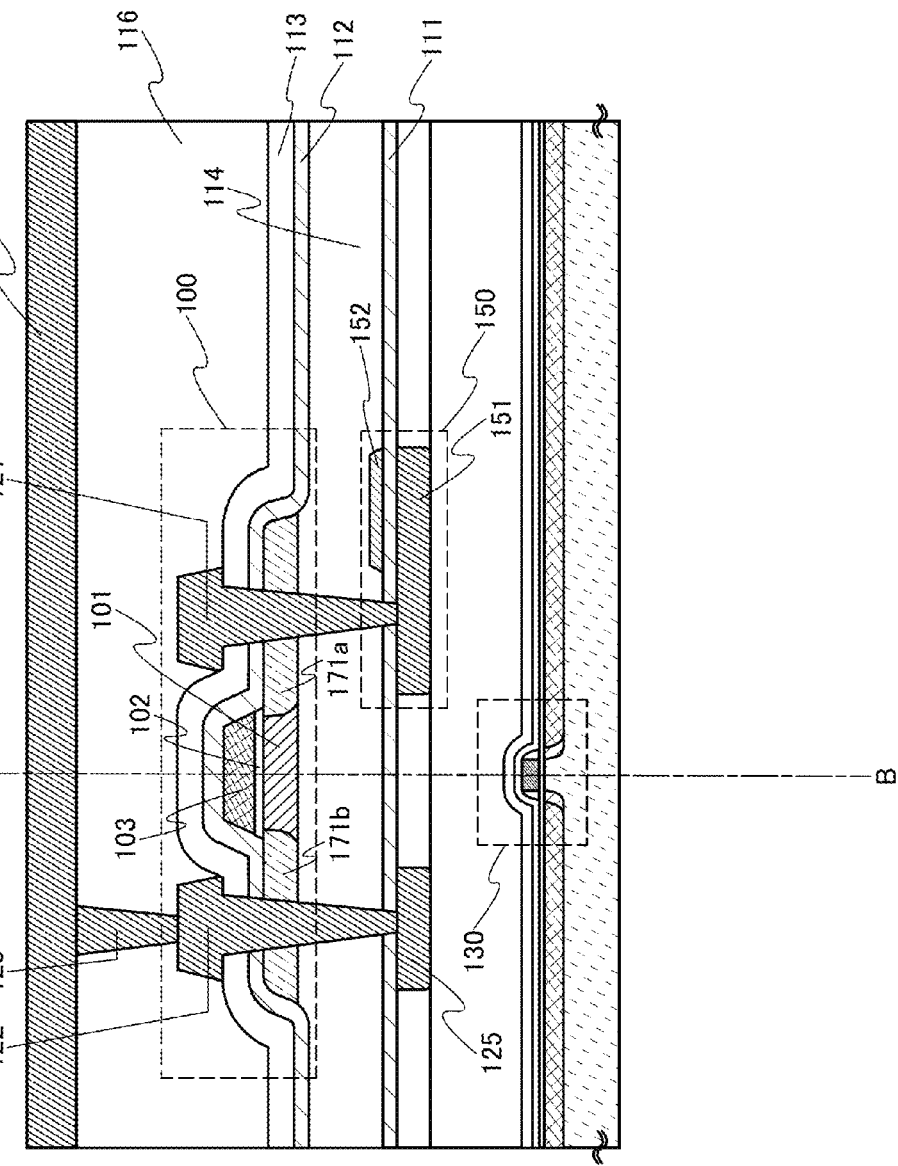

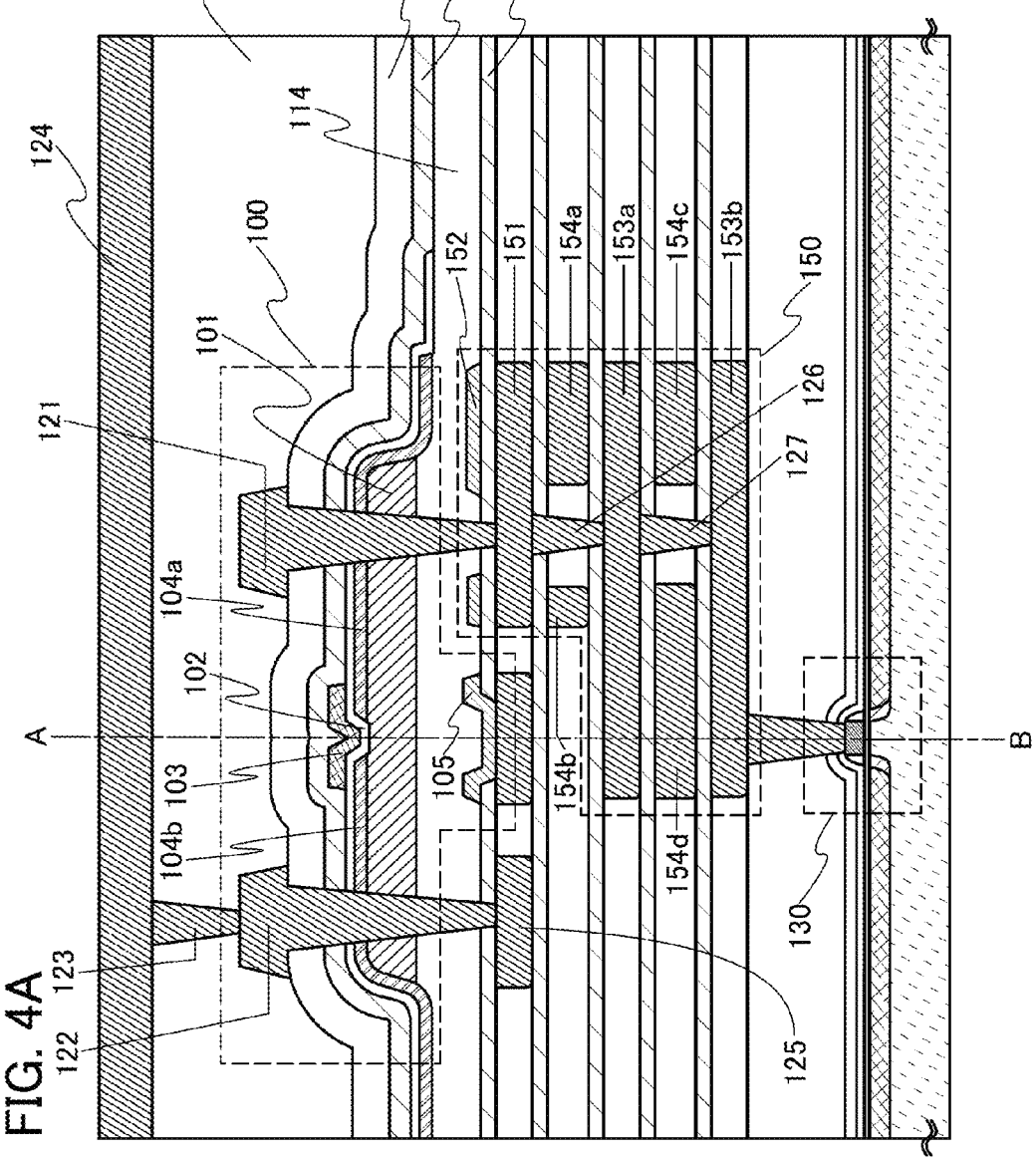

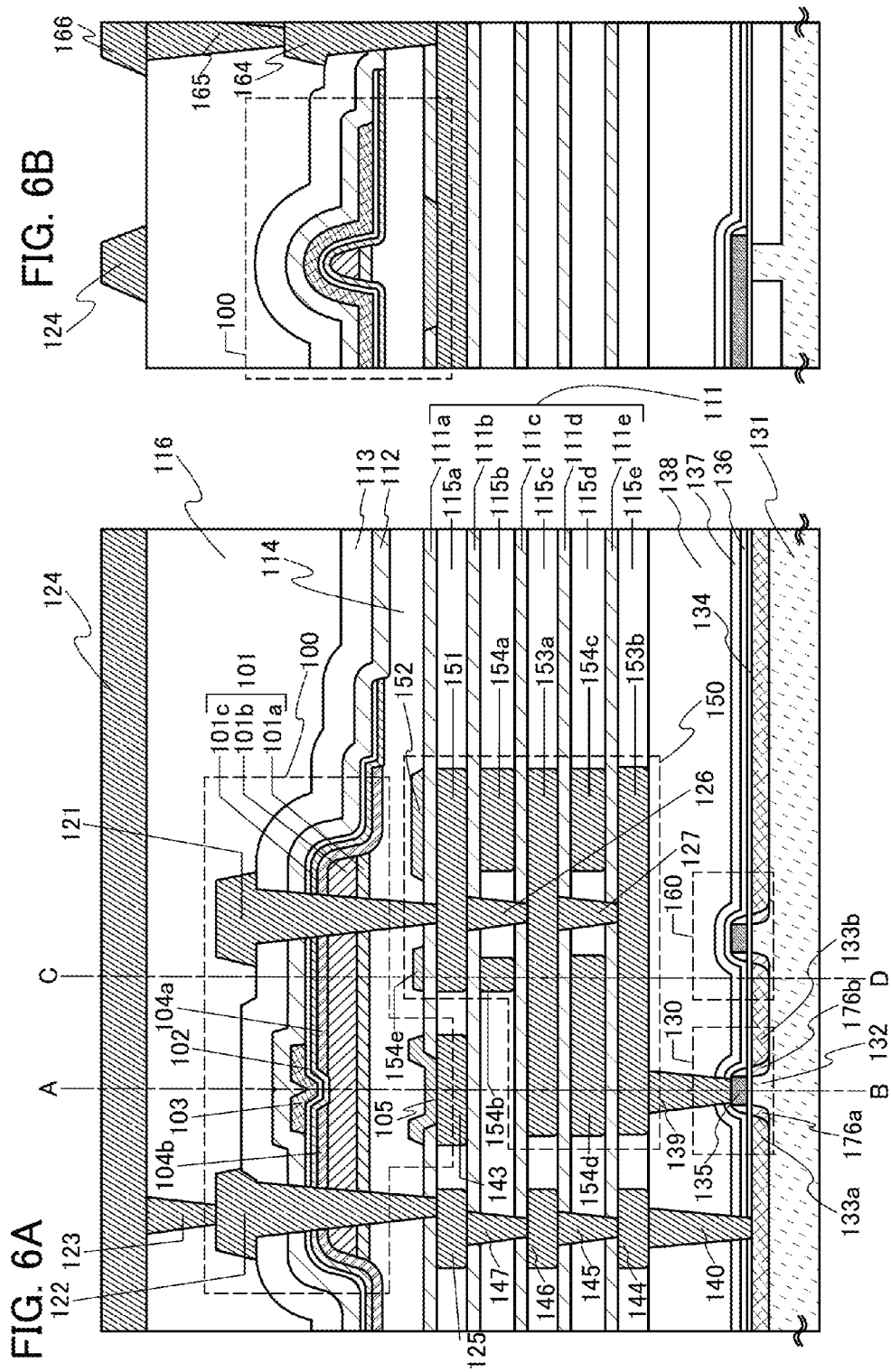

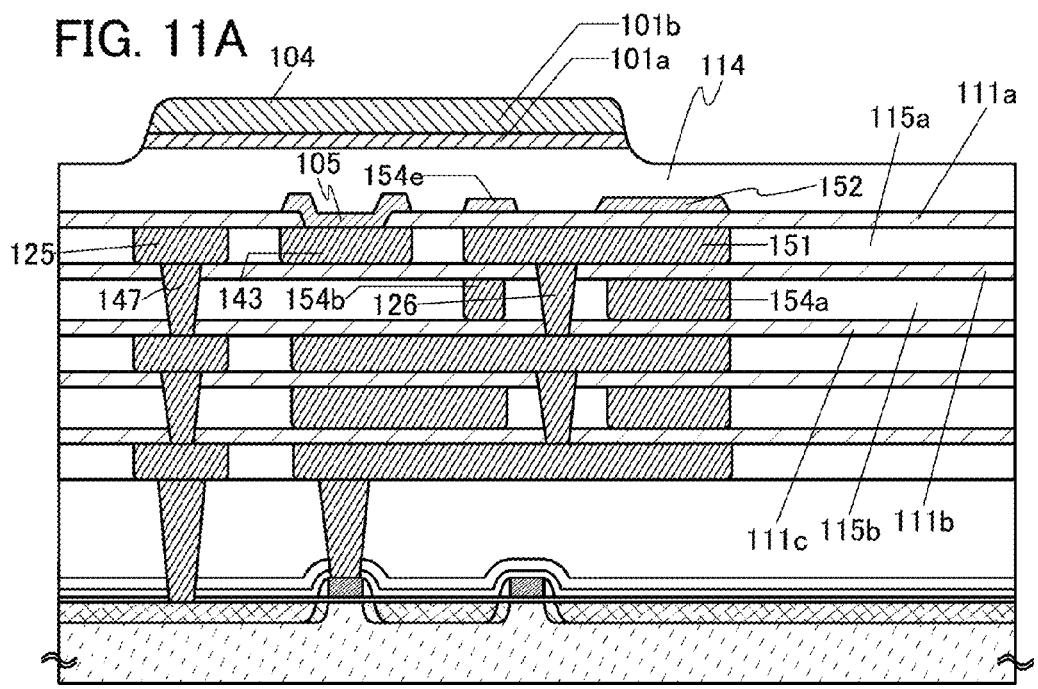
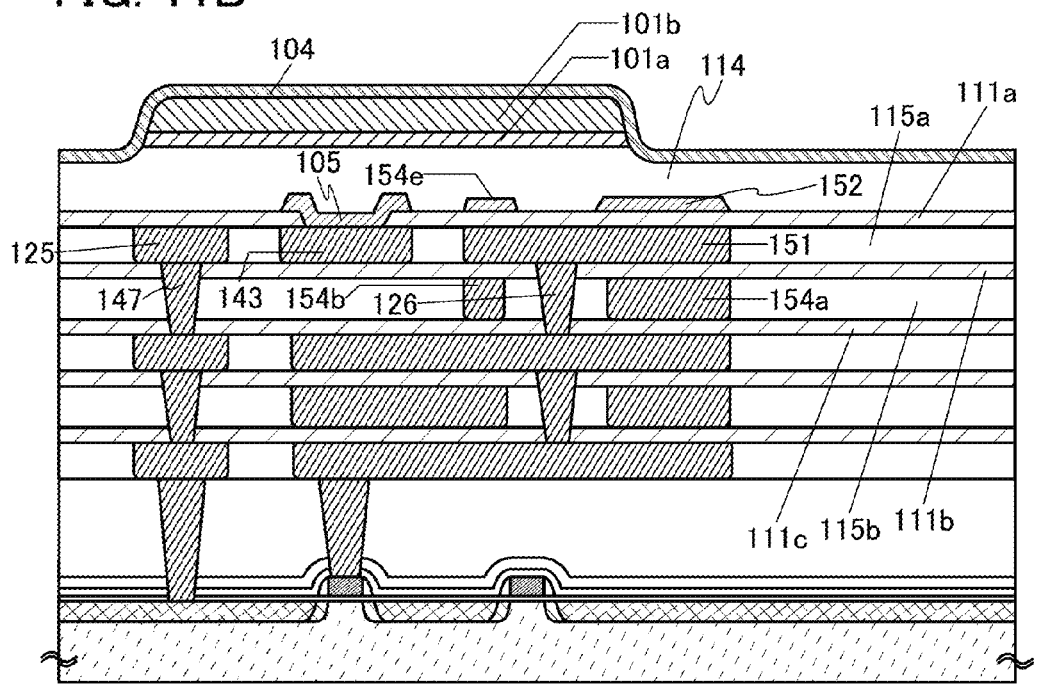

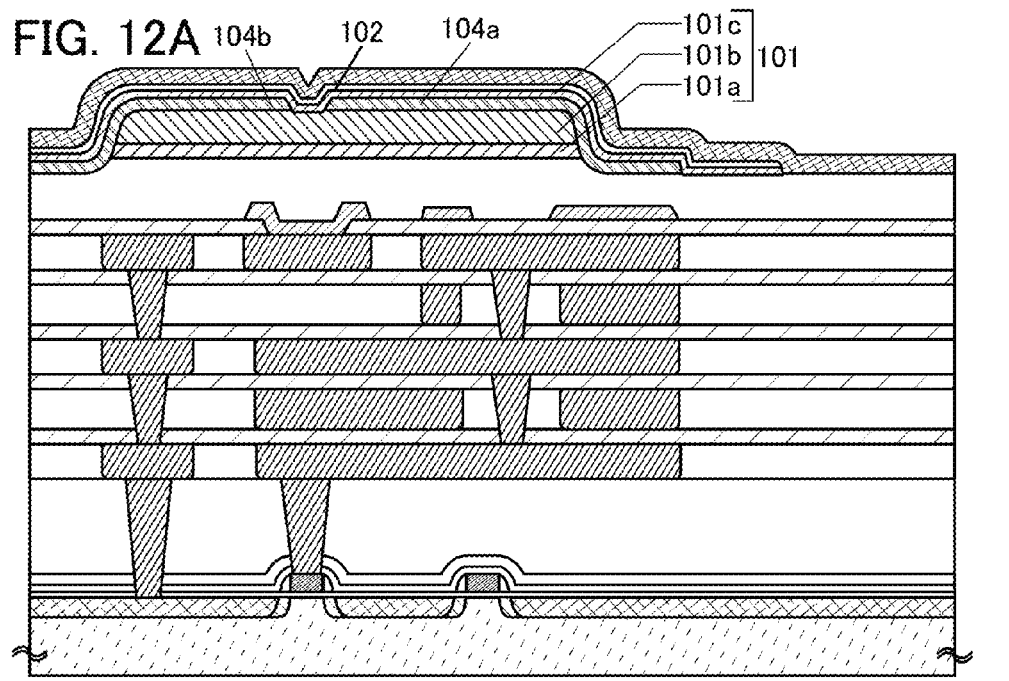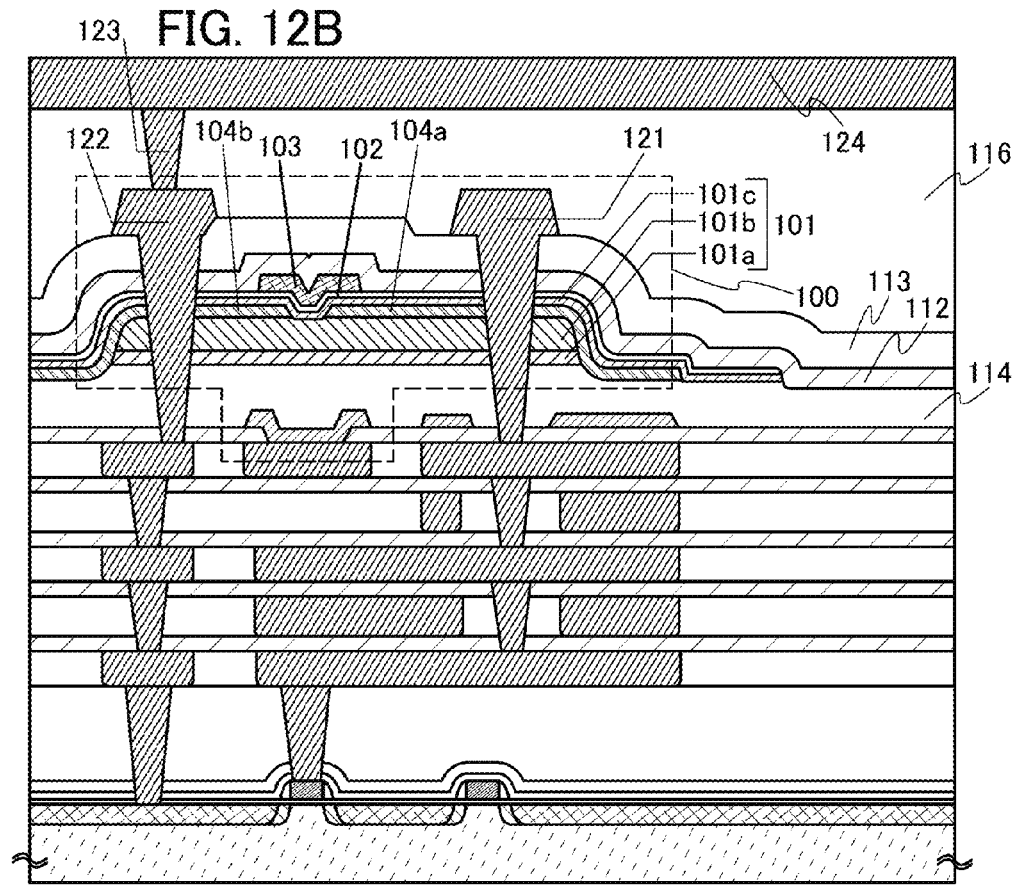

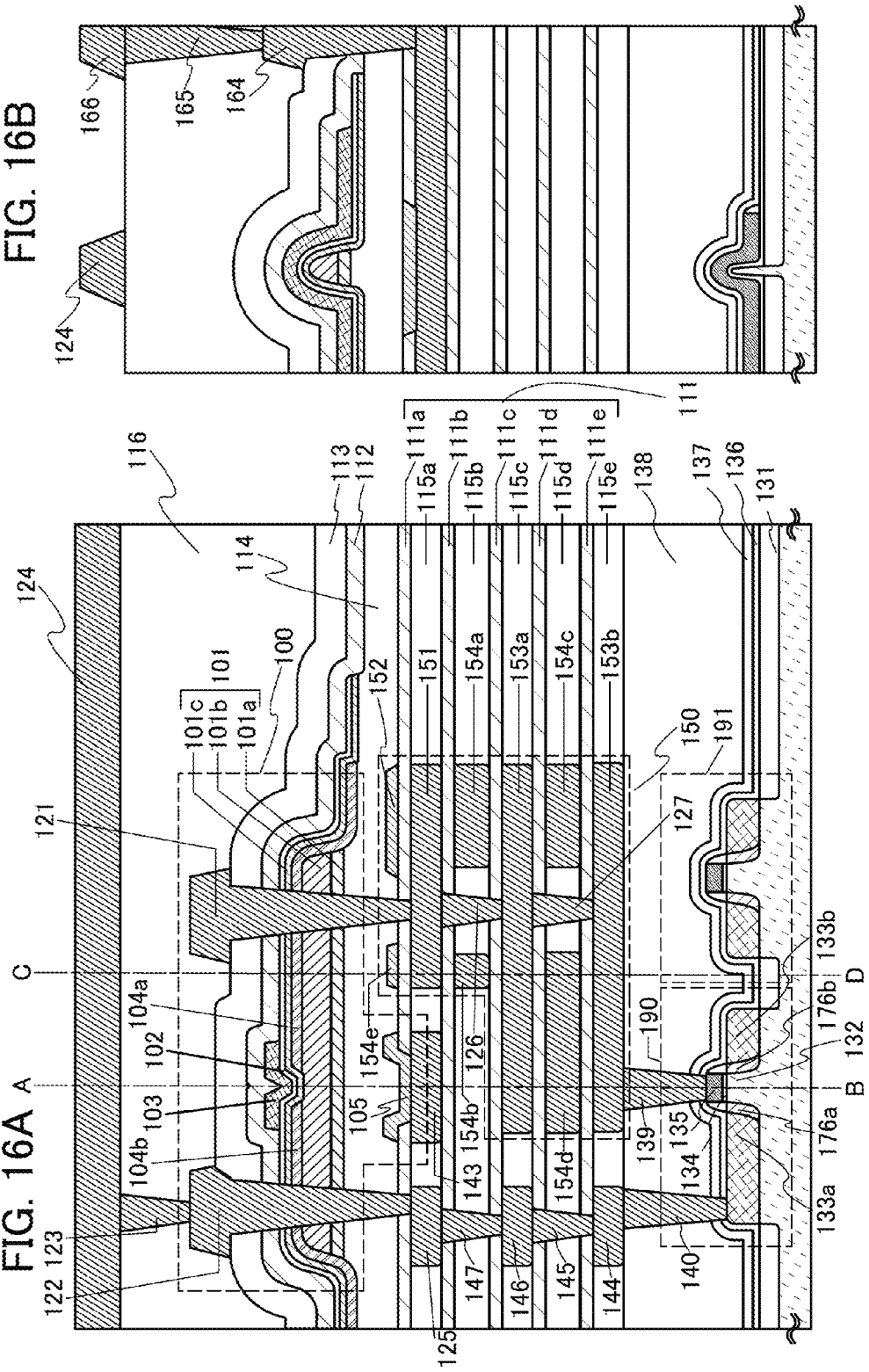

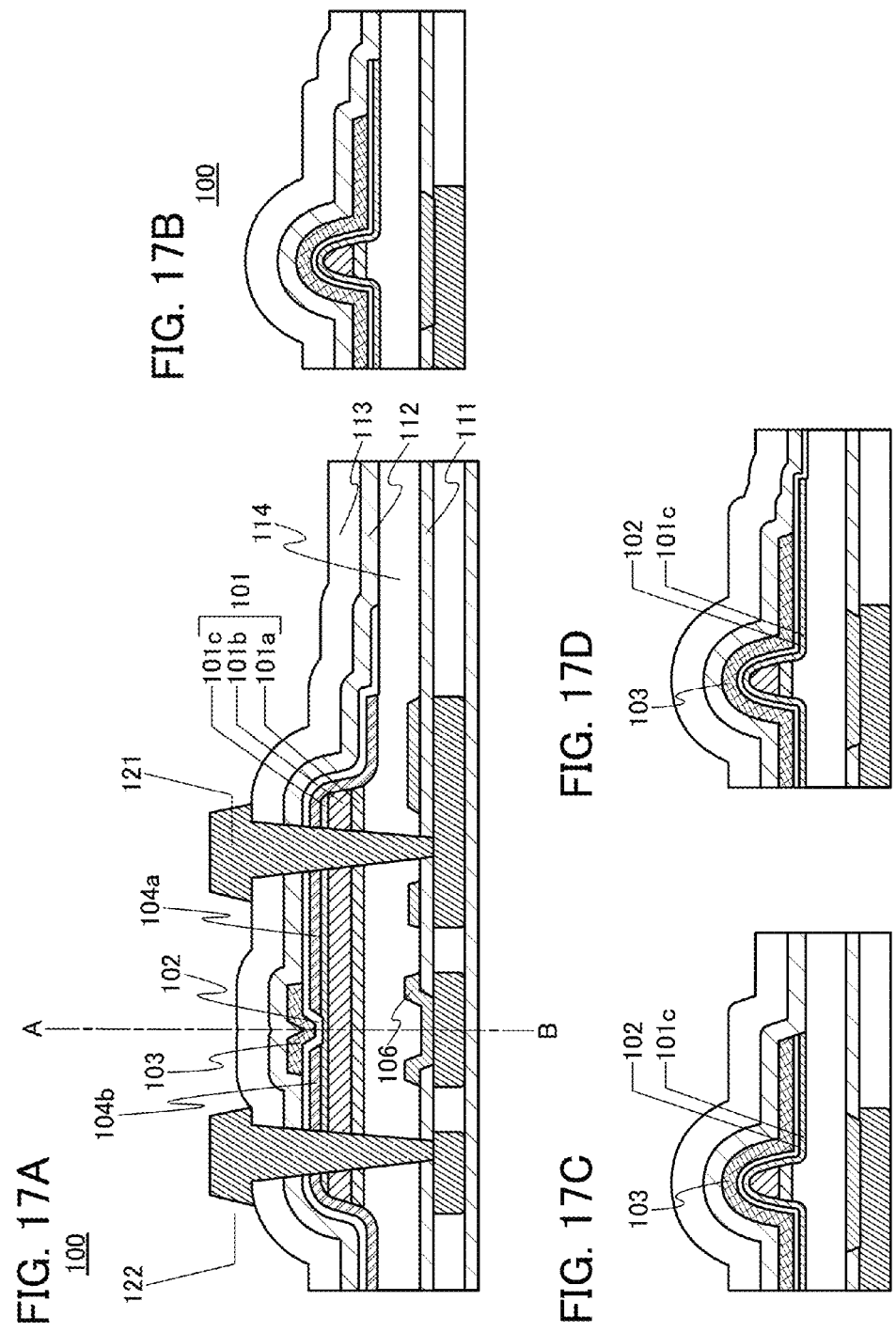

CAAC-OS nc-OS

- 610
- 612
- 614
- 616
- 618
- 620
- 622

- 624
- 612
- 628
- 616
- 632 as-sputtered after heat treatment at 450°C

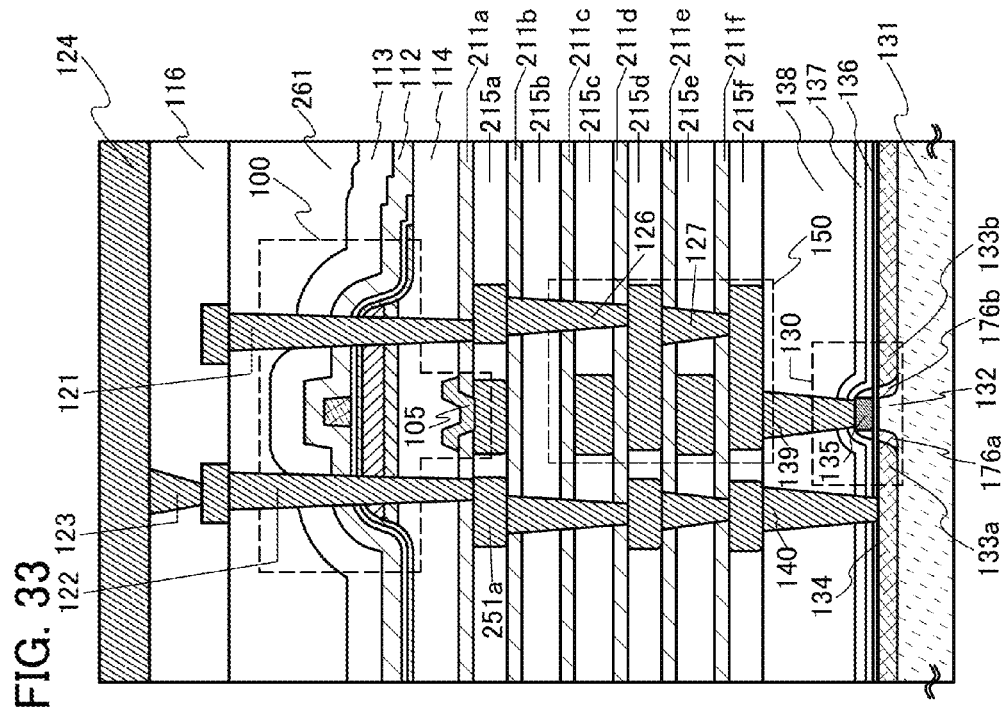

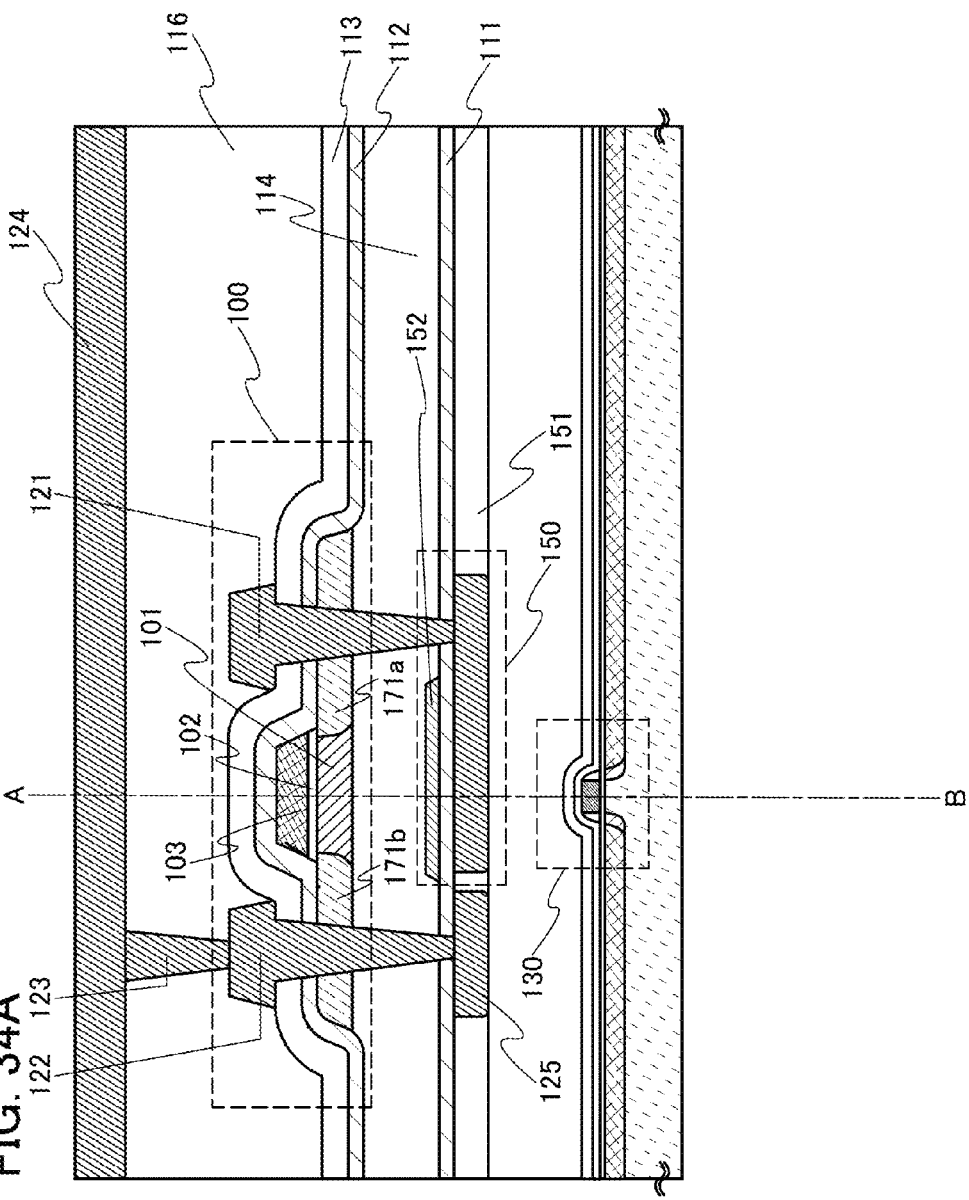

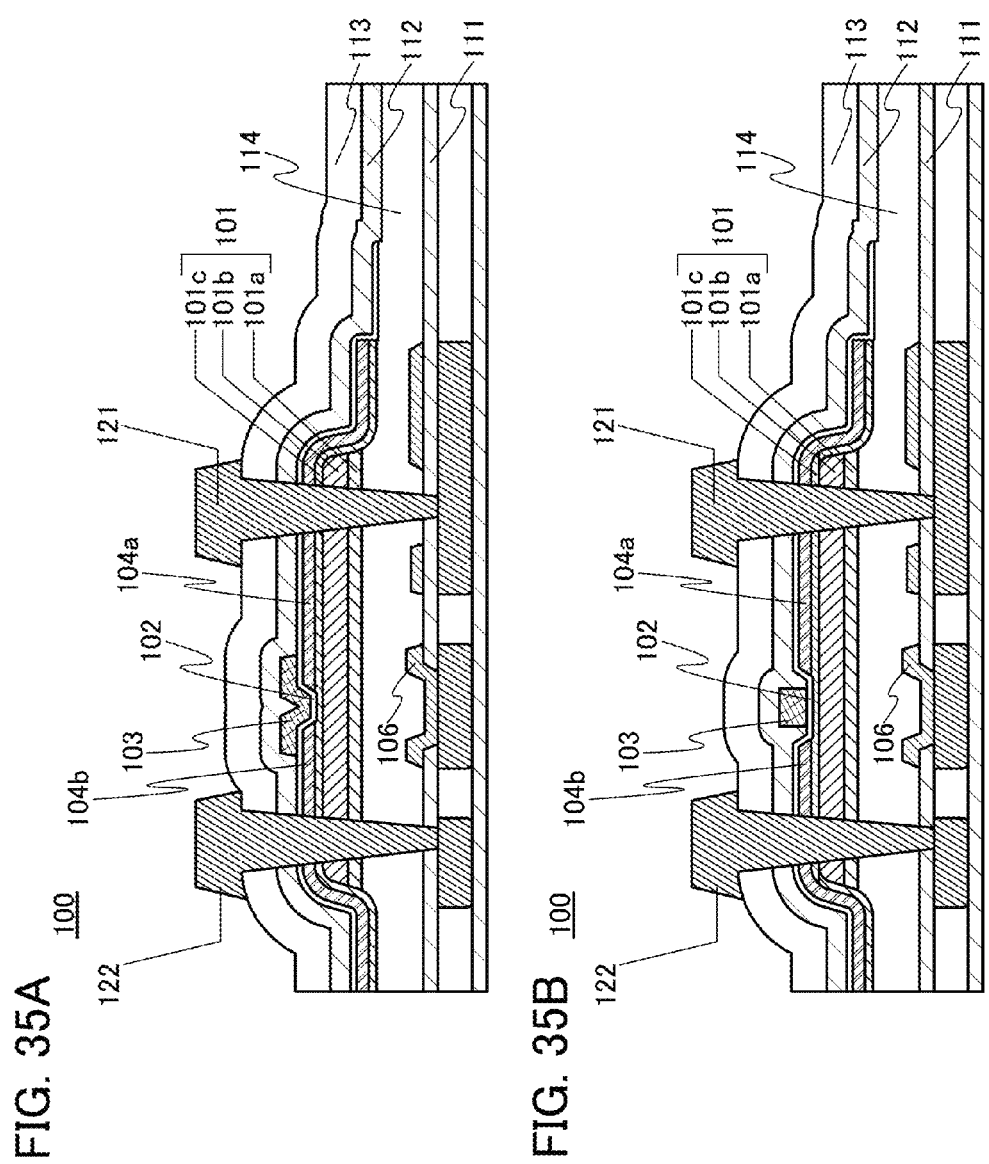

FIG. 39A
FIG. 39B
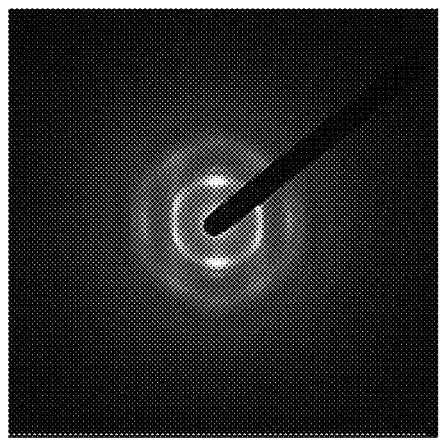
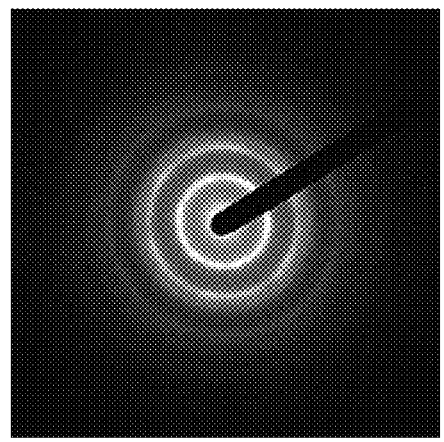

SEMICONDUCTOR DEVICE

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

BACKGROUND ART

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for formation of a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic appliances.

REFERENCE

Patent Document

[Patent Document 1] Japanese Published Patent Application No. 2007-123861
[Patent Document 2] Japanese Published Patent Application No. 2007-096055

DISCLOSURE OF INVENTION

One object of one embodiment of the present invention is to provide a semiconductor device that is suitable for miniaturization. Another object is to provide a semiconductor device having a reduced circuit area.

Another object is to provide a highly reliable semiconductor device. Another object is to provide a semiconductor device with favorable electrical characteristics. Another object is to provide a semiconductor device including a memory element with favorable retention characteristics. Another object is to provide a semiconductor device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

MEANS FOR SOLVING THE PROBLEMS

One embodiment of the present invention is a semiconductor device including a capacitor and a first transistor. The first transistor includes a first semiconductor layer, the first semiconductor layer is positioned over the capacitor, and the capacitor includes a first electrode that is electrically connected to the first transistor. In the above structure, it is preferable that the capacitor include m conductive layers (m is a natural number of 3 or more) and n insulating films (n is a natural number), a first insulating film of the n insulating films be provided between a first conductive layer and a second conductive layer of the m conductive layers, a second insulating film be provided between the second conductive layer and a third conductive layer, and the first conductive layer be electrically connected to the third conductive layer.

Another embodiment of the present invention is a semiconductor device including a capacitor, a first transistor, and a second transistor. The first transistor includes a first semiconductor layer, the capacitor includes n insulating films (n is a natural number) and k conductive layers (k is a natural number of 2 or more), each of the n insulating films is provided between at least two conductive layers of the k conductive layers, the first transistor is positioned over the second transistor, the first semiconductor layer is positioned over the capacitor, the n insulating films included in the capacitor are positioned between the first transistor and the second transistor, and the capacitor includes a first electrode that is connected to one of a source and a drain of the first transistor.

In the above structure, it is preferable that the n insulating films have a function of blocking at least one of hydrogen, water, and oxygen. Furthermore, in the above structure, it is preferable that the n insulating films include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

In the above structure, it is preferable that the capacitor and the first transistor overlap each other.

In the above structure, it is preferable that a first opening be provided in the first semiconductor layer of the first transistor, and the first electrode be in contact with the first opening.

In the above structure, it is preferable that the first transistor include a first conductive layer and a second conductive layer, the first conductive layer and the second conductive layer are in contact with the first semiconductor layer, an opening be provided in the first semiconductor layer and the first conductive layer included in the first transistor, and the first electrode be in contact with the opening provided in the first semiconductor layer and the first conductive layer.

According to one embodiment of the present invention, a semiconductor device that is suitable for miniaturization can be provided. Furthermore, a semiconductor device having a reduced circuit area can be provided.

A highly reliable semiconductor device can be provided. A semiconductor device with favorable electrical characteristics can be provided. A semiconductor device including a memory element with favorable retention characteristics can be provided. A semiconductor device with a novel structure can be provided.

Note that the description of these effects does not disturb the existence of other effects. One embodiment of the present invention does not necessarily achieve all the above effects.

Other effects will be apparent from and can be derived from the description of the specification, the drawings, the claims, and the like.

BRIEF DESCRIPTION OF DRAWINGS

FIGS. 1A and 1B illustrate an example of a semiconductor device of one embodiment of the present invention.

FIGS. 4A and 4B illustrate an example of a semiconductor device of one embodiment of the present invention.

FIGS. 6A and 6B illustrate an example of a semiconductor device of one embodiment of the present invention.

FIGS. 11A and 11B illustrate a method for manufacturing a semiconductor device of one embodiment of the present invention.

FIGS. 12A and 12B illustrate a method for manufacturing a semiconductor device of one embodiment of the present invention.

FIGS. 16A and 16B illustrate an example of a semiconductor device of one embodiment of the present invention.

FIGS. 17A to 17D illustrate an example of a semiconductor device of one embodiment of the present invention.

FIG. 18A illustrates the band structure of part of a transistor of one embodiment of the present invention and FIG. 18B illustrates a current path when the transistor is on.

FIG. 33 illustrates an example of a semiconductor device of one embodiment of the present invention.

FIGS. 34A and 34B illustrate an example of a semiconductor device of one embodiment of the present invention.

FIGS. 35A and 35B each illustrate an example of a semiconductor device of one embodiment of the present invention.

FIGS. 39A and 39B show electron diffraction patterns of a CAAC-OS.

BEST MODE FOR CARRYING OUT THE INVENTION

Figure 2:
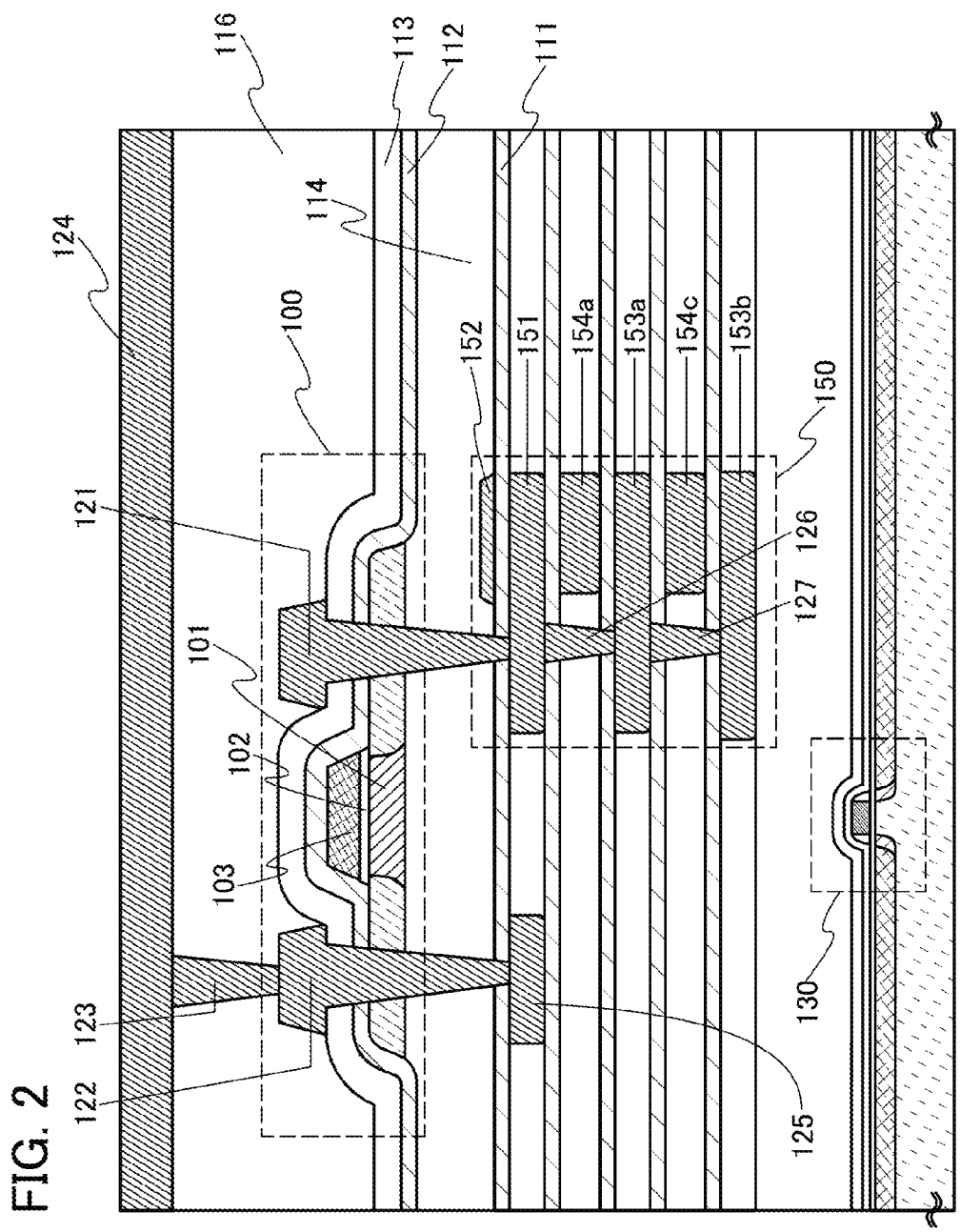
FIG. 2 illustrates an example of a semiconductor device of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

(Embodiment 1)

[Structure Examples of Stacked-Layer Structures]

Examples of a stacked-layer structure that can be used to a semiconductor device of one embodiment of the present invention are described below with reference to FIGS. 1A and 1B.

A stacked-layer structure illustrated in FIG. 1A includes a transistor 100 and a capacitor 150. The transistor 100 is provided over the capacitor 150. The capacitor 150 is electrically connected to the transistor 100.

A semiconductor layer 101 of the transistor 100 may include a low-resistance region 171a and a low-resistance region 171b. The low-resistance region 171a and the low-resistance region 171b preferably function as a source region and a drain region. Furthermore, an impurity may be added to the low-resistance region 171a and the low-resistance region 171b. Adding the impurity can reduce the resistance of the semiconductor layer 101. As the impurity, for example, one or more kinds of element selected from argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added. The low-resistance region 171a and low-resistance region 171b in the semiconductor layer 101 each contain for example, any of the above impurities at a concentration of higher than or equal to $5\times10^{19}$ atoms/cm$^3$, preferably higher than or equal to $1\times10^{20}$ atoms/cm$^3$, further preferably higher than or equal to $2\times10^{20}$ atoms/cm$^3$, still further preferably higher than or equal to $5\times10^{20}$ atoms/cm$^3$.

The stacked-layer structure illustrated in FIG. 1A may include a transistor 130. In addition, it is preferable that a barrier film 111 be provided between the transistor 100 and the transistor 130. The capacitor 150 includes a conductive layer 151 and a conductive layer 152 and has a structure in which the barrier film 111 is sandwiched between the conductive layer 151 and the conductive layer 152.

FIG. 1B illustrates a cross section along dashed dotted line A-B illustrated in FIG. 1A. Here, the cross section along the dashed dotted line A-B is, for example, a cross section along the dashed dotted line A-B that is substantially perpendicular to the cross section illustrated in FIG. 1A. Note that, for example, FIG. 1A may be referred to for some components without reference numerals in FIG. 1B that are denoted by the same hatching and the like as those in FIG. 1A.

The transistor 130 includes a first semiconductor material. The transistor 100 includes a second semiconductor material. The first semiconductor material and the second semiconductor material may be the same material but they are preferably different semiconductor materials.

Examples of semiconductors that can be used as the first semiconductor material or the second semiconductor material are semiconductor materials such as silicon, germanium, gallium, and arsenic; compound semiconductor materials containing silicon, germanium, gallium, arsenic, or aluminum; organic semiconductor materials; and oxide semiconductor materials.

Here, the case where single crystal silicon is used as the first semiconductor material and an oxide semiconductor is used as the second semiconductor material is described.

The transistor 100 includes the semiconductor layer 101 including the second semiconductor material, a gate insulating film 102, a gate electrode 103, a plug 121, and a plug 122. An insulating film 112 and an insulating film 113 are formed to cover the transistor 100. The plug 121 is in contact with an opening formed in the insulating film 113, the insulating film 112, and the semiconductor layer 101, and is electrically connected to the capacitor 150. That is, the plug 121 penetrates the insulating film 113, the insulating film 112, and the semiconductor layer 101.

The barrier film 111 has a function of inhibiting water and hydrogen of layers under the barrier film 111 from diffusing upward. The barrier film 111 preferably has low oxygen permeability. Furthermore, the barrier film 111 may have an opening or a plug for electrically connecting an electrode or a wiring provided over the barrier film 111 to an electrode or a wiring provided under the barrier film 111. For example, as illustrated in FIGS. 1A and 1B, a plug for electrically connecting the plug 121 and the conductive layer 151 may be included. Here, "a film has a function of inhibiting diffusion of water and hydrogen" means that the film is the one to which water and hydrogen are less likely to diffuse and which has lower water and hydrogen permeability than silicon oxide or the like that is generally used as an insulating film, for example. Furthermore, "a film has low oxygen permeability" means that the film has lower oxygen permeability than silicon oxide or the like that is generally used as an insulating film.

For the insulating film 112, as in the case of the barrier film 111, a material to which water and hydrogen do not easily diffuse is preferably used. In particular, for the insulating film 112, a material relatively impermeable to oxygen is preferably used. Note that the insulating film 112 may have a stacked-layer structure of two or more layers. In this case, for example, the insulating film 112 may be formed to have a two-layer structure in which the bottom layer is formed using, for example, silicon oxide, silicon oxynitride, silicon nitride oxide, silicon nitride, aluminum oxide, aluminum oxynitride, aluminum nitride oxide, aluminum nitride, or the like. Furthermore, the top layer is preferably formed using a material to which water and hydrogen do not easily diffuse, as in the case of the barrier film 111. The bottom insulating layer may be an insulating film from which oxygen is released by heating in a manner similar to that of an insulating film 114, so that oxygen may be supplied also from above the semiconductor layer 101 through the gate insulating film 102.

By covering the semiconductor layer 101 with the insulating film 112 including a material relatively impermeable to oxygen, oxygen can be prevented from being released from the semiconductor layer 101 to a portion over the insulating film 112. Furthermore, oxygen released from the insulating film 114 can be confined below the insulating film 112, resulting in an increase in the amount of oxygen to be supplied to the semiconductor layer 101.

The insulating film 112 that is relatively impermeable to water or hydrogen can inhibit entry of water or hydrogen, which is an impurity for an oxide semiconductor, so that changes in electrical characteristics of the transistor 100 can be suppressed and the transistor 100 can have high reliability.

Note that an insulating film from which oxygen is released by heating like the insulating film 114 may be provided under the insulating film 112 to supply oxygen also from a portion over the semiconductor layer 101 through the gate insulating film 102.

The capacitor 150 and the transistor 100 preferably overlap each other. Increasing a region where the capacitor 150 and the transistor 100 overlap each other can reduce the area of the semiconductor device.

The semiconductor device illustrated in FIGS. 1A and 1B includes the insulating film 114 between the transistor 100 and the capacitor 150. The insulating film 114 preferably includes oxide. In particular, the insulating film 114 preferably contains an oxide material from which part of oxygen is released by heating. The insulating film 114 preferably contains an oxide containing oxygen in excess of that in the stoichiometric composition. In the case where an oxide semiconductor is used as the second semiconductor material, oxygen released from the insulating film 114 is supplied to the oxide semiconductor, so that oxygen vacancy in the oxide semiconductor can be reduced. Consequently, changes in the electrical characteristics of the second transistor can be reduced and the reliability of the second transistor can be improved.

Here, it is preferable that hydrogen, water, and the like in the layers under the barrier film 111 be reduced as much as possible. Alternatively, degasification is preferably reduced. Hydrogen or water might become a factor that causes changes in the electrical characteristics of an oxide semiconductor. Hydrogen or water diffusing from the layers under the barrier film 111 to the layers over the barrier film 111 can be suppressed by the barrier film 111; however, the hydrogen or water might diffuse to the layers over the barrier film 111 through an opening, a plug, or the like provided in the barrier film 111.

To reduce hydrogen and water contained in the layers under the barrier film 111 or to reduce degasification, heat treatment for removing the hydrogen and the water or for reducing degasification is preferably performed before the formation of the barrier film 111 or immediately after the formation of an opening for forming a conductive layer and the like in the barrier film 111. The heat treatment is preferably performed at as high a temperature as possible within the range that does not adversely affect the heat resistance of the conductive films and the like in the semiconductor device and the electrical characteristics of the transistor. Specifically, the temperature may be, for example, higher than or equal to 450° C., preferably higher than or equal to 490° C., further preferably higher than or equal to 530° C., or may be higher than or equal to 650° C. It is preferable that the heat treatment be performed under an inert gas atmosphere or a reduced pressure atmosphere for 1 hour or longer, preferably 5 hours or longer, further preferably 10 hours or longer. The temperature of the heat treatment is determined in consideration of the heat resistance of the materials of wirings or electrodes positioned under the barrier film 111; for example, in the case where the heat resistance of the materials is low, the temperature of the heat treatment is preferably lower than or equal to 550° C., lower than or equal to 600° C., lower than or equal to 650° C., or lower than or equal to 800° C. Such heat treatment may be performed at least once but is preferably performed more than once.

It is preferable that the amount of released hydrogen of the insulating film provided under the barrier film 111, which is measured by thermal desorption spectrometry (TDS) analysis, at a substrate surface temperature of 400° C. be lower than or equal to 130%, preferably lower than or equal to 110% of that at a substrate surface temperature of 300° C. Alternatively, it is preferable that the amount of released hydrogen measured by TDS analysis at a substrate surface temperature of 450° C. be lower than or equal to 130%, preferably lower than or equal to 110% of that at a substrate surface temperature of 350° C.

Water and hydrogen contained in the barrier film 111 itself are also preferably reduced. Alternatively, degasification is preferably reduced. For example, the barrier film 111 is preferably formed using a material where the amount of released hydrogen molecules (M/z=2) at a substrate surface temperature of 20° C. to 600° C., which is measured by TDS, is less than $2\times10^{15}/cm^2$, preferably less than $1\times10^{15}/cm^2$, and further preferably less than $5\times10^{14}/cm^2$. Alternatively, the barrier film 111 is preferably formed using a material where the amount of released water molecules (M/z=18) at a substrate surface temperature of 20° C. to 600° C., which is measured by TDS, is less than $1\times10^{16}/cm^2$, preferably less than $5\times10^{15}/cm^2$, and more preferably less than $2\times10^{12}/cm^2$.

In the case where single crystal silicon is used for a semiconductor layer in the transistor 130, the heat treatment can also serve as treatment for terminating dangling bonds of silicon with hydrogen (the treatment is also referred to as hydrogenation treatment). By the hydrogenation treatment, part of hydrogen contained in the gate insulating film of the transistor 130 or another insulating film that is formed under the barrier film 111 diffuses to the semiconductor layer in the first transistor to terminate dangling bonds of silicon, so that the reliability of the first transistor can be improved.

As the barrier film 111, an insulating film containing a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) can be used. The barrier film 111 may be a single layer or a stacked layer. Alternatively, aluminum oxide, bismuth oxide, germanium oxide, niobium oxide, silicon oxide, titanium oxide, tungsten oxide, yttrium oxide, zirconium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen.

The barrier film 111 may be a stack of a layer of a material relatively impermeable to water or hydrogen and a layer containing an insulating material. The barrier film 111 may be, for example, a stack of a layer containing silicon oxide or silicon oxynitride, a layer containing a metal oxide, and the like.

For the barrier film 111, a material relatively impermeable to oxygen is preferably used. The materials given above have excellent barrier properties against oxygen as well as hydrogen and water. The use of any of the materials can inhibit diffusion of oxygen released when the insulating film 114 is heated to the layers under the barrier film 111. Consequently, the amount of oxygen that is released from the insulating film 114 and is likely to be supplied to the semiconductor layer of the transistor 100 can be increased.

In this manner, with the barrier film 111, the concentration of hydrogen or water contained in each layer provided under the barrier film 111 is reduced or the hydrogen or water is removed, and diffusion of hydrogen or water into the transistor 100 is prevented. Thus, the amount of hydrogen or water contained in the insulating film 114 or each layer in the transistor 100 can be extremely low. The concentration of hydrogen contained in the insulating film 114 and the semiconductor layer 101 or the gate insulating film 102 in the transistor 100 can be reduced to, for example, lower than $5 \times 10^{18}$ cm$^{-3}$, preferably lower than $1 \times 10^{18}$ cm$^{-3}$, further preferably lower than $3 \times 10^{17}$ cm$^3$.

The above structure makes it possible to obtain high reliability in both of the first and second transistors, and as a result, an extremely highly reliable semiconductor device can be obtained.

Note that the conductive layer 152 may be positioned to overlap a channel region of the transistor 100. FIGS. 34A and 34B illustrate an example of such a case. FIG. 34B is a cross section along dashed dotted line A-B illustrated in FIG. 34A. Note that the conductive layer 152 can also function as a gate electrode of the transistor 100. For example, the threshold voltage of the transistor 100 can be controlled by supplying a certain potential to the gate electrode.

Examples of a stacked-layer structure that can be used for the semiconductor device of one embodiment of the present invention are illustrated in FIG. 2, FIG. 3, and FIGS. 4A and 4B. As illustrated in FIG. 2, the capacitor 150 may include a stack including three or more conductive layers. The conductive layer 151, a conductive layer 153a, and a conductive layer 153b are electrically connected through the plug 121, a plug 126, and a plug 127 and form one electrode of the capacitor 150. Although not illustrated, the conductive layer 152, a conductive layer 154a, and a conductive layer 154c are electrically connected and form the other electrode of the capacitor 150.

Figure 3:
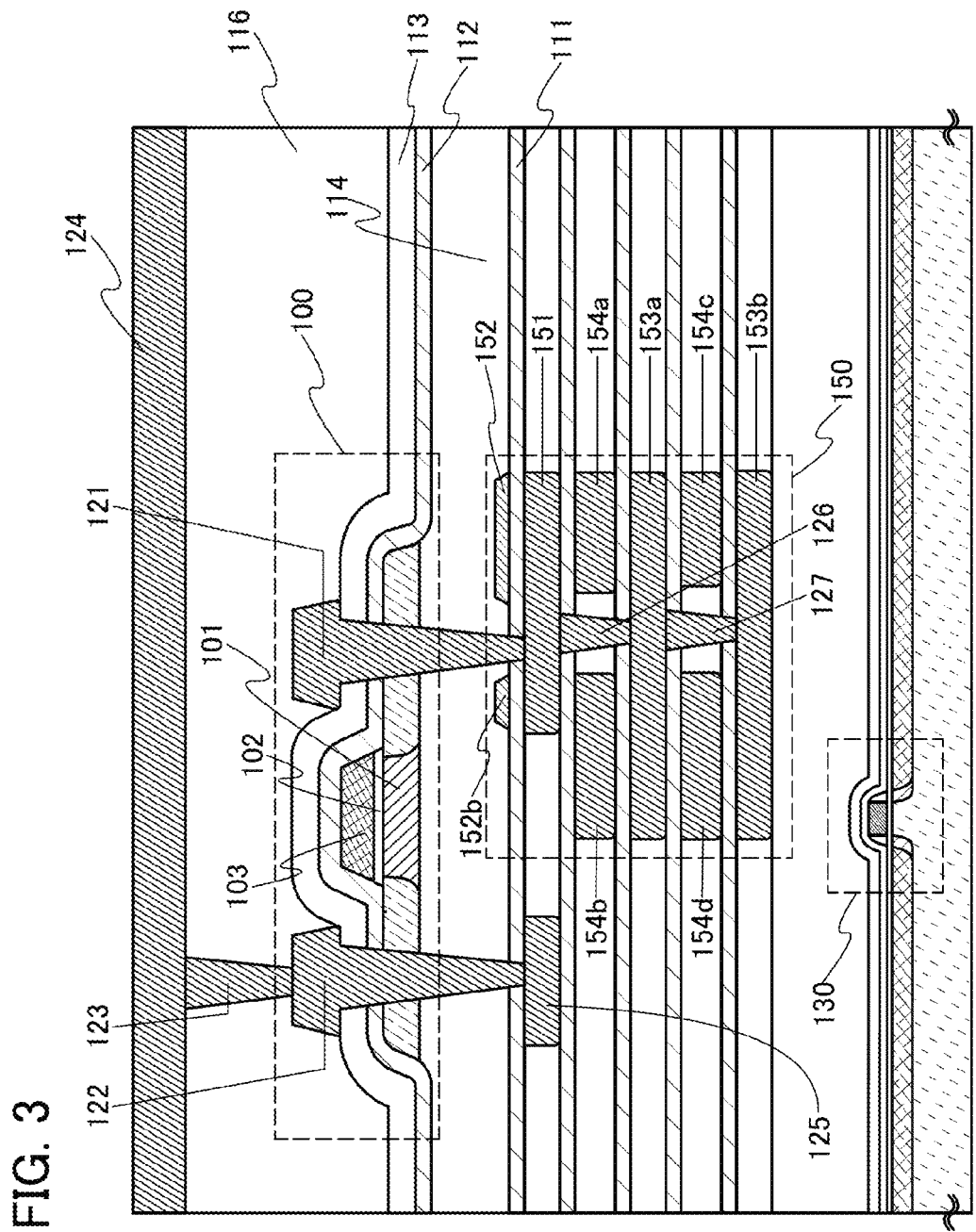
FIG. 3 illustrates an example of a semiconductor device of one embodiment of the present invention.

Alternatively, as illustrated in FIG. 3, a conductive layer may be formed on both sides of the plug 126 and the plug 127. The conductive layer 151, a conductive layer 153a, and a conductive layer 153b are electrically connected through the plug 121, a plug 126, and a plug 127 and form one electrode of the capacitor 150. Although not illustrated, the conductive layer 152, a conductive layer 152b, the conductive layer 154a, a conductive layer 154b, the conductive layer 154c, and a conductive layer 154d are electrically connected and form the other electrode of the capacitor 150.

Further alternatively, as illustrated in FIG. 4A, the transistor 100 may include a conductive layer 104a and a conductive layer 104b that are in contact with the semiconductor layer 101. FIG. 4B is a cross section along dashed dotted line A-B illustrated in FIG. 4A. The conductive layer 104a and the conductive layer 104b function as a source electrode and a drain electrode. Furthermore, the transistor 100 may include a conductive layer 105. The conductive layer 105 may function as a second gate of the transistor 100. A voltage lower or higher than that of the source electrode may be applied to the conductive layer 105 so that the threshold voltage of the transistor may be shifted in the positive or negative direction. For example, when the threshold voltage of the transistor is shifted in the positive direction, a normally-off transistor which is in non-conductive state (off-state) when the gate voltage is 0 V can be obtained. Note that the voltage applied to the conductive layer 105 may be variable or fixed. In the case where a variable voltage is applied to the conductive layer 105, a circuit for controlling the voltage may be connected to the conductive layer 105.

Furthermore, the conductive layer 105 may be connected to the gate electrode 103.

[Structure Example]

Figure 5A:
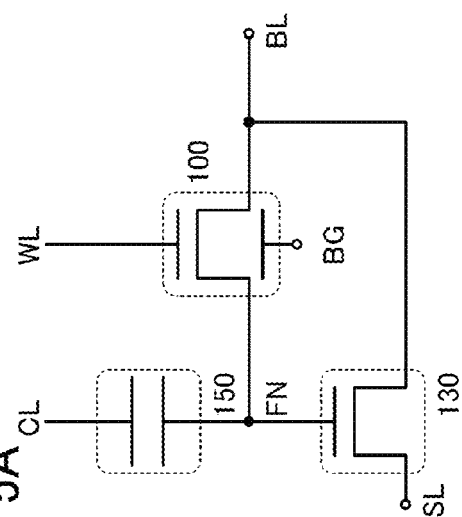
FIGS. 5A and 5B illustrate a circuit diagram and a top view of a transistor of one embodiment of the present invention.

FIG. 5A is an example of a circuit diagram of the semiconductor device of one embodiment of the present invention. The semiconductor device in FIG. 5A includes the transistor 100, the transistor 130, the capacitor 150, a wiring BL, a wiring WL, and a wring CL.

One of a source or a drain of the transistor 130 is electrically connected to the wiring BL, the other is electrically connected to the wiring SL, and a gate of the transistor 130 is electrically connected to one of a source and a drain of the transistor 100 and one electrode of the capacitor 150. The other of the source and the drain of the transistor 100 is electrically connected to the wiring BL, and a gate of the transistor 100 is electrically connected to the wiring WL. The other electrode of the capacitor 150 is electrically connected to the wiring CL. The wiring BG is electrically connected to a second gate of the transistor 100. Note that a node connecting the gate of the transistor 130, the one of the source and the drain of the transistor 100, and the one electrode of the capacitor 150 is referred to as a node FN.

The semiconductor device shown in FIG. 5A supplies a potential corresponding to the potential of the wiring BL to the node FN when the transistor 100 is in an on state (i.e., is on). Meanwhile, the semiconductor device has a function of retaining the potential of the node FN when the transistor 100 is in an off state (i.e., is off). In other words, the semiconductor device shown in FIG. 5A functions as a memory cell of a memory device. In the case where a display element such as a liquid crystal element or an organic electroluminescence (EL) element is electrically connected to the node FN, the semiconductor device in FIG. 5A can function as a pixel of a display device.

The on/off state of the transistor 100 can be selected in accordance with the potential supplied to the wiring WL or the wiring BG. The threshold voltage of the transistor 100 can be controlled by a potential supplied to the wiring WL or the wiring BG. A transistor with small off-state current is used as the transistor 100, whereby the potential of the node FN at the time when the transistor 100 is in a non-conduction state can be retained for a long time. Thus, the refresh rate of the semiconductor device can be reduced, resulting in low power consumption of the semiconductor device. An example of the transistor with small off-state current is a transistor including an oxide semiconductor.

Note that a reference potential, a group potential, or a fixed potential such as an arbitrary fixed potential is supplied to the wiring CL. In that case, the apparent threshold voltage of the transistor 100 varies depending on the potential of the node FN. Conduction and non-conduction states of the transistor 130 change in response to the change in the apparent threshold voltage; thus, data of a potential retained in the node FN can be read as data.

To retain a potential retained in the node FN at 85° C. for 10 years ($3.15 \times 10^8$ seconds), off-state current is preferably lower than 4.3 yA (yoctoamperes, where 1 yA is $10^{-24}$ A) per femtofarad of capacitance and per micrometer of channel width of the transistor. In that case, the allowable potential variation in the node FN is preferably within 0.5 V. Alternatively, the off-state current is preferably lower than 1.5 yA at 95° C. In the semiconductor device of one embodiment of the present invention, the concentration of hydrogen contained in the layers under the barrier film is sufficiently reduced; thus, the transistor including an oxide semiconductor over the barrier film can have such extremely small off-state current.

Furthermore, when the capacitance is increased, the potential can be retained in the node FN for a longer time. In other words, the retention time can be lengthened.

When the semiconductor device illustrated in FIG. 5A is arranged in a matrix, a memory device (memory cell array) can be formed.

FIGS. 6A and 6B illustrate an example of a cross-sectional structure of a semiconductor device in which the circuit shown in FIG. 5A can be obtained. FIG. 6B is a cross section along dashed dotted line A-B illustrated in FIG. 6A.

Figure 5B:
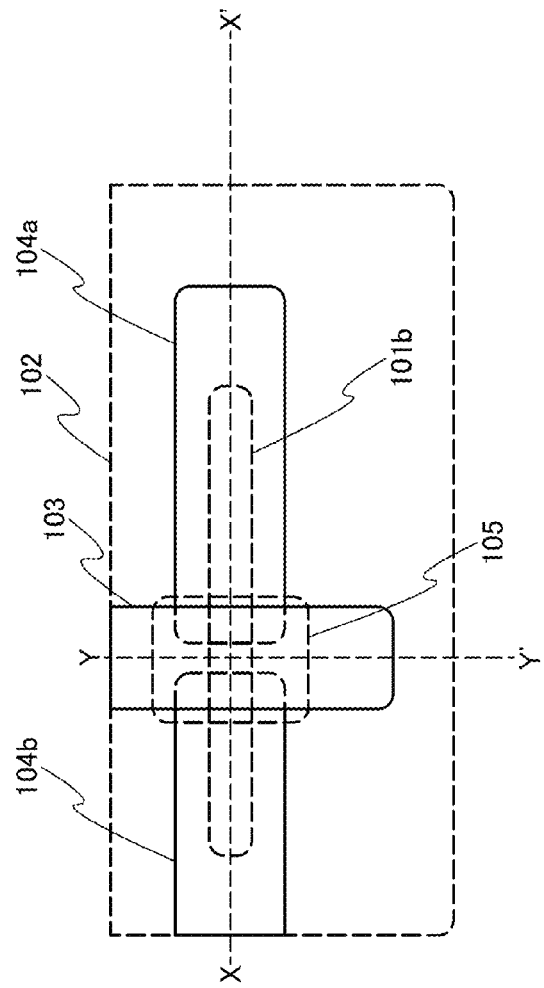

The semiconductor device illustrated in FIGS. 6A and 6B includes the transistor 130, the transistor 100, and the capacitor 150. The transistor 100 is provided over the transistor 130, and at least one barrier film is provided between the transistor 130 and the transistor 100. The semiconductor device may include a plurality of barrier films. FIGS. 6A and 6B illustrate an example in which the semiconductor device includes barrier films 111a to 111e. A top view of the transistor 100 is illustrated in FIG. 5B. A cross section along dashed line X-X' in FIG. 5B corresponds to the transistor 100 in FIG. 6A. A cross section along dashed line Y-Y' in FIG. 5B corresponds to the transistor 100 in FIG. 6B.

[First Transistor]

The transistor 130 is provided on a semiconductor substrate 131 and includes a semiconductor layer 132 which is part of the semiconductor substrate 131, a gate insulating film 134, a gate electrode 135, and low-resistance layers 133a and 133b functioning as source and drain regions. In addition, the semiconductor device in FIGS. 6A and 6B may include a transistor 160. Both of the transistor 160 and the transistor 130 are provided on the semiconductor substrate 131.

The transistor 130 may be either a p-channel transistor or an n-channel transistor, and an appropriate transistor may be used depending on the circuit configuration or the driving method.

It is preferable that a region of the semiconductor layer 132 where a channel is formed, a region in the vicinity thereof, the low-resistance layers 133a and 133b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 130 may be a high-electron-mobility transistor (HEMT) with GaAs and AlGaAs or the like.

The transistor 130 may include regions 176a and 176b serving as lightly doped drain (LDD) regions.

The low-resistance layers 133a and 133b contain an element that imparts n-type conductivity, such as phosphorus, or an element that imparts p-type conductivity, such as boron, in addition to a semiconductor material used for the semiconductor layer 132.

The gate electrode 135 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Here, a transistor 190 and a transistor 191 in FIGS. 16A and 16B may be used instead of the transistor 130 and the transistor 160. FIG. 16B is a cross section along dashed dotted line A-B illustrated in FIG. 16A. In the transistor 190 and the transistor 191, the semiconductor layer 132 (part of the semiconductor substrate) in which a channel is formed has a protruding portion, and the gate insulating film 134, and the gate electrode 135 are provided along top and side surfaces of the protruding portion. The transistor 190 and the transistor 191 are also referred to as FIN transistors because they each utilize a protruding portion of the semiconductor substrate. Note that an insulating film serving as a mask for forming the protruding portion may be provided in contact with the top of the protruding portion. Although the case where the protruding portion is formed by processing part of the semiconductor substrate is described here, a semiconductor layer having a protruding shape may be formed by processing an SOI substrate.

An insulating film 136, an insulating film 137, and an insulating film 138 are stacked in this order to cover the transistor 130.

In a manufacturing process of the semiconductor device, the insulating film 136 functions as a protective film when heat treatment is performed to activate an element imparting conductivity that is added to the low-resistance layers 133a and 133b. The insulating film 136 is not necessarily provided.

In the case where a silicon-based semiconductor material is used for the semiconductor layer 132, the insulating film 137 preferably contains hydrogen. When the insulating film 137 containing hydrogen is provided over the transistor 130 and heat treatment is performed, dangling bonds in the semiconductor layer 132 are terminated by hydrogen contained in the insulating film 137, whereby the reliability of the transistor 130 can be improved.

The insulating film 138 functions as a planarization film for eliminating a level difference caused by the transistor 130 or the like underlying the insulating film 138. The top surface of the insulating film 138 may be planarized by planarization treatment using a chemical mechanical polishing (CMP) method or the like in order to increase the planarity.

In the insulating films 136, 137, and 138, a plug 140 electrically connected to the low-resistance layer 133a, the low-resistance layer 133b, and the like, and a plug 139 electrically connected to the gate electrode 135 of the transistor 130, and the like may be embedded.

[Capacitor]

The barrier film 111 is provided between the transistor 130 and the transistor 100. One barrier film may be used, or two or more barrier films may be used as illustrated in FIGS. 6A and 6B. Here, in the example of the semiconductor device in FIG. 6A, five barrier films, i.e., the barrier films 111a to 111e, are included. In the case where a barrier film is used as an insulating film of a capacitor, the capacitance can be increased by a reduction in the thickness of the barrier film. On the other hand, a barrier property might be decreased by a reduction in the thickness. Therefore, providing a plurality of thin barrier films can increase the capacitance and improve the barrier property to increase the characteristics of the transistors 100 and 130.

The conductive layer 151, the conductive layer 152, the conductive layer 153a, the conductive layer 153b, and the conductive layers 154a to 154e are provided with the barrier film positioned therebetween to form the capacitor 150. The plug 121, the plug 126, and the plug 127 are electrically connected. The plug 126 is provided in an opening formed in the barrier film 111b, an insulating film 115b, and the barrier film 111c. The conductive layer 151, the conductive layer 153a, and the conductive layer 153b are electrically connected to the conductive layer 104a of the transistor 100 through the plug 127, the plug 126, and the plug 121. The conductive layer 151 is formed to be embedded in an opening formed in an insulating film 115a. In a similar manner, the conductive layer 154a and the conductive layer 154b are embedded in openings formed in the insulating film 115b, the conductive layer 153a is embedded in an opening formed in an insulating film 115c, the conductive layer 154c and the conductive layer 154d are embedded in openings formed in an insulating film 115d, and the conductive layer 153b is embedded in an opening formed in an insulating film 115e.

Figure 7:
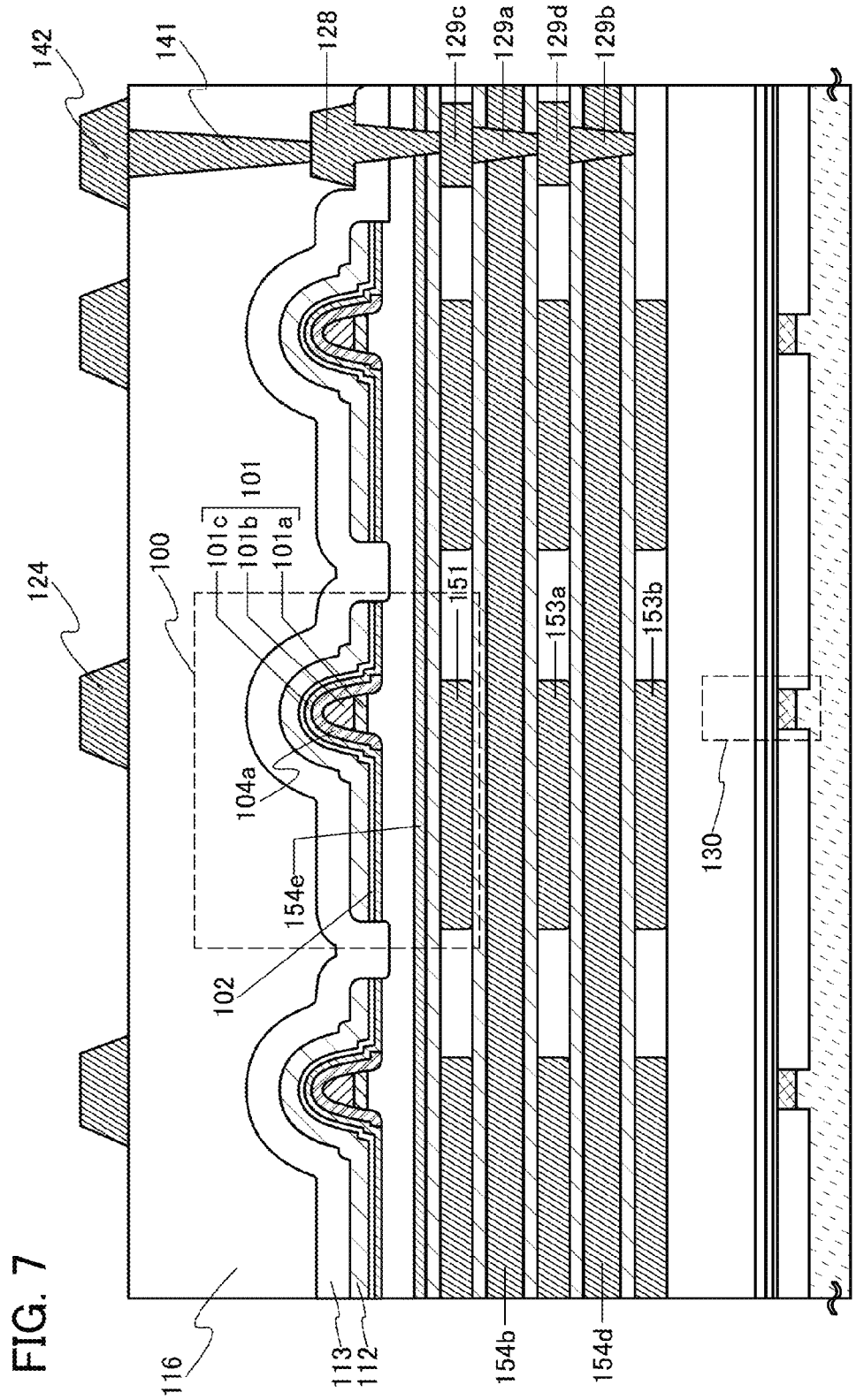
FIG. 7 illustrates an example of a semiconductor device of one embodiment of the present invention.

FIG. 7 illustrates a cross section along dashed dotted line C-D in FIG. 6A. The conductive layer 154e is electrically connected to a plug 128. The conductive layer 154b and the conductive layer 154d are electrically connected to the plug 128 through plugs 129a to 129d. The plug 128 is connected to a wiring 142 through a plug 141.

The insulating film 114 is provided to cover the barrier film 111, the conductive layer 152, the conductive layer 154e, and the like.

It is preferable that the top surface of the insulating film 114 be planarized by planarization treatment described above.

An oxide material from which oxygen is partly released by heating is preferably used for the insulating film 114.

As an oxide material from which oxygen is released by heating, an oxide containing oxygen in excess of that in the stoichiometric composition is preferably used. Part of oxygen is released by heating from the oxide film containing oxygen in excess of that in the stoichiometric composition. Note that the oxide film containing oxygen in excess of that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, or hafnium oxynitride can be used. Note that in this specification, "silicon oxynitride" refers to a material that contains oxygen at a higher proportion than nitrogen, and "silicon nitride oxide" refers to a material that contains nitrogen at a higher proportion than oxygen.

[Second Transistor]

The semiconductor layer 101 of the transistor 100 is provided over the insulating film 114.

The transistor 100 includes the semiconductor layer 101 in contact with the top surface of the insulating film 114, the conductive layers 104a and 104b, and the gate insulating film 102 over the semiconductor layer 101, the gate electrode 103 overlapping the semiconductor layer 101 with the gate insulating film 102 positioned therebetween. Furthermore, the insulating film 112, the insulating film 113, and an insulating film 116 are provided to cover the transistor 100. In addition, the transistor 100 may include the conductive layer 105 functioning as a second gate electrode.

Note that the semiconductor layer 101 may be formed of a single layer but is preferably formed with a stacked-layer structure of a semiconductor layer 101a, a semiconductor layer 101b, and a semiconductor layer 101c, as in the transistor 100 illustrated in FIGS. 6A and 6B as an example. The transistor 100 in FIGS. 6A and 6B includes the semiconductor layer 101a, the semiconductor layer 101b in contact with the top surface of the semiconductor layer 101a, the conductive layers 104a and 104b that are in contact with the top surface of the semiconductor layer 101b and are apart from each other in a region overlapping the semiconductor layer 101b, the semiconductor layer 101c in contact with the top surface of the semiconductor layer 101b, the insulating film 102 over the semiconductor layer 101c, and the gate electrode 103 overlapping the semiconductor layer 101b with the gate insulating film 102 and the semiconductor layer 101c positioned therebetween. The transistor 100 in FIGS. 6A and 6B includes the conductive layer 105 functioning as a second gate electrode. The conductive layer 105 may be formed at the same time as the conductive layer 152 that is part of the capacitor 150. The semiconductor layer 101a is provided between the insulating film 114 and the semiconductor layer 101b. The semiconductor layer 101c is provided between the semiconductor layer 101b and the gate insulating film 102. The conductive layer 104a and the conductive layer 104b are in contact with the top surface of the semiconductor layer 101b and the bottom surface of the semiconductor layer 101c.

The transistor 100 is covered with the insulating film 112, the insulating film 113, and the insulating film 116.

As illustrated in FIG. 6A, the side surface of the semiconductor layer 101b is in contact with the conductive layer 104a and the conductive layer 104b. The semiconductor layer 101b can be electrically surrounded by an electric field of the gate electrode 103 (a structure in which a semiconductor is electrically surrounded by an electric field of a conductor is referred to as a surrounded channel (s-channel) structure). Therefore, a channel is formed in the entire semiconductor layer 101b (bulk) in some cases. In the s-channel structure, a large amount of current can flow between a source and a drain of a transistor, so that current in an on state (on-state current) can be high.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, and still further preferably less than or equal to 20 nm, and the channel width of the transistor is preferably less than or equal to 40 nm, further preferably less than or equal to 30 nm, and still further preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that at least part (or all) of the conductive layer $104a$ (and/or the conductive layer $104b$) is provided on at least part (or all) of a surface, a side surface, a top surface, and/or a bottom surface of a semiconductor layer such as the semiconductor layer $101b$ (and/or the semiconductor layer $101a$).

Alternatively, at least part (or all) of the conductive layer $104a$ (and/or the conductive layer $104b$) is in contact with at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is in contact with at least part (or all) of a semiconductor layer such as the semiconductor layer $101b$ (and/or the semiconductor layer $101a$).

Alternatively, at least part (or all) of the conductive layer $104a$ (and/or the conductive layer $104b$) is electrically connected to at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is electrically connected to at least part (or all) of a semiconductor layer such as the semiconductor layer $101b$ (and/or the semiconductor layer $101a$).

Alternatively, at least part (or all) of the conductive layer $104a$ (and/or the conductive layer $104b$) is provided near at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is provided near at least part (or all) of a semiconductor layer such as the semiconductor layer $101b$ (and/or the semiconductor layer $101a$).

Alternatively, at least part (or all) of the conductive layer $104a$ (and/or the conductive layer $104b$) is placed on a side of at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is placed on a side of at least part (or all) of a semiconductor layer such as the semiconductor layer $101b$ (and/or the semiconductor layer $101a$).

Alternatively, at least part (or all) of the conductive layer $104a$ (and/or the conductive layer $104b$) is provided obliquely above at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is provided obliquely above at least part (or all) of a semiconductor layer such as the semiconductor layer $101b$ (and/or the semiconductor layer $101a$).

Alternatively, at least part (or all) of the conductive layer $104a$ (and/or the conductive layer $104b$) is provided above at least part (or all) of a surface, a side surface, a top surface, and/or a bottom surface of a semiconductor layer such as the semiconductor layer $101b$ (and/or the semiconductor layer $101a$). Alternatively, at least part (or all) of the conductive layer $104a$ (and/or the conductive layer $104b$) is provided above at least part (or all) of a semiconductor layer such as the semiconductor layer $101b$ (and/or the semiconductor layer $101a$).

The semiconductor layer $101$ may contain a semiconductor such as a silicon-based semiconductor in a region where a channel is formed. It is particularly preferable that the semiconductor layer $101$ contains a semiconductor having a wider band gap than silicon. The semiconductor layer $101$ is preferably formed using an oxide semiconductor. A semiconductor material having a wider band gap and a lower carrier density than silicon is preferably used because off-state leakage current of the transistor can be reduced.

The use of such materials for the semiconductor layer makes it possible to provide a highly reliable transistor in which a change in the electrical characteristics is suppressed.

Note that details of a preferable mode and a formation method of an oxide semiconductor that can be used for the semiconductor layer are described later in an embodiment described below.

Note that in this specification and the like, in the case of the substantially purified oxide semiconductor layer, the carrier density thereof is lower than $1 \times 10^{17}/cm^3$, lower than $1 \times 10^{15}/cm^3$, or lower than $1 \times 10^{13}/cm^3$, particularly preferably lower than $8 \times 10^{11}/cm^3$, still further preferably lower than $1 \times 10^{11}/cm^3$, yet further preferably lower than $1 \times 10^{10}/cm^3$, and is $1 \times 10^{-9}/cm^3$ or higher. With a highly purified intrinsic oxide semiconductor layer, the transistor can have stable electric characteristics.

When an In—Ga—Zn-based oxide having an atomic ratio of In:Ga:Zn=1:1:1 or 3:1:2 is used for the semiconductor layer 101b, for example, an In—Ga—Zn-based oxide having an atomic ratio of In:Ga:Zn=1:3:2, 1:3:4, 1:3:6, 1:6:4, 1:6:8, 1:6:10, or 1:9:6 can be used for the semiconductor layer 101a or the semiconductor layer 101c. Note that the atomic ratio of each of the semiconductor layer 101b, the semiconductor layer 101a, and the semiconductor layer 101c may vary within a range of ±20% of any of the above-described atomic ratios as an error. For the semiconductor layer 101a and the semiconductor layer 101c, materials with the same composition or materials with different compositions may be used.

Further, when an In-M-Zn-based oxide is used for the semiconductor layer 101b, an oxide containing metal elements in the atomic ratio satisfying the following conditions is preferably used for a target for forming a semiconductor film to be the semiconductor layer 101b. Given that the atomic ratio of the metal elements in the oxide is In:M:Zn=$x_1$: $y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the semiconductor layer 101a and the semiconductor layer 101c, an oxide containing metal elements in the atomic ratio satisfying the following conditions is preferably used for a target for forming oxide semiconductor films to be the semiconductor layer 101a and the semiconductor layer 101c. Given that the atomic ratio of the metal elements in the oxide is In:M:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

In the cases where an oxide semiconductor are formed by a sputtering method, a film having an atomic ratio different from that of a target used may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target.

One of the conductive layer 104a and the conductive layer 104b serves as a source electrode and the other serves as a drain electrode.

The plug 121 is electrically connected to the conductive layer 151 through an opening formed in the conductive layer 104a, the semiconductor layer 101a, the semiconductor layer 101b, the semiconductor layer 101c, the insulating film 114, and the barrier film 111. The conductive layer 104a is electrically connected to the conductive layer 151 through the plug 121.

The conductive layer 104a and the conductor layer 104b are each formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 102 may be formed with a single layer or a stack using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating film 102 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide.

The gate insulating film 102 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

As the gate insulating film 102, like the insulating film 114, an oxide insulating film that contains oxygen in excess of that in the stoichiometric composition is preferably used.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In either case, it is preferable that the semiconductor device be not exposed to temperatures of 125° C. or higher for one hour or more after the process for trapping electrons.

The gate electrode 103 can be formed using, for example, a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used for the gate electrode 103. Further, the gate electrode 103 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film, or a nitride film containing aluminum and one or more metals selected from titanium, tantalum, tungsten, molybdenum, chromium, neodymium, and scandium may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 103 and the gate insulating film 102. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 101, specifically an In—Ga—Zn-based oxynitride semiconductor film having a nitrogen concentration higher than or equal to 7 at. %, is used.

For the insulating film 112, as in the case of the barrier film 111, a material to which water or hydrogen does not easily diffuse is preferably used. In particular, for the insulating film 112, a material relatively impermeable to oxygen is preferably used.

By covering the semiconductor layer 101 with the insulating film 112 including a material relatively impermeable to oxygen, oxygen can be prevented from being released from the semiconductor layer 101 to a portion over the insulating film 112. Furthermore, oxygen released from the insulating film 114 can be confined below the insulating film 112, resulting in an increase in the amount of oxygen to be supplied to the semiconductor layer 101.

The insulating film 112 relatively impermeable to water or hydrogen can inhibit water or hydrogen, which is an impurity for an oxide semiconductor, from entering the oxide semiconductor layer 101 from the outside; therefore, a change in the electrical characteristics of the transistor 100 can be suppressed and the transistor can have high reliability.

Note that an insulating film from which oxygen is released by heating like the insulating film 114 may be provided under insulating film 112 to supply oxygen also from a portion over the semiconductor layer 101 through the gate insulating film 102.

As illustrated in FIG. 6B, the gate electrode 103 is provided so as to face top and side surfaces of the semiconductor layer 101b in the cross section of the transistor in the channel width direction. Thus, a channel is formed not only in the vicinity of the top surface but also in the vicinity of the side surface of the semiconductor layer 101b, and the effective channel width is increased, which results in increased current in an on state of the transistor (i.e., on-state current). In particular, in the case where the width of the semiconductor layer 101b is extremely small (for example, less than or equal to 50 nm, preferably less than or equal to 30 nm, more preferably less than or equal to 20 nm), a region where the channel is formed spreads inside the semiconductor layer 101b, so that the on-state current is increased as the transistor is miniaturized.

FIGS. 17A and 17B illustrate an example of the transistor 100 included in the semiconductor device. The transistor 100 illustrated in FIGS. 17A and 17B differs from the transistor 100 illustrated in FIGS. 6A and 6B mainly in that the semiconductor layer 101c is provided in contact with bottom surfaces of the conductive layers 104a and 104b. Here, FIG. 17B is a cross section along dashed dotted line A-B illustrated in FIG. 17A.

Such a structure enables films used for the semiconductor layer 101a, the semiconductor layer 101b, and the semiconductor layer 101c to be formed successively without contact with the air and therefore can reduce defects at each interface.

The transistor 100 may have a structure illustrated in FIG. 35A. In FIG. 35A, after the semiconductor layer 101a and the semiconductor layer 101b are formed, the semiconductor layer 101c is formed, so that the semiconductor layer 101c covers the side surfaces of the semiconductor layer 101a and the semiconductor layer 101b. Alternatively, the transistor 100 may have a structure illustrated in FIG. 35B. As for a different point between FIG. 35A and FIG. 35B, the gate electrode 103 overlaps the conductive layer 104a and the conductive layer 104b in FIG. 35A, whereas the gate electrode 103 does not overlap the conductive layer 104a and the conductive layer 104b in the cross section in FIG. 35B.

FIGS. 6A and 6B and FIGS. 17A and 17B each illustrate the structure in which the semiconductor layer 101a and the semiconductor layer 101c are in contact with the semiconductor layer 101b; however, a structure without one or both of the semiconductor layer 101a and the semiconductor layer 101c may be employed.

Note that the structure in FIG. 6B is an example in which the edge portion of the gate insulating film 102 is substantially aligned with the edge portion of the semiconductor layer 101c, and the gate electrode 103 is positioned on the inner side than the gate insulating film; alternatively, a structure illustrated in an example of the transistor 100 in FIG. 17C in which the edge portions of the gate insulating film 102, the semiconductor layer 101c, and the gate electrode 103 are substantially aligned with one another may be employed. Further alternatively, a structure illustrated in an example of the transistor 100 in FIG. 17D in which the edge portions of the gate insulating film 102, the semiconductor layer 101c, and the gate electrode are not aligned may be employed.

The above is the description of the transistor 100.

The insulating film 116 covering the transistor 100 functions as a planarization layer which covers an uneven surface shape of an underlying layer. The insulating film 113 may function as a protective layer when the insulating film 116 is formed. The insulating film 113 is not necessarily provided.

A plug 123, the plug 122, and the like that are electrically connected to the conductive layer 104b are embedded in the insulating film 112, the insulating film 113, and the insulating film 116.

A wiring 124 and the like that are electrically connected to the plug 123 are provided over the insulating film 116.

Here, the wiring 124 in FIG. 6A corresponds to the wiring BL in FIG. 5A. In a similar manner, a wiring 166 in FIG. 6B corresponds to the wiring BG, and the wiring 142 in FIG. 7 corresponds to the wiring CL. Although not illustrated, a wiring connected to the gate electrode 103 in FIGS. 6A and 6B corresponds to the wiring WL. Furthermore, the low-resistance layer 133b of the transistor 130 corresponds to the wiring SL. A node including the gate electrode 135 of the transistor 130, the plug 121 functioning as a first electrode of the capacitor 150, and the conductive layer 104a of the transistor 100 corresponds to the node FN illustrated in FIG. 5A.

In the structure of FIGS. 6A and 6B, it is preferable that the insulating film 137 that is provided over the insulating film 136 containing hydrogen contain the same material as the barrier film 111. This structure can effectively prevents water or hydrogen remaining in the insulating film 136 containing hydrogen from diffusing upward. In that case, heat treatment for removing water or hydrogen may performed twice or more in total: before formation of the insulating film 137, and after formation of the insulating film 137 and before formation of the barrier film 111.

Here, wirings such as the wiring 124, the wiring 142, and the wiring 166 can be formed using a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Conductive layers such as a conductive layer 125, the conductive layer 151, the conductive layer 152, the conductive layer 153a, the conductive layer 153b, and the conductive layers 154a to 154e; and plugs such as plugs 121 to 123, the plugs 126 to 128, the plugs 129a to 129d, the plugs 139 to 141, a plug 164, and a plug 165 can be formed using any of conductive materials such as metal materials, alloy materials, and metal oxide materials. It is particularly preferable to use a high-melting-point material that has both heat resistance and conductivity, such as tungsten or molybdenum, and it is particularly preferable to use tungsten. A stack including a material such as titanium nitride or titanium and another material may be used. For example, use of titanium nitride or titanium can improve adhesion with an opening. Furthermore, the conductive layers such as the conductive layer 125, the conductive layer 151, the conductive layer 152, the conductive layer 153a, the conductive layer 153b, and the conductive layers 154a to 154e; the plugs such as the plugs 121 to 123, the plugs 126 to 128, the plugs 129a to 129d, the plugs 139 to 141, the plug 164, and the plug 165; and the like are provided in insulating films, and the top surfaces thereof are preferably planarized.

Here, the plug 121 is in contact with the semiconductor layer 101 and the conductive layer 104a of the transistor 100 and the conductive layer 151. The plug 121 is in contact with the semiconductor layer 101 and the conductive layer 104a of the transistor 100, whereby the plug 121 functions as a wiring connected to the source region or the drain region of the transistor 100. Furthermore, the plug 121 is connected to the conductive layer 151, whereby the plug 121 functions as a wiring connected to one electrode of the capacitor 150. The plug 121 penetrates the transistor 100 to reach the conductive layer 151 serving as one electrode of the capacitor 150, so that the one plug can serve as both the electrode of the capacitor 150 and the wiring connected to the source region or the drain region of the transistor 100.

In a similar manner, the plug 122 is in contact with the semiconductor layer 101 and the conductive layer 104b of the transistor 100 and the conductive layer 125. The plug 122 is in contact with the semiconductor layer 101 and the conductive layer 104b of the transistor 100, whereby the plug 122 functions as a wiring connected to the source region or the drain region of the transistor 100. Furthermore, the plug 122 is connected to the conductive layer 125, whereby the plug 122 functions as a wiring connected to the source region or the drain region of the transistor 130. The plug 122 penetrates the transistor 100 to reach the conductive layer 125, so that the one plug can serve as both the wiring connected to the source region or the drain region of the transistor 130 and the wiring connected to the source electrode or the drain electrode of the transistor 100.

Next, examples in which the area of a circuit is reduced using the plug 121 and the plug 122 are described with reference to FIGS. 30A and 30B. A structure in FIG. 31 shows an example in which neither the plug 121 nor the plug 122 is provided. For the barrier film 211a, the description of the barrier film 111 is referred to. For an insulating film 215a, the description of the insulating film 115a is referred to. A contact 221 between the conductive layer 104a and the capacitor 150 is formed on the outer side than the semiconductor layer 101b, which causes an increase in the area of the element. In a similar manner, a contact 222 between the conductive layer 104b and the conductive layer connected to the source region or the drain region of the transistor 130 is formed on the outer side than the semiconductor layer 101b, which causes an increase in the area of the element.

Figure 30A:
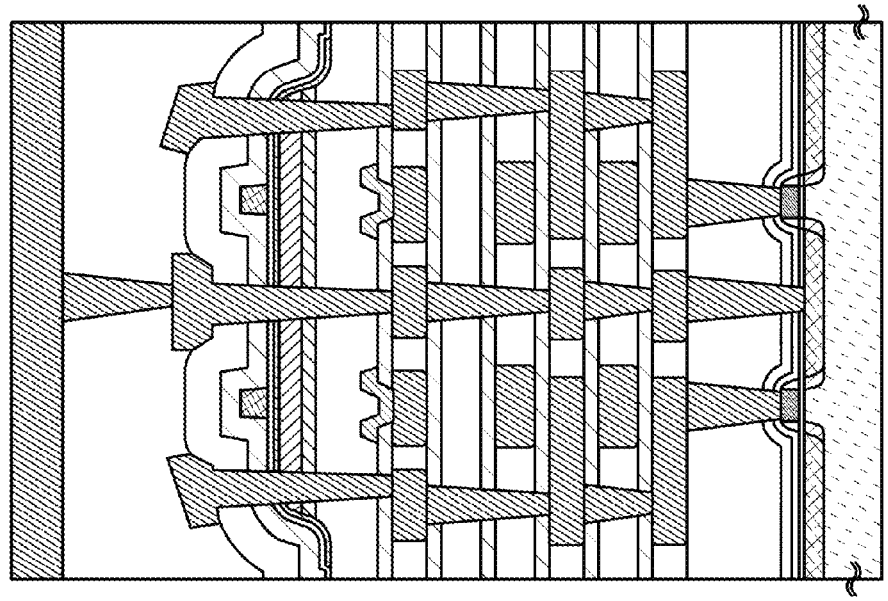
FIGS. 30A and 30B illustrate an example of a semiconductor device of one embodiment of the present invention.

FIG. 30A illustrates a structure example in which the plug 121 which penetrates the transistor 100 to be connected to one electrode of the capacitor 150, and the plug 122 which penetrates the transistor 100 to be connected to a conductive layer 251a electrically connected to the source electrode or the drain electrode of the transistor 130 are used. For barrier films 211a to 211f, the description of the barrier film 111 is referred to. For insulating films 215a to 215f, the description of the insulating film 115a is referred to. For a conductive layer 251, the description of the conductive layer 151 is referred to. For the conductive layer 251a, the description of the conductive layer 125 is referred to. Note that FIG. 30B illustrates a case where two structures each of which is the same as the structure in FIG. 30A are placed side by side. Although neither the conductive layer 104a nor the conductive layer 104b is provided in FIGS. 30A and 30B, they may be provided.

Figure 30B:
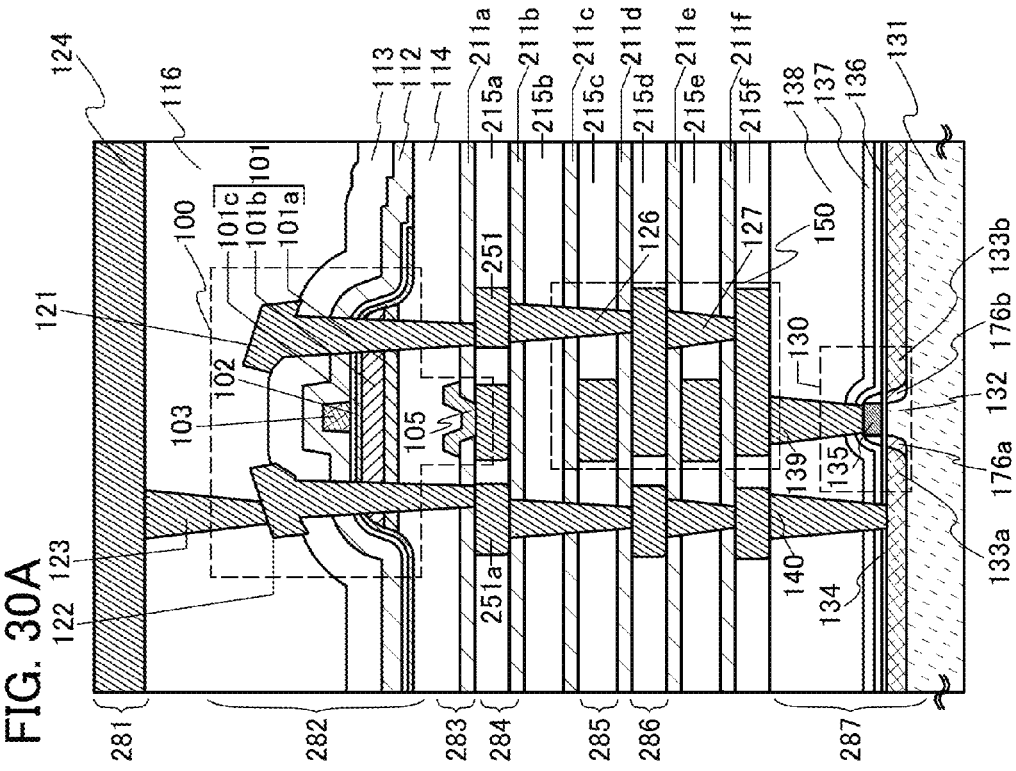
Figure 31:
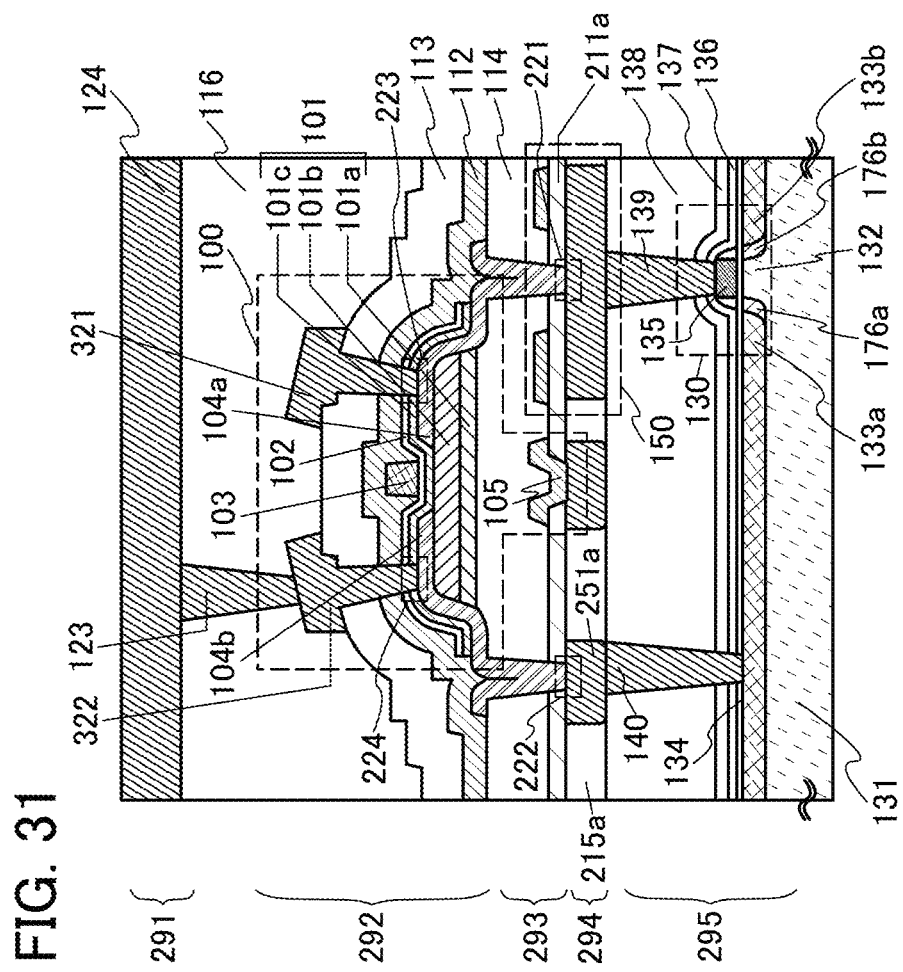
FIG. 31 illustrates a semiconductor device.

In FIG. 31, two contacts, i.e., the contact 221 between the conductive layer 104a and the capacitor 150 and a contact 223 between a plug 321 and the conductive layer 104a, are provided, whereas in FIGS. 30A and 30B, the plug 121 can serve as the two contacts. In a similar manner, in FIG. 31, two contacts, i.e., the contact 222 between the conductive layer 104b and the conductive layer 251a and a contact 224 between a plug 322 and the conductive layer 104b, are provided, whereas in FIGS. 30A and 30B, the plug 122 can serve as the two contacts. In this manner, use of the plug 121 and the plug 122 enables formation of the capacitor 150 having substantially the same width as the transistor 100 in each of the structures in FIGS. 30A and 30B, and as a result, the area occupied by the elements can be reduced.

Figure 32A:
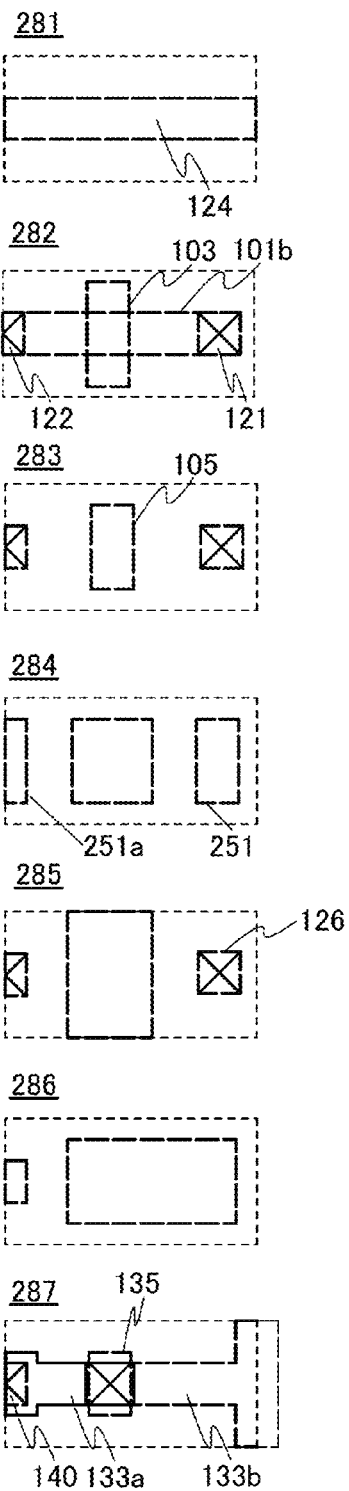
FIGS. 32A and 32B are each a top view of an example of a semiconductor device of one embodiment of the present invention.
Figure 32B:
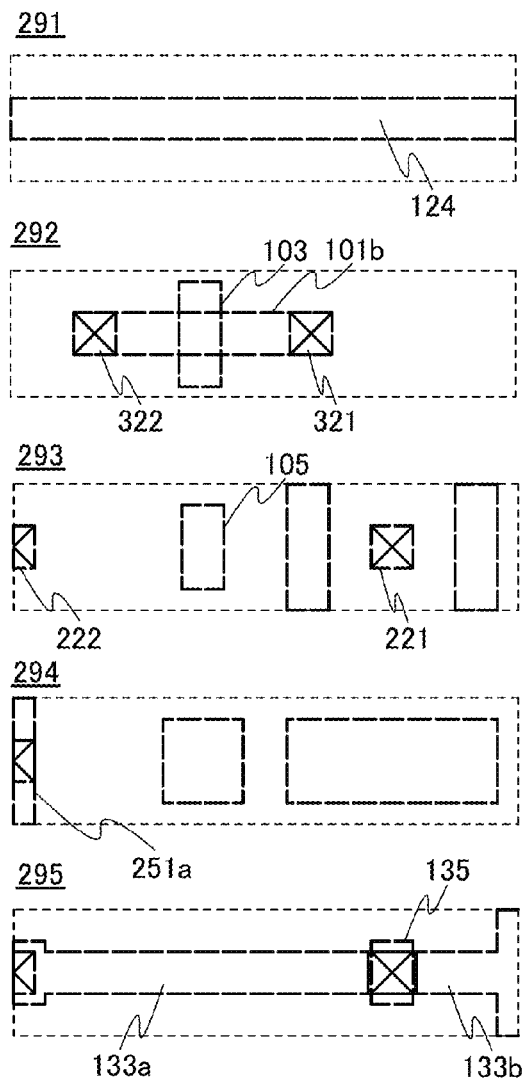

Next, a top view of layers 281 to 287 illustrated in the cross-sectional views of FIGS. 30A and 30B is illustrated in FIG. 32A. A top view of layers 291 to 295 illustrated in the cross-sectional view of FIG. 31 is illustrated in FIG. 32B. Each of the top views shows a minimum structural unit of a memory cell. The top views show that use of any of the structures in FIGS. 30A and 30B makes it possible to reduce the area to be approximately half of the area of the structure in FIG. 31.

Furthermore, as in a cross section of a semiconductor device in FIG. 33, an insulating film 261 for planarization may be formed and then the plug 121 and the plug 122 may be formed.

The semiconductor device of one embodiment of the present invention includes the transistor 130 and the transistor 100 over the first transistor 130. Since these transistors are stacked, the area occupied by the elements can be reduced. Furthermore, providing the plug 121 and the plug 122 enables reduction in an area occupied by the elements. Therefore, a semiconductor device with a reduced circuit area and having favorable characteristics can be provided. In addition, for example, in the case where one embodiment of the present invention is applied to a semiconductor device including a memory device or the like, the memory capacitance can be increased even with a small circuit area, and a semiconductor device having a memory with favorable retention characteristics can be provided. Furthermore, the barrier film 111 provided between the transistor 130 and the transistor 100 can suppress diffusion of impurities such as water and hydrogen from an underlying layer to the transistor 100 side. Furthermore, a wiring part of which functions as the first electrode and a wiring part of which functions as a second electrode are provided with the barrier film 111 therebetween to form the capacitor 150; thus, the capacitor 150 can be easily formed without additional steps for forming the capacitor 150.

The above is the description of a structural example.

[Example of Manufacturing Method]

An example of a method for manufacturing the semiconductor device described in the above structure example is described below with reference to FIGS. 8A to 8E, FIGS. 9A to 9D, FIGS. 10A to 10C, FIGS. 11A and 11B, and FIGS. 12A and 12B.

First, the semiconductor substrate 131 is prepared. As the semiconductor substrate 131, for example, a single crystal silicon substrate (including a p-type semiconductor substrate or an n-type semiconductor substrate), a compound semiconductor substrate containing silicon carbide or gallium nitride, or the like can be used. An SOI substrate may be used as the semiconductor substrate 131. The case where single crystal silicon is used for the semiconductor substrate 131 is described below.

Next, an element isolation layer (not illustrated) is formed in the semiconductor substrate 131. The element isolation layer may be formed by a local oxidation of silicon (LOCOS) method, a shallow trench isolation (STI) method, mesa isolation, or the like.

In the case where a p-channel transistor and an n-channel transistor are formed on the same substrate, an n-well or a p-well may be formed in part of the semiconductor substrate 131. For example, a p-well may be formed by adding an impurity element imparting p-type conductivity, such as boron, to an n-type semiconductor substrate 131, and an n-channel transistor and a p-channel transistor may be formed on the same substrate.

Next, an insulating film to be the gate insulating film 134 is formed over the semiconductor substrate 131. For example, a surface of the semiconductor substrate 131 is oxidized, whereby a silicon oxide film is formed. Alternatively, the insulating film may be formed as a stack of a silicon oxide film and a silicon oxynitride film formed in such a manner that the silicon oxide film is formed by thermal oxidation, and then a surface of the silicon oxide film is nitrided by nitridation treatment. Further alternatively, the insulating film may be formed using silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Next, a conductive film to be the gate electrode 135 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and an unnecessary portion of the conductive film is removed. Then, the resist mask is removed. In this manner, the gate electrode 135 can be formed.

Here, a method for processing a film is described. In the case of finely processing a film, a variety of fine processing techniques can be used. For example, a method may be used in which a resist mask formed by a photolithography process or the like is subjected to slimming treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In a particularly minute process, the organic resin film is preferably formed using a material functioning as an anti-reflection film against light for exposure. Examples of such an organic resin film serving as an anti-reflection film include bottom anti-reflection coating (BARC) film. The organic resin film may be removed at the same time as the removal of the resist mask or after the resist mask is removed.

After the gate electrode 135 is formed, a sidewall covering the side surface of the gate electrode 135 may be formed. The sidewall can be formed in such a manner that an insulating film thicker than the gate electrode 135 is formed and subjected to anisotropic etching so that only a portion of the insulating film on the side surface of the gate electrode 135 remains.

Figure 8A:
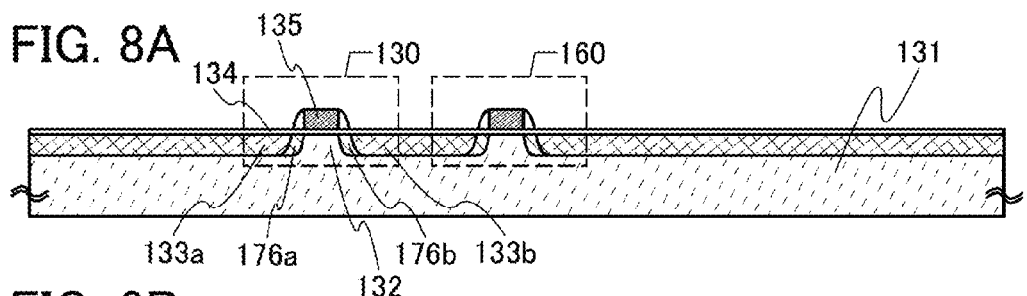
FIGS. 8A to 8E illustrate a method for manufacturing a semiconductor device of one embodiment of the present invention.

FIG. 8A illustrates an example in which etching of the gate insulating film is not performed at the time of formation of the sidewall. However, the insulating film to be the gate insulating film 134 may be performed at the same time as formation of the sidewall. In this case, the gate insulating film 134 is provided below the gate electrode 135 and the sidewall.

Next, an element imparting n-type conductivity, such as phosphorus, or an element imparting p-type conductivity, such as boron, is added to a region of the semiconductor substrate 131 where the gate electrode 135 (and the sidewall) is not provided. FIG. 8A illustrates a schematic cross-sectional view at this stage.

Next, the insulating film 136 is formed, and then, first heat treatment is performed to activate the aforementioned element which imparts conductivity.

The insulating film 136 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 136 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 130 is formed. Furthermore, the transistor 160 may be formed in a manner similar to that for forming the transistor 130.

Next, the insulating film 137 and the insulating film 138 are formed.

The insulating film 137 can be formed using any of the materials that can be used for the insulating film 136, and is preferably formed using silicon nitride containing oxygen and hydrogen (SiNOH) because the amount of hydrogen released by heating can be increased. Alternatively, the insulating film 138 can be formed using any of the materials that can be used for the insulating film 136, and is preferably formed using silicon oxide with high step coverage that is formed by reacting tetraethyl orthosilicate (TEOS), silane, or the like with oxygen, nitrous oxide, or the like.

The insulating films 137 and 138 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, the top surface of the insulating film 138 is planarized by a CMP method or the like. As the insulating film 138, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of boron phosphorus silicate glass (BPSG). Furthermore, an example of a film which can be formed by a coating method is a film of hydrogen silsesquioxane (HSQ).

After that, second heat treatment is performed so that dangling bonds in the semiconductor layer 132 are terminated by hydrogen released from the insulating film 137. By the second heat treatment, water and hydrogen are released from each layer; thus, the water content and the hydrogen content can be reduced.

The second heat treatment can be performed under the conditions given as an example in the above description of the stacked-layer structure. For example, the conditions described for the first heat treatment or the like can be used.

Figure 8B:
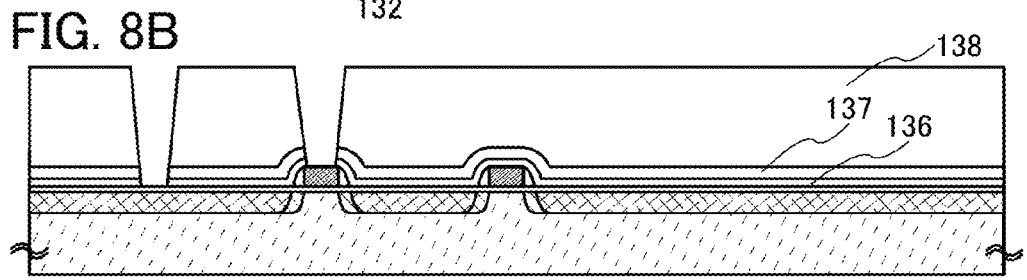
Figure 8C:
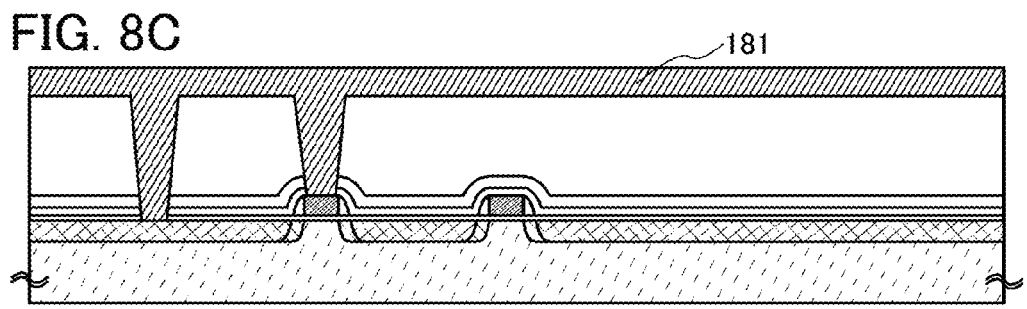
Figure 8D:
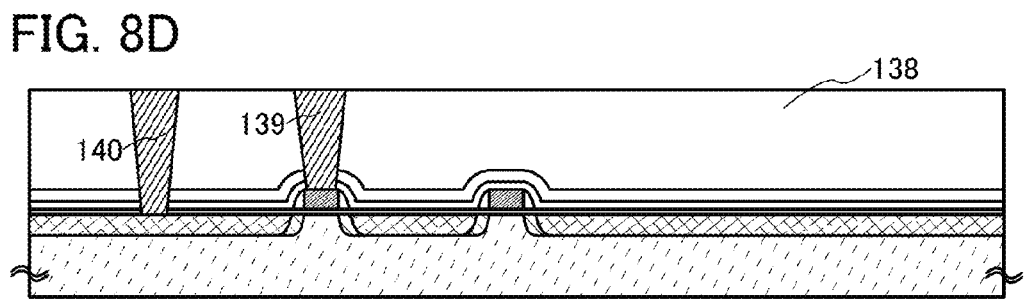
Figure 8E:
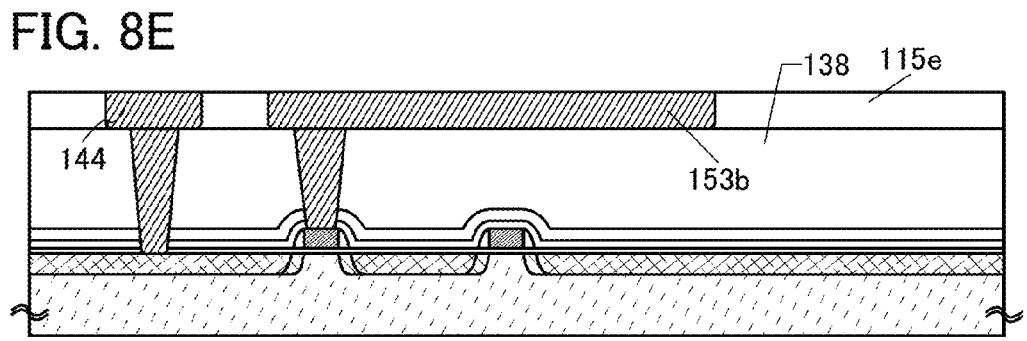

Next, openings reaching the low-resistance layers 133a and 133b, the gate electrode 135, and the like are formed in the insulating film 136, the insulating film 137, and the insulating film 138 (see FIG. 8B). After that, a conductive film 181 to be the plug 139 and the like is formed to fill the openings (see FIG. 8C). Then, planarization treatment is performed on the conductive film 181 so that the top surface of the insulating film 138 is exposed, whereby the plug 139, the plug 140, and the like are formed (see FIG. 8D). The conductive film 181 can be formed by a sputtering method, a CVD method (including a thermal CVD method, an MOCVD method, a PECVD method, and the like), an MBE method, an ALD method, a PLD method, or the like.

Next, the insulating film 115e is deposited over the insulating film 138, and openings are formed. After that, a conductive film is formed to fill the openings and subjected to planarization treatment so that the top surface of the insulating film 115e is exposed, whereby the conductive layer 144, the conductive layer 153b, and the like are formed (see FIG. 8E). In the example illustrated in FIGS. 6A and 6B, the conductive layer 153b functions as an electrode of the capacitor.

Figure 9A:
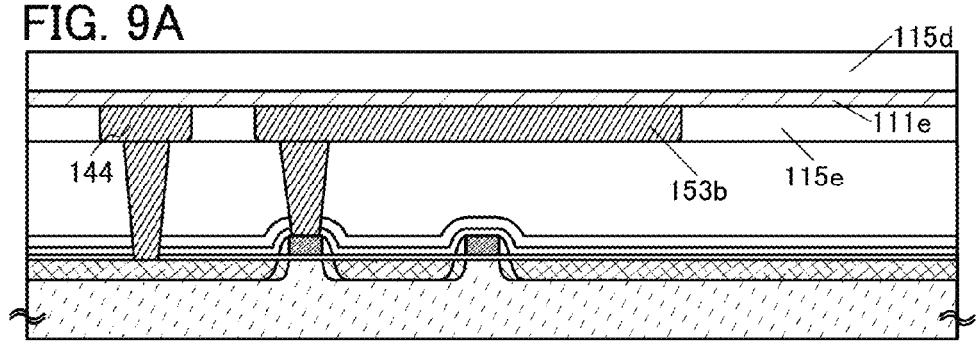
FIGS. 9A to 9D illustrate a method for manufacturing a semiconductor device of one embodiment of the present invention.
Figure 9B:
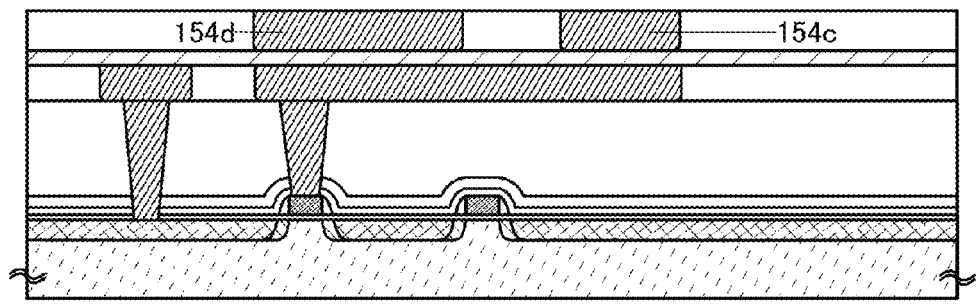
Figure 9C:
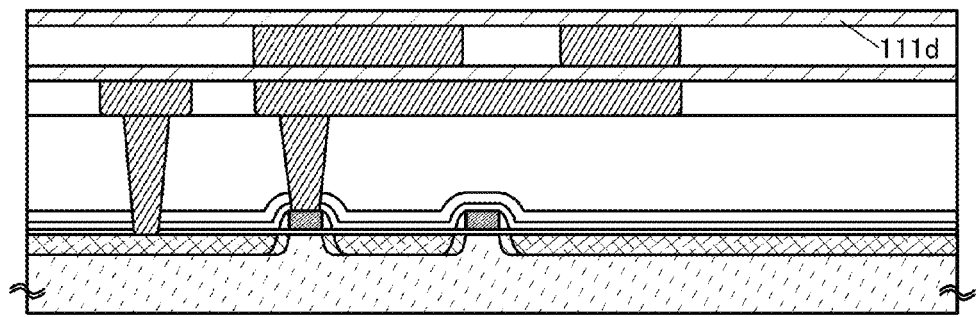

Next, the barrier film 111e is formed and the insulating film 115d is formed (see FIG. 9A). Then, openings are formed in the insulating film 115d. After that, a conductive film is formed to fill the openings and subjected to planarization treatment so that the top surface of the insulating film 115e is exposed, whereby the conductive layer 154d, the conductive layer 154e, and the like are formed (see FIG. 9B). In the example in FIGS. 6A and 6B, the conductive layer 154d and the conductive layer 154e function as the electrodes of the capacitor. Then, the barrier film 111d is deposited (see FIG. 9C).

Subsequently, openings are formed in the barrier films 111d, 115d, and 111e. After that, a conductive film to be the plug 127 and the like is formed to fill the openings and subjected to planarization treatment so that the top surface of the barrier film 111d is exposed, whereby the plug 127, a plug 145, and the like are formed (see FIG. 9D).

Figure 10A:
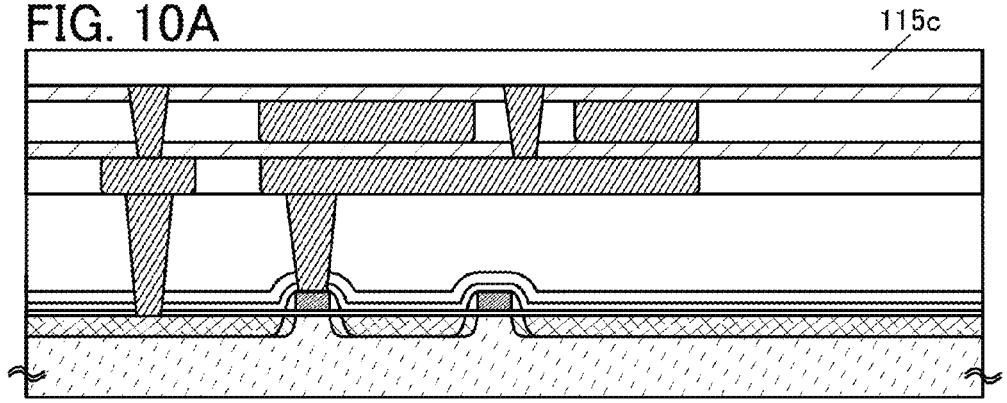
FIGS. 10A to 10C illustrate a method for manufacturing a semiconductor device of one embodiment of the present invention.
Figure 10B:
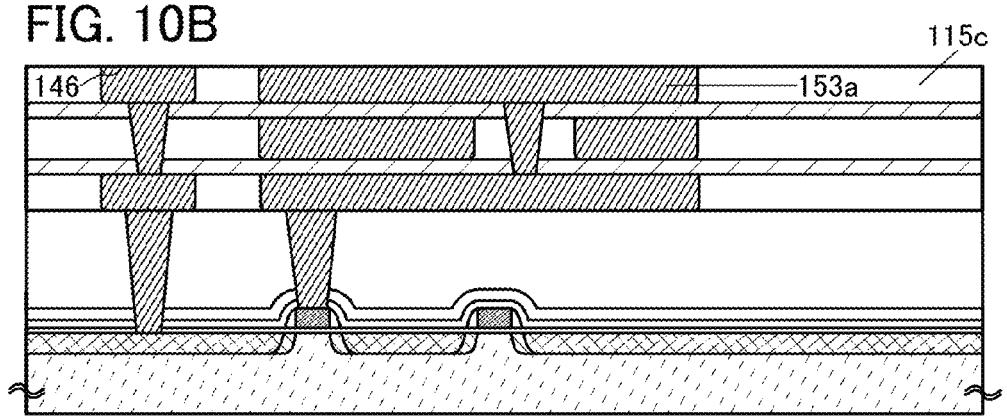
Figure 10C:
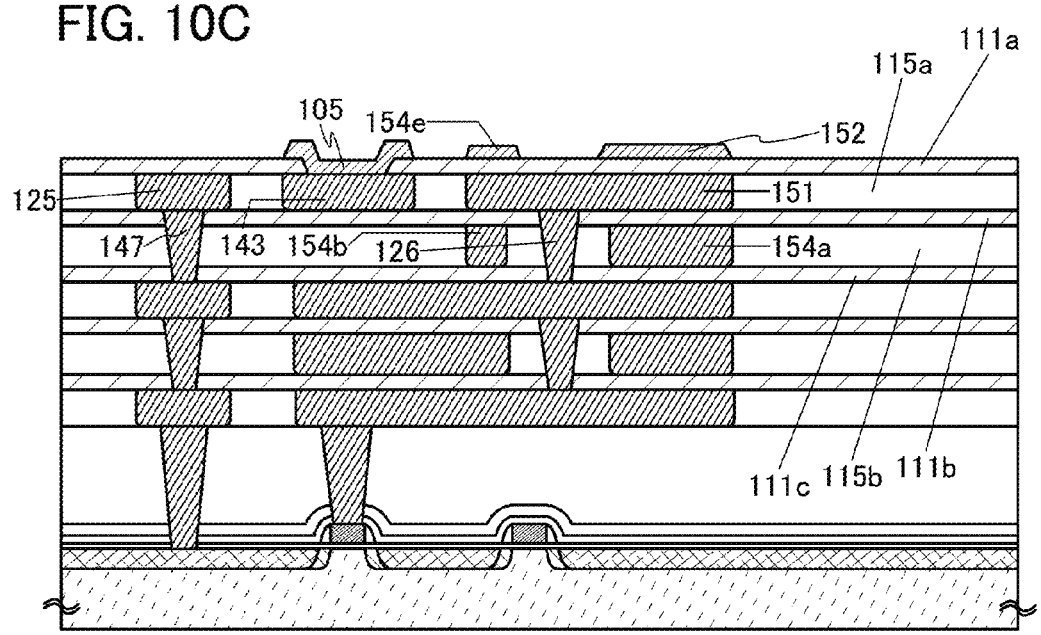

Next, the insulating film 115c is formed (see FIG. 10A). Then, openings are formed in the insulating film 115c. After that, a conductive film is formed to fill the openings and subjected to planarization treatment so that the top surface of the insulating film 115c is exposed, whereby the conductive layer 146, the conductive layer 153a, and the like are formed (see FIG. 10B). The conductive layer 153a functions as an electrode of the capacitor.

Next, the conductive layer 154a, the conductive layer 154b, the plug 126, and a plug 147 are formed using a method similar to that illustrated in FIGS. 9A to 9D, and the barrier film 111a is deposited. Then, an opening is formed in a region of the barrier film 111a that is in contact with a conductive layer 143, and then a conductive film is deposited. After that, a resist mask is formed, and an unnecessary portion of the conductive film is removed by etching. Then, the resist mask is removed, whereby the conductive layer 152, the conductive layer 154e, and the conductive layer 105 functioning as a second gate electrode can be formed (see FIG. 10C).

Figure 9D:
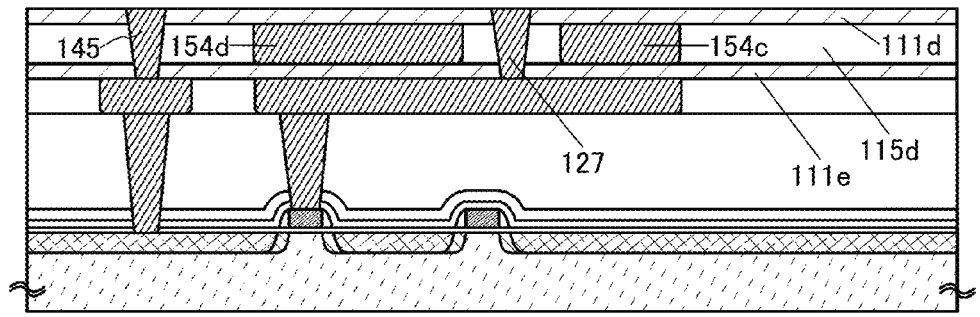

Here, in FIG. 9D, the barrier film 111d has been subjected to planarization treatment. As illustrated in FIGS. 9A to 9D and FIGS. 10A to 10C, the barrier film 111d may be used as an insulating film of the capacitor. Alternatively, the process from FIG. 9D to FIG. 10C may be replaced with process from FIG. 13A to FIG. 14B. Deposition may be performed again after the barrier film 111d is removed. An example thereof is illustrated in FIGS. 13A to 13D and FIGS. 14A and 14B. For example, in the case where planarization treatment is performed by a CMP method or the like, damage or the like is sometimes caused on the surface of the film or the like. In this case, as described below, the damaged film or the surface region of the film is removed, and an insulating film used for the capacitor is deposited, whereby the capacitance characteristics can be improved.

Figure 13A:
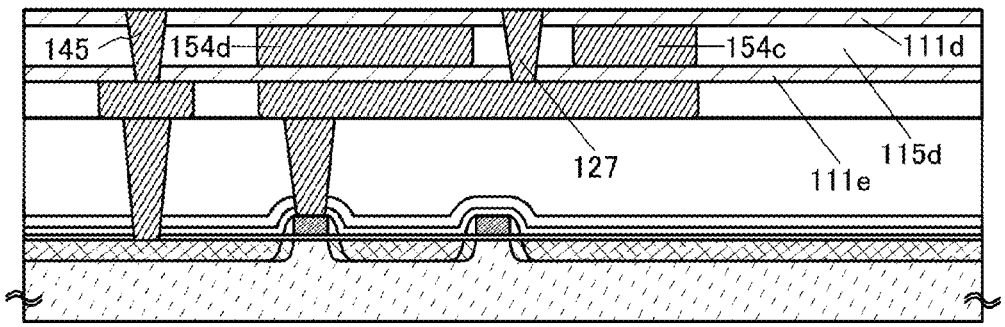
FIGS. 13A to 13D illustrate a method for manufacturing a semiconductor device of one embodiment of the present invention.
Figure 13B:
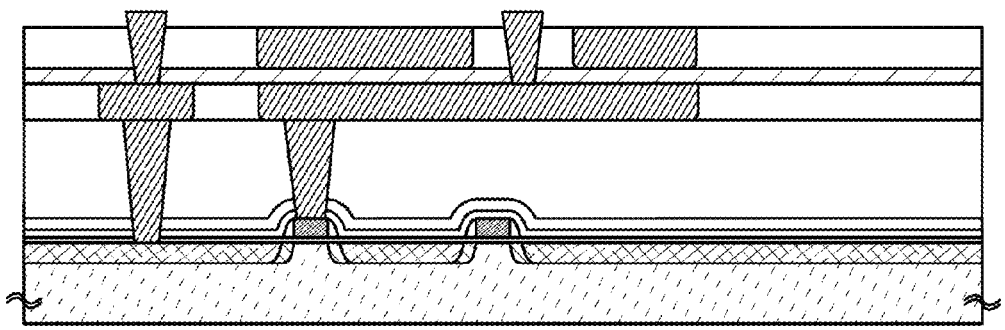
Figure 13C:
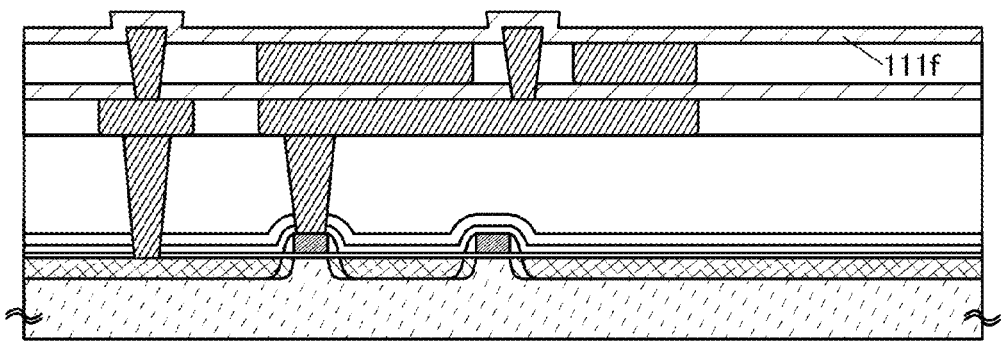
Figure 13D:
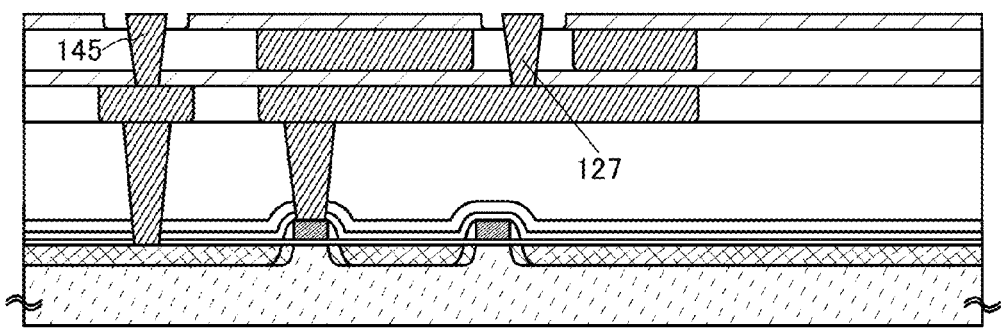
Figure 14A:
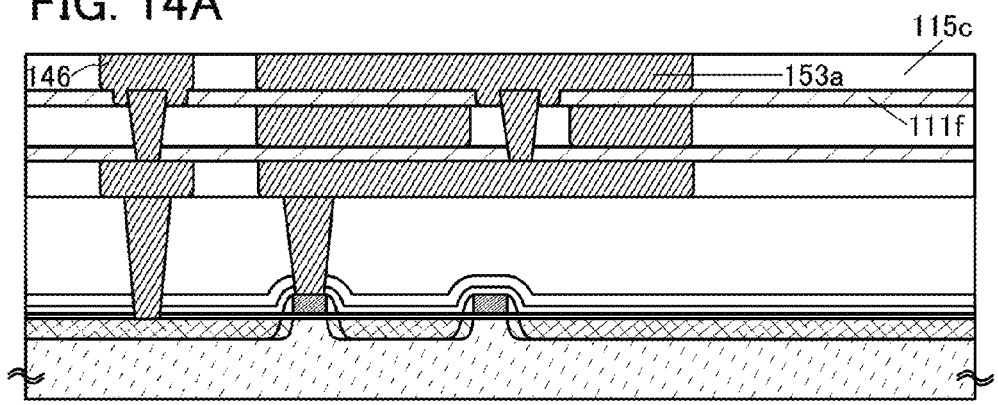
FIGS. 14A and 14B illustrate a method for manufacturing a semiconductor device of one embodiment of the present invention.
Figure 14B:
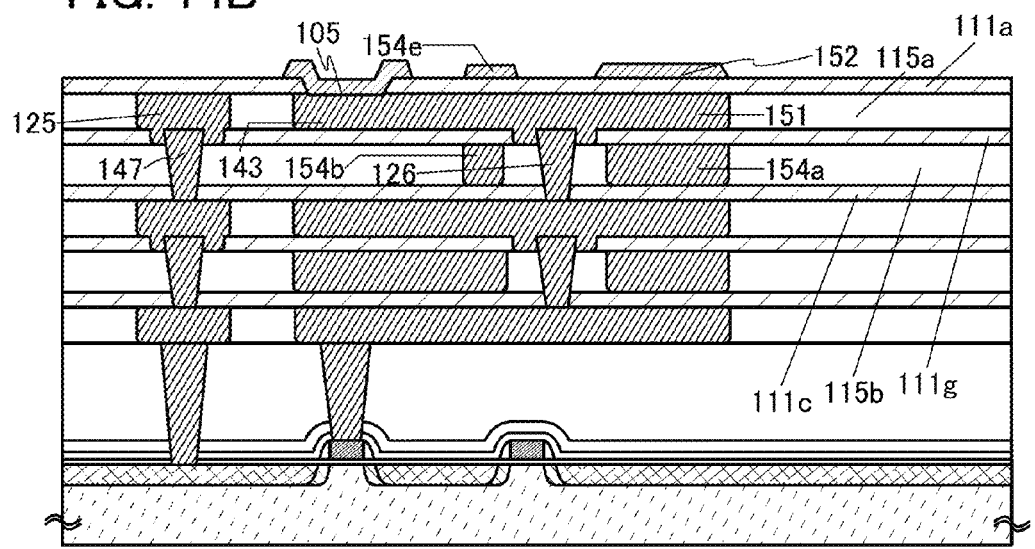

As described with reference to FIG. 9D, FIG. 13A illustrates the state in which the conductive film to be the barrier film 111d, the plug 127, and the like has been subjected to planarization treatment. After that, the barrier film 111d is removed by etching or the like as illustrated in FIG. 13B. After that, a barrier film 111f is formed. Next, a resist mask is formed and etching is performed, whereby openings are formed in regions of the barrier film 111f that are positioned over plugs such as the plug 127 and the plug 145. After that, the resist mask is removed (FIG. 13C).

Next, the insulating film 115c is formed. After that, a resist mask is formed and etching is performed, whereby openings are formed in the insulating film 115c. Then, a conductive layer 146, the conductive layer 153a, and the like are formed to fill the openings (see FIG. 14A).

Next, the barrier film 111c is deposited, and then the insulating film 115b is deposited. After that, the conductive layer 154a, the conductive layer 154b, the barrier film 111g, the plug 126, and the plug 147 are formed using methods similar to those for forming the conductive layer 154c, the conductive layer 154d, the barrier film 111f, the plug 127, and the plug 145.

Next, the insulating film 115a is deposited. After that, the conductive layer 125 and the conductive layer 151 are formed by a method similar to that for forming the conductive layer 146 and the conductive layer 153a. Then, the barrier film 111a is deposited. Subsequently, an opening is provided in the barrier film 111a, a conductive film is formed, and then the conductive layer 105, the conductive layer 152, and the conductive layer 154e are formed using a resist mask or the like (see FIG. 14B). The above is the description of the case where the process from FIG. 9D to FIG. 10C is replaced with the process from FIG. 13A to FIG. 14B.

The insulating films 115a to 115e can be formed using materials similar to those of the insulating film 136 and the like.

The barrier films 111a to 111g can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage. The description of the barrier film 111 may be referred to for a material that can be used for the barrier films 111a to 111g.

After the insulating film 115e is formed, third heat treatment is preferably performed. By the third heat treatment, water and hydrogen are released from each layer; thus, the contents of water and hydrogen can be reduced. In the case where the third heat treatment is performed shortly before formation of the barrier film 111e to thoroughly remove hydrogen and water from layers under the barrier film 111e and then the barrier film 111e is formed, it is possible to inhibit diffusion and release of water and hydrogen to the side under the barrier film 111e in a later step.

The third heat treatment can be performed under the conditions given as an example in the above description of the stacked-layer structure. For example, the conditions described for the first heat treatment can be used. Note that heat treatment similar to the third heat treatment may be performed after deposition of each of the insulating films 115a to 115d.

At this stage, the capacitor 150 is formed. The capacitor 150 includes the conductive layers 152 and 154a to 154e parts of which function as a first electrode; the conductive layers 151, 153a, and 153b parts of which function as a second electrode, and the barrier films 111a to 111e each of which is positioned between any two of the above layers.

Next, the insulating film 114 is deposited. The insulating film 114 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

To make the insulating film 114 contain excess oxygen, the insulating film 114 may be deposited in an oxygen atmosphere, for example. Alternatively, a region containing excess oxygen may be formed by introduction of oxygen into the insulating film 114 that has been deposited. Both the methods may be combined.

For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the insulating film 114 is formed, the insulating film 114 may be subjected to planarization treatment using a CMP method or the like to improve the planarity the top surface thereof.

Next, a semiconductor film to be the semiconductor layer 101a and a semiconductor film to be the semiconductor layer 101b are deposited in this order. The semiconductor films are preferably formed successively without contact with the air. The semiconductor film to be the semiconductor layer 101a and the semiconductor film to be the semiconductor layer 101b can be formed by a sputtering method, a CVD method, an MBE method, a PLD method, an ALD method, or the like.

Note that in the case where In—Ga—Zn oxide layers formed by an MOCVD method are used as the semiconductor to be the semiconductor layer 101a and the semiconductor to be the semiconductor layer 101b, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

After the semiconductor films are formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. Note that the heat treatment may be performed directly after the formation of the semiconductor films or may be performed after the semiconductor films are processed into the island-shaped semiconductor layers 101a and 101b. Through the heat treatment, oxygen can be supplied to the semiconductor films from the insulating film 114 and the oxide film; thus, oxygen vacancy in the semiconductor films can be reduced.

Then, a resist mask is formed by a method similar to that described above, and an unnecessary portion is removed by etching. Then, the resist mask is removed. In this manner, a stacked-layer structure including the island-shaped semiconductor layers 101a and 101b can be formed (see FIG. 11A). Note that, in some cases, part of the insulating film 114 is etched in the etching of the semiconductor films to reduce the thickness of a portion of the insulating film 114 which is not covered with the semiconductor layer 101a and the semiconductor layer 101b. For this reason, the insulating layer 114 is preferably formed to have a large thickness so as not to be removed by the etching.

After that, a conductive film 104 is formed (see FIG. 11B). The conductive film 104 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, a resist mask is formed and an unnecessary portion of the conductive film 104 is removed by etching. After that, the resist mask is removed, so that the conductive layer 104a and the conductive layer 104b are formed. Here, in some cases, parts of the upper portions of the semiconductor layer 101b and the insulating film 114 are etched in the etching of the conductive film to reduce the thickness of a portion where the conductive layer 104a and the conductive layer 104b do not overlap the semiconductor layer 101b. For this reason, the semiconductor film to be the semiconductor layer 101b, and the like are preferably formed to have a large thickness in advance in consideration of the etching depth.

Next, the gate insulating film 102 and the semiconductor layer 101c are deposited, a resist mask is formed, etching is performed, and then the resist mask is removed. After that, a conductive film to be the gate electrode 103 is deposited (see FIG. 12A). Then, a resist mask is formed, the conductive film is processed by etching, and the resist mask is removed, whereby the gate electrode 103 is formed. A semiconductor film to be the semiconductor layer 101c can be formed by a sputtering method, a CVD method, an MBE method, a PLD method, an ALD method, or the like.

Note that in the case where an In—Ga—Zn oxide layer formed by an MOCVD method are used as the semiconductor to be the semiconductor layer 101c, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

At this stage, the transistor 100 is formed.

Next, the insulating film 112 is formed. The insulating film 112 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 112 is formed, fifth heat treatment is preferably performed. Through the heat treatment, oxygen can be supplied from the insulating film 114 and the like to the semiconductor layer 101 to reduce oxygen vacancy in the semiconductor layer 101. At this time, oxygen released from the insulating film 114 is blocked by the barrier film 111 and the insulating film 112 and does not diffuse into layers under the barrier film 111 and layers over the insulating film 114; therefore, oxygen can be effectively confined. Thus, the amount of oxygen supplied to the semiconductor layer 101 can be increased, so that oxygen vacancy in the semiconductor layer 101 can be effectively reduced.

Furthermore, the insulating film 112 may have a stacked-layer structure of two or more layers. In this case, for example, the insulating film 112 may be formed to have a two-layer structure in which the bottom layer is formed using, for example, silicon oxide, silicon oxynitride, silicon nitride oxide, silicon nitride, aluminum oxide, aluminum oxynitride, aluminum nitride oxide, aluminum nitride, or the like. Furthermore, the top layer is preferably formed using a material to which water and hydrogen do not easily diffuse, as in the case of the barrier film 111. The bottom insulating layer may be an insulating film from which oxygen is released by heating in a manner similar to that of an insulating film 114, so that oxygen may be supplied also from above the semiconductor layer 101 through the gate insulating film 102.

Next, the insulating film 113 is formed. The insulating film 113 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 113 can be formed by a sputtering method, a CVD method (including a thermal CVD method, an MOCVD method, a PECVD method, and the like), an MBE method, an ALD method, a PLD method, or the like, for example. In particular, it is preferable that the insulating film 113 be formed by a CVD method, more preferably a plasma CVD method because coverage can be favorable. It is preferable to use a thermal CVD method, an MOCVD method, or an ALD method in order to reduce plasma damage.

Subsequently, as illustrated in FIG. 12B, openings are formed in the insulating film 113, the insulating film 112, the gate insulating film 102, the conductive layer 104a, the conductive layer 104b, the semiconductor layer 101b, the semiconductor layer 101a, and the insulating film 114. Next, a conductive film is formed to fill the openings, an unnecessary portion is removed using a resist mask, and the resist mask is removed, whereby the plug 121 and the plug 122 are formed. Here, the plug 121 penetrates the insulating film 113, the insulating film 112, the gate insulating film 102, the semiconductor layer 101c, the conductive layer 104a, the semiconductor layer 101b, the semiconductor layer 101a, the insulating film 114, and the barrier film 111a and is connected to the conductive layer 151. The conductive layer 104a is in contact with the side surface of the plug 121, whereby the plug 121 and the conductive layer 104a are connected to each other. In a similar manner, the plug 122 penetrates the insulating film 113, the insulating film 112, the gate insulating film 102, the semiconductor layer 101c, the conductive layer 104b, the semiconductor layer 101b, the semiconductor layer 101a, the insulating film 114, and the barrier film 111a and is connected to the conductive layer 125. The conductive layer 104b is in contact with the side surface of the plug 122, whereby the plug 122 and the conductive layer 104b are connected to each other.

Next, the insulating film 116 is formed. The insulating film 116 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 116 can be formed by a sputtering method, a CVD method (including a thermal CVD method, an MOCVD method, a PECVD method, and the like), an MBE method, an ALD method, a PLD method, or the like, for example. In the case where the insulating film 116 is formed using an organic insulating material such as an organic resin, a coating method such as a spin coating method may be used. After the insulating film 116 is formed, the top surface thereof is preferably subjected to planarization treatment. The material and formation method for the insulating film 138 may be used for the insulating film 116.

Subsequently, the plug 123 reaching the plug 122, and the like are formed in the insulating film 116 by a method similar to that described above.

A conductive film is formed over the insulating film 116. Then, a resist mask is formed by a method similar to that described above, and an unnecessary portion of the conductive film is removed by etching. After that, the resist mask is removed. In this manner, the wiring 124 and the like can be formed (see FIG. 12B).

Through the above steps, the semiconductor device if one embodiment of the present invention can be manufactured.

Figure 15A:
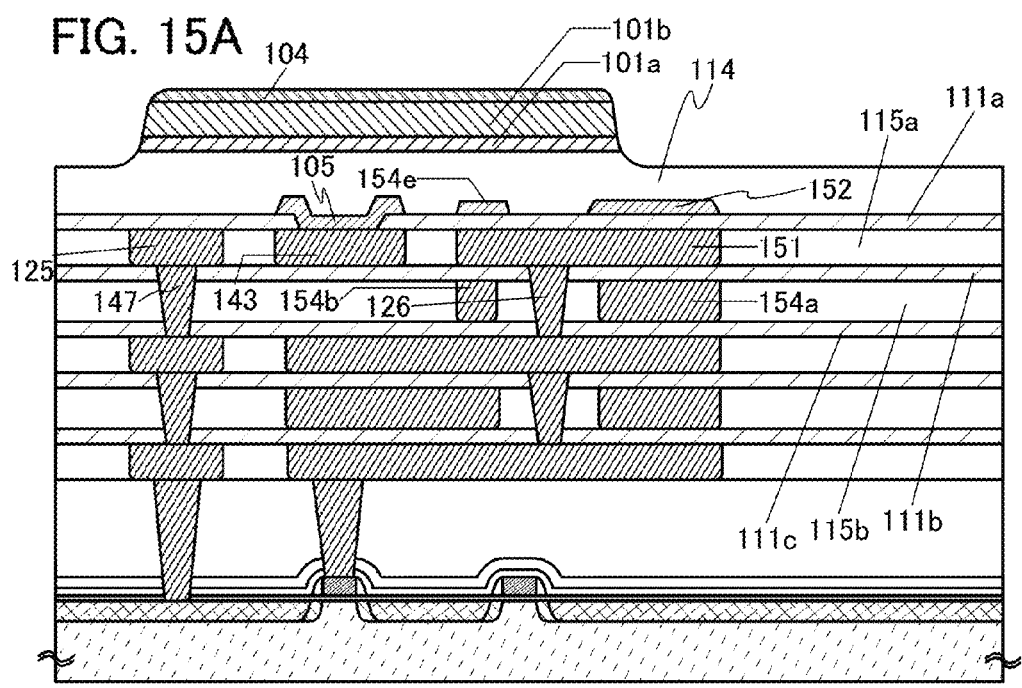
FIGS. 15A and 15B illustrate a method for manufacturing a semiconductor device of one embodiment of the present invention.

Note that a structure illustrated in FIG. 15A may be obtained through the following process for forming the semiconductor layer 101a and the semiconductor layer 101b: the conductive film 104 is formed, a resist mask is formed, the conductive film 104 is etched, and then a semiconductor layer to be the semiconductor layer 101a and a semiconductor layer to be the semiconductor layer 101b are etched. After that, the conductive film 104 is processed again to form the conductive layer 104a and the conductive layer 104b are formed. Then, the process from FIG. 12A to FIG. 13D is performed, so that the transistor 100 can have a structure illustrated in FIG. 15B.

Figure 15B:
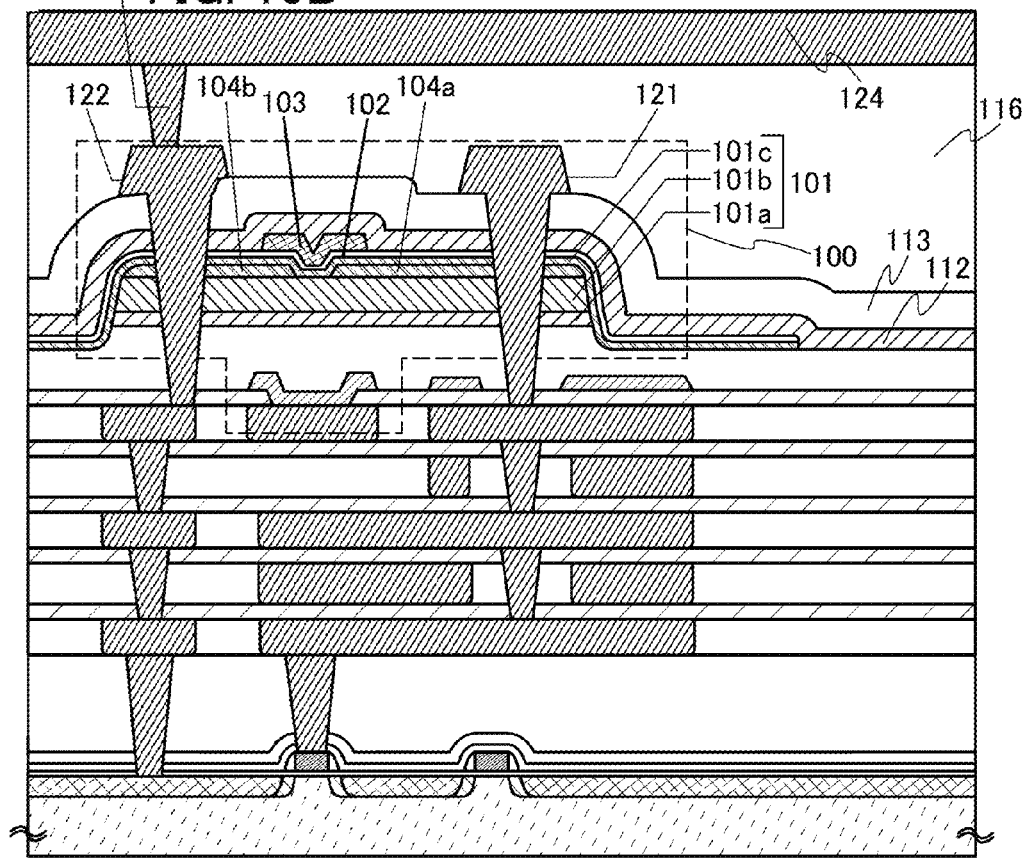

Furthermore, as an example of a method for manufacturing the transistor 100 having a different structure from the transistor 100 illustrated in FIG. 15B, an example of a method for manufacturing the transistor 100 in FIGS. 1A and 1B is briefly described.

First, a semiconductor film to be the semiconductor layer 101 is formed over the insulating film 114, a resist mask or the like is formed, and then etching is performed to form the semiconductor layer 101. Next, an insulating film to be the gate insulating film 102 and a conductive film to be the gate electrode 103 are formed, a resist mask or the like is formed, and then etching is performed to form the gate electrode 103 and the gate insulating film 102.

Then, the low-resistance region 171a and the low-resistance region 171b are formed. A semiconductor layer having high carrier density has low resistance. As ways to increase the carrier density, for example, addition of an impurity, formation of oxygen vacancy, and the like can be given. For example, to increase the carrier density, an element may be added by ion implantation. As the element, one or more of argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added.

There is a possibility that, for example, unnecessary hydrogen can be trapped in such a low-resistance region. The trap of unnecessary hydrogen in the low-resistance layer can reduce the hydrogen concentration of the channel region, and as a result, favorable transistor characteristics can be obtained.

Next, the insulating film 112 and the insulating film 113 are formed. After that, the plug 121 and the plug 122 are formed by the method described above. Through the above-described process, the transistor 100 illustrated in FIGS. 1A and 1B can be manufactured.

(Embodiment 2)

In this embodiment, an oxide semiconductor which can be favorably used for the transistor 100 described in Embodiment 1 is described.

Here, an example illustrated in FIGS. 6A and 6B in which a stack formed of three layers, i.e., a stack formed of the semiconductor layers 101*a*, 101*b*, and 101*c*, is used as the oxide semiconductor is described; however, the oxide semiconductor that can be used to the transistor 100 may be formed of a single layer. Alternatively, a structure in which one or two of the semiconductor layer 101*a*, the semiconductor layer 101*b*, and the semiconductor layer 101*c* are not provided may be employed.

The semiconductor layer 101*b* is, for example, an oxide semiconductor containing indium. The semiconductor layer 101*b* can have high carrier mobility (electron mobility) by containing indium, for example. The semiconductor layer 101*b* preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Further, the semiconductor layer 101*b* preferably contains zinc. When the oxide semiconductor contains zinc, the oxide semiconductor is easily to be crystallized, for example.

Note that the semiconductor layer 101*b* is not limited to the oxide semiconductor containing indium. The semiconductor layer 101*b* may be, for example, an oxide semiconductor which does not contain indium and contains zinc, such as a zinc tin oxide or a gallium tin oxide, an oxide semiconductor containing gallium, or an oxide semiconductor containing tin.

For the semiconductor layer 101*b*, an oxide with a wide energy gap is used. The energy gap of the semiconductor layer 101*b* is, for example, 2.5 eV or larger and 4.2 eV or smaller, preferably 2.8 eV or larger and 3.8 eV or smaller, more preferably 3 eV or larger and 3.5 eV or smaller.

For example, the semiconductor layer 101*a* and the semiconductor layer 101*c* are each an oxide semiconductor which includes one or more kinds of elements other than oxygen that are included in the semiconductor layer 101*b*. Since the semiconductor layer 101*a* and the semiconductor layer 101*c* are each formed using one or more kinds of elements other than oxygen that are included in the semiconductor layer 101*b*, interface states are unlikely to be formed at the interface between the semiconductor layer 101*a* and the semiconductor layer 101*b* and the interface between the semiconductor layer 101*b* and the semiconductor layer 101*c*.

It is preferable that the semiconductor layer 101*a*, the semiconductor layer 101*b*, and the semiconductor layer 101*c* each preferably contain indium. In the case when the semiconductor layer 101*a* is an In-M-Zn oxide, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case where the semiconductor layer 101*b* is an In-M-Zn oxide, when summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case where the semiconductor layer 101*c* is an In-M-Zn oxide, when summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the semiconductor layer 101*c* may be an oxide that is a type the same as that of the semiconductor layer 101*a*.

As the semiconductor layer 101*b*, an oxide which has higher electron affinity than the semiconductor layer 101*a* and the semiconductor layer 101*c* is used. For example, for the semiconductor layer 101*b*, an oxide having an electron affinity higher than that of each of the semiconductor layer 101*a* and the semiconductor layer 101*c* by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

Note that indium gallium oxide has small electron affinity and a high oxygen-blocking property. Therefore, the semiconductor layer 101*c* preferably includes indium gallium oxide. The atomic percentage of gallium [Ga/(In+Ga)] is, for example, higher than or equal to 70%, preferably higher than or equal to 80%, further preferably higher than or equal to 90%.

When an electric field is applied to the gate electrode at this time, the channel is formed in the semiconductor layer 101*b* that has the highest electron affinity among the semiconductor layers 101*a*, 101*b*, and 101*c*.

Figure 18A:
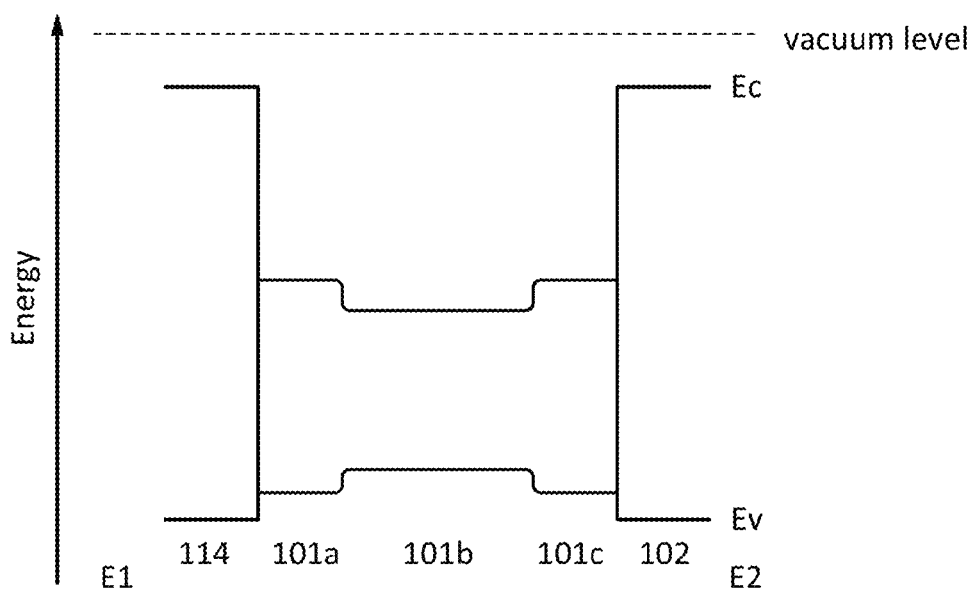

FIG. 18A illustrates a band structure. In FIG. 18A, the vacuum level (denoted as "vacuum level"), the energy of the bottom of the conduction band of each layer (denoted as "Ec"), and the energy of the top of the valence band (denoted as "Ev") are illustrated.

Here, a mixed region of the semiconductor layer 101*a* and the semiconductor layer 101*b* might exist between the semiconductor layer 101*a* and the semiconductor layer 101*b*. Furthermore, a mixed region of the semiconductor layer 101*b* and the semiconductor layer 101*c* might exist between the semiconductor layer 101*b* and the semiconductor layer 101*c*. The mixed region has a low density of interface states. For that reason, the stack including the semiconductor layers 101*a*, 101*b*, and 101*c* has a band structure where energy at each interface and in the vicinity of the interface is changed continuously (continuous junction).

Note that FIG. 18A illustrates the case where the Ec of the semiconductor layer 101*a* and the Ec of the semiconductor layer 101*c* are equal to each other; however, they may be different from each other. For example, Ec of the semiconductor layer 101c may be higher than Ec of the semiconductor layer 101a.

Figure 18B:
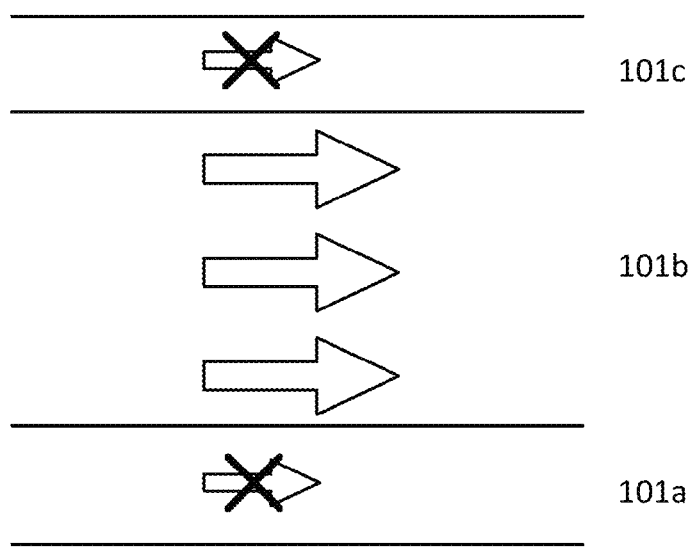

At this time, electrons mainly move not in the semiconductor layer 101a and the semiconductor layer 101c but in the semiconductor layer 101b (see FIG. 18B). As described above, when the interface state density at the interface between the semiconductor layer 101a and the semiconductor layer 101b and the interface state density at the interface between the semiconductor layer 101b and the semiconductor layer 101c are lowered, the on-state current of the transistor can be increased without interruption of the movement of electrons in the semiconductor layer 101b.

Note that in the case where the transistor has an s-channel structure, the channel is formed in the entire region of the semiconductor layer 101b. Therefore, as the thickness of the semiconductor layer 101b is increased, the size of the channel region is increased. That is, the thicker the semiconductor layer 101b is, the larger the on-state current of the transistor is. For example, the semiconductor layer 101b may have a region with a thickness of greater than or equal to 20 nm, preferably greater than or equal to 40 nm, further preferably greater than or equal to 60 nm, and still further preferably greater than or equal to 100 nm. Note that there is a possibility that the productivity of the semiconductor device is reduced; therefore, for example, the semiconductor layer 101b includes a region with a thickness of, for example, less than or equal to 300 nm, preferably less than or equal to 200 nm, and further preferably less than or equal to 150 nm.

Moreover, the thickness of the semiconductor layer 101c is preferably as small as possible to increase the on-state current of the transistor. For example, the semiconductor layer 101c may include a region with a thickness of less than 10 nm, preferably less than or equal to 5 nm, and further preferably less than or equal to 3 nm. Meanwhile, the semiconductor layer 101c has a function of blocking elements other than oxygen (such as hydrogen and silicon) included in the adjacent insulator from entering the semiconductor layer 101b where a channel is formed. For this reason, it is preferable that the semiconductor layer 101c have a certain thickness. For example, the semiconductor layer 101c may include a region with a thickness of greater than or equal to 0.3 nm, preferably greater than or equal to 1 nm, and further preferably greater than or equal to 2 nm. The semiconductor layer 101c preferably has an oxygen blocking property to suppress outward diffusion of oxygen released from the insulating film 102 and the like.

To improve reliability, preferably, the thickness of the semiconductor layer 101a is large and the thickness of the semiconductor layer 101c is small. For example, the semiconductor layer 101a may include a region with a thickness of greater than or equal to 10 nm, preferably greater than or equal to 20 nm, further preferably greater than or equal to 40 nm, and still further preferably greater than or equal to 60 nm. When the thickness of the semiconductor layer 101a is made large, a distance from an interface between the adjacent insulator and the semiconductor layer 101a to the semiconductor layer 101b in which a channel is formed can be large. Since the productivity of the semiconductor device might be decreased, the semiconductor layer 101a has a region with a thickness of, for example, less than or equal to 200 nm, preferably less than or equal to 120 nm, more preferably less than or equal to 80 nm.

When an oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancy increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancy therein is filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$, particularly preferably lower than $8\times10^{11}/cm^3$, still further preferably lower than $1\times10^{13}/cm^3$, yet further preferably lower than $1\times10^{10}/cm^3$, and is $1\times10^{-9}/cm^3$ or higher.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor. Examples of a non-single-crystal oxide semiconductor film include a c-axis aligned crystalline oxide semiconductor (CAAC-OS) film, a polycrystalline oxide semiconductor film, a microcrystalline oxide semiconductor film, and an amorphous oxide semiconductor film. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described. Note that a CAAC-OS can be referred to as an oxide semiconductor including c-axis aligned nanocrystals (CANC).

The CAAC-OS film is an oxide semiconductor film having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of pellets can be observed. However, in the high-resolution TEM image, a boundary between pellets, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Figure 19A:
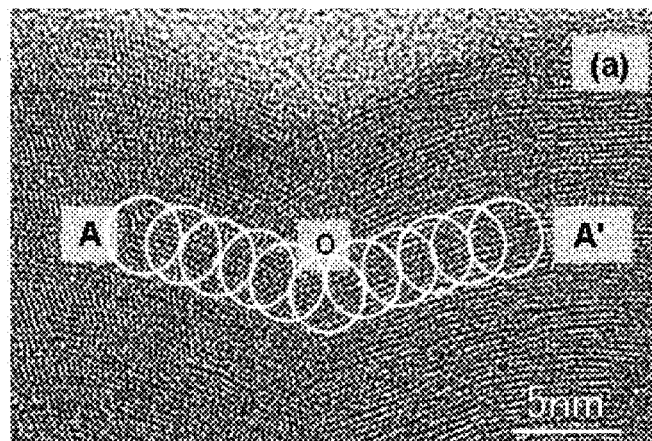
FIGS. 19A to 19C are cross-sectional TEM images and a local Fourier transform image of an oxide semiconductor.
Figure 19B:
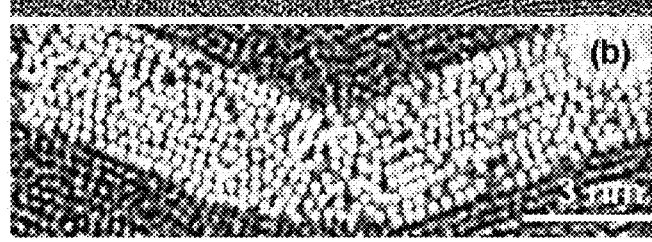

FIG. 19A is a cross-sectional TEM image of a CAAC-OS film. FIG. 19B is a cross-sectional TEM image obtained by enlarging the image of FIG. 19A. In FIG. 19B, atomic arrangement is highlighted for easy understanding.

Figure 19C:
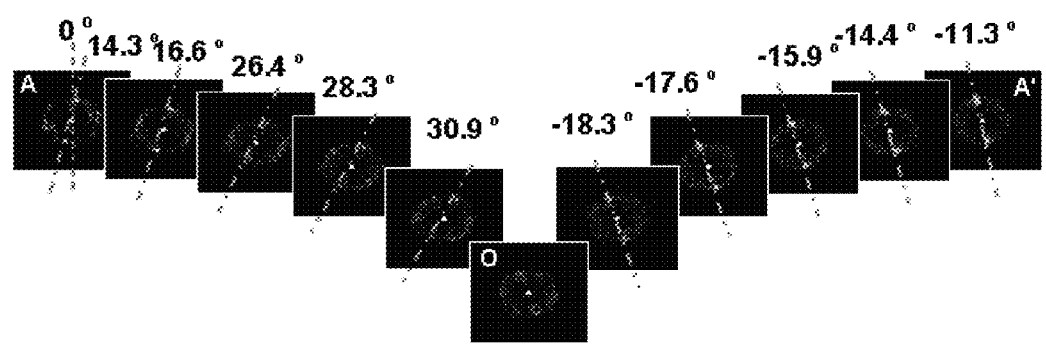

FIG. 19C is Fourier transform images of regions each surrounded by a circle (the diameter is about 4 nm) between A and O and between O and A' in FIG. 19A. C-axis alignment can be observed in each region in FIG. 19C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Figure 20A:
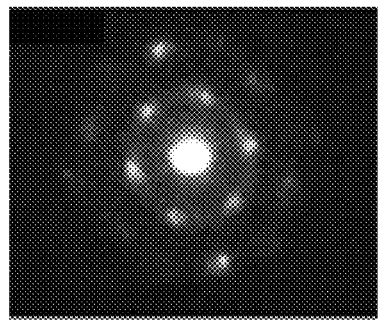
FIGS. 20A and 20B show nanobeam electron diffraction patterns of oxide semiconductor films and FIGS. 20C and 20D illustrate an example of a transmission electron diffraction measurement apparatus.

Note that in an electron diffraction pattern of the CAAC-OS film, spots (bright spots) having alignment are shown. For example, when electron diffraction with an electron beam having a diameter of, for example, 1 nm or more and 30 nm or less (such electron diffraction is also referred to as nanobeam electron diffraction) is performed on the top surface of the CAAC-OS film, the spots are observed (see FIG. 20A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Figure 36A:
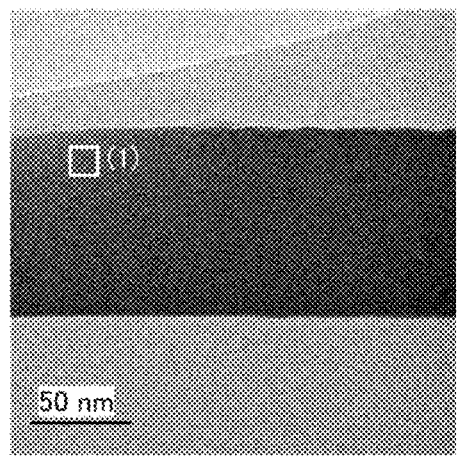
FIGS. 36A to 36D are Cs-corrected high-resolution TEM images of a cross section of a CAAC-OS and a cross-sectional schematic view of a CAAC-OS.

FIG. 36A shows an example of a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 36B:
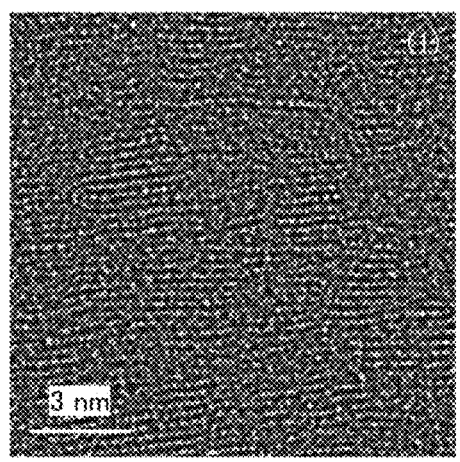

FIG. 36B is an enlarged Cs-corrected high-resolution TEM image of a region (1) in FIG. 36A. FIG. 36B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 36C:
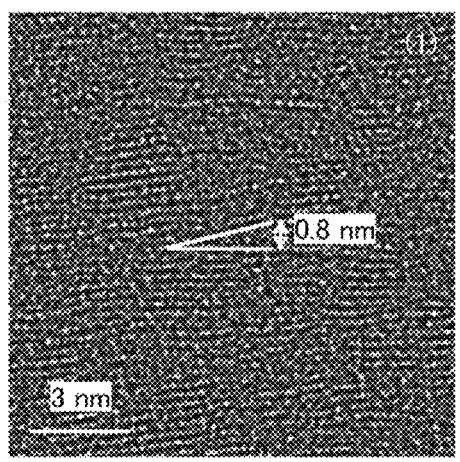

As shown in FIG. 36B, the CAAC-OS has a characteristic atomic arrangement. The characteristic atomic arrangement is denoted by an auxiliary line in FIG. 36C. FIGS. 36B and 36C prove that the size of a pellet is approximately 1 nm to 3 nm, and the size of a space caused by tilt of the pellets is approximately 0.8 nm. Therefore, the pellet can also be referred to as a nanocrystal (nc).

Figure 36D:
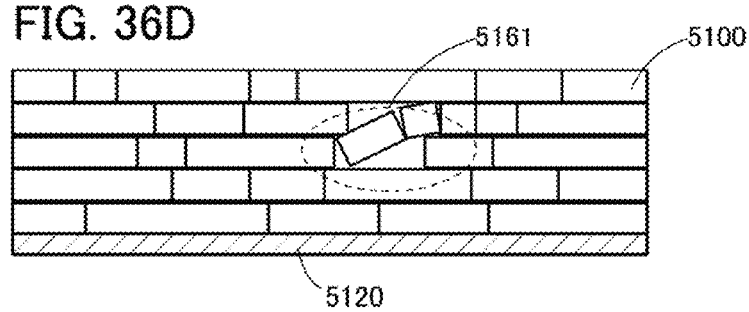

Here, according to the Cs-corrected high-resolution TEM images, the schematic arrangement of pellets 5100 of a CAAC-OS over a substrate 5120 is illustrated by such a structure in which bricks or blocks are stacked (see FIG. 36D). The part in which the pellets are tilted as observed in FIG. 36C corresponds to a region 5161 shown in FIG. 36D.

Figure 37A:
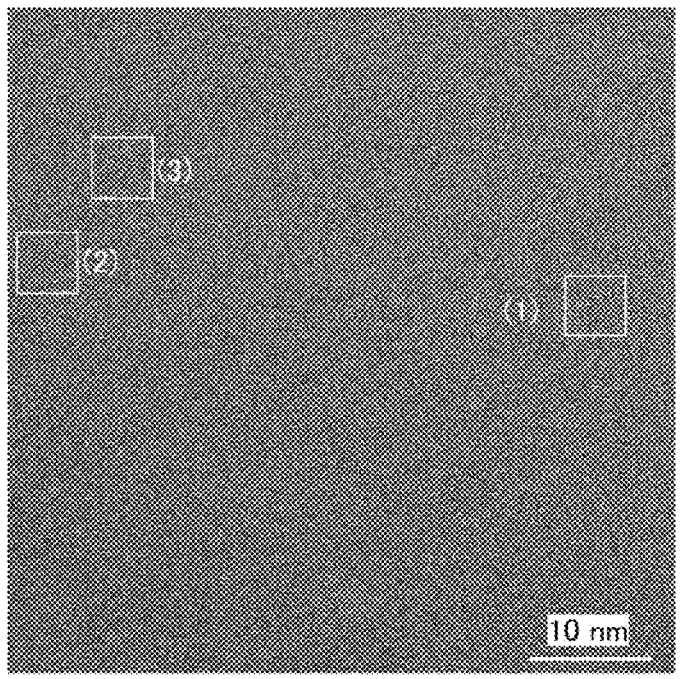
FIGS. 37A to 37D are Cs-corrected high-resolution TEM images of a plane of a CAAC-OS.
Figure 37B:
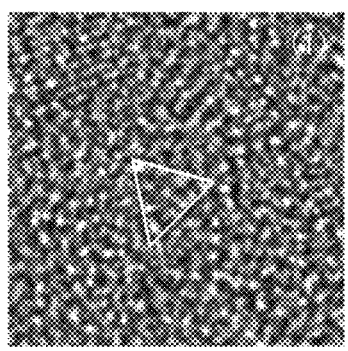
Figure 37C:
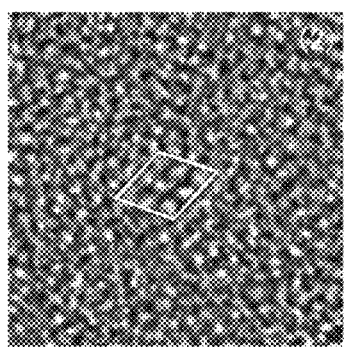
Figure 37D:
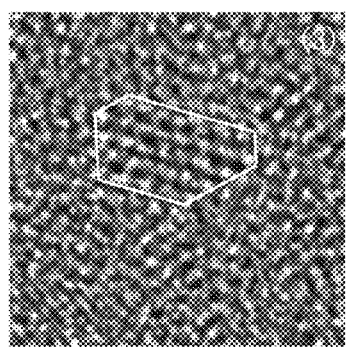

FIG. 37A shows a Cs-corrected high-resolution TEM image of a plane of the CAAC-OS observed from a direction substantially perpendicular to the sample surface. FIGS. 37B, 37C, and 37D are enlarged Cs-corrected high-resolution TEM images of regions (1), (2), and (3) in FIG. 37A, respectively. FIGS. 37B, 37C, and 37D indicate that metal atoms are arranged in a triangular, quadrangular, or hexagonal configuration in a pellet. However, there is no regularity of arrangement of metal atoms between different pellets.

Figure 38A:
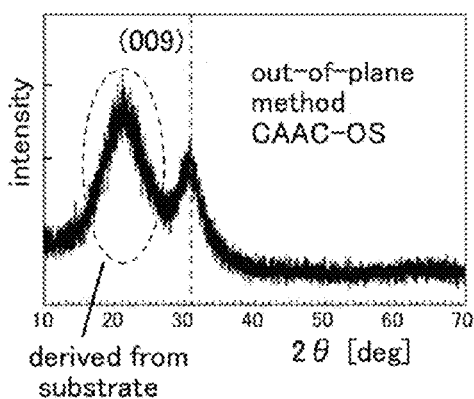
FIGS. 38A to 38C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 38A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 38B:
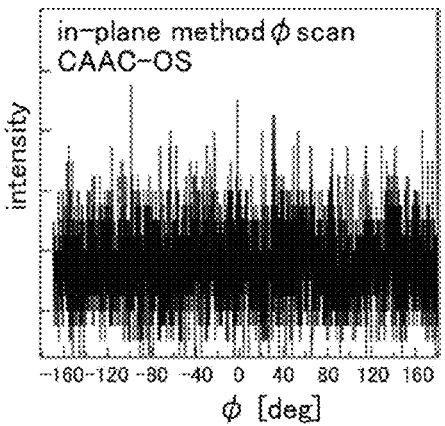
Figure 38C:
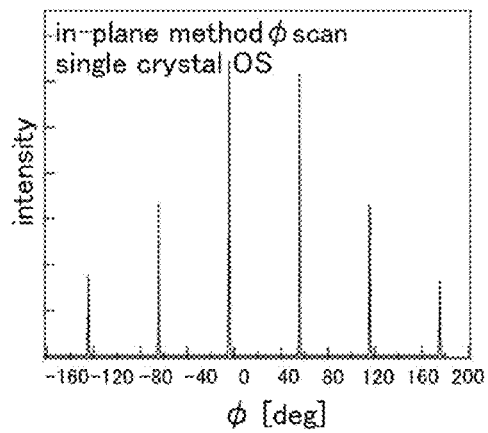

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (ϕ scan) is performed with 2θ fixed at around 56° and with the sample rotated using a normal vector of the sample surface as an axis (ϕ axis), as shown in FIG. 38B, a peak is not clearly observed. In contrast, in the case of a single crystal oxide semiconductor of $InGaZnO_4$, when ϕ scan is performed with 2θ fixed at around 56°, as shown in FIG. 38C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 39A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 39B shows a diffraction pattern obtained in such a manner that an electron beam with a probe diameter of 300 nm is incident on the same sample in a direction perpendicular to the sample surface. As shown in FIG. 39B, a ring-like diffraction pattern is observed. Thus, the electron diffraction also indicates that the a-axes and b-axes of the pellets included in the CAAC-OS do not have regular alignment. The first ring in FIG. 39B is considered to be derived from the (010) plane, the (100) plane, and the like of the $InGaZnO_4$ crystal. The second ring in FIG. 39B is considered to be derived from the (110) plane and the like.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases. Note that there is a possibility that the origin of the nanocrystal is the same as that of a pellet in a CAAC-OS. Therefore, a crystal part of the nc-OS may be referred to as a pellet in the following description.

Figure 20B:
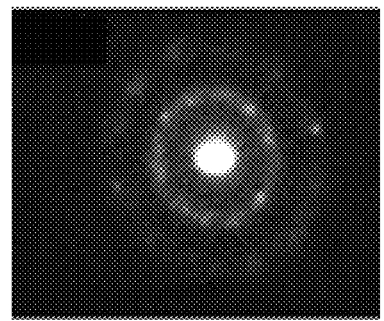

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than the size of a crystal part (pellet), a peak that shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS film when an electron beam having a probe diameter close to or smaller than the size of a pellet is applied. Further, in a nanobeam electron diffraction pattern of the nc-OS film, regions with high luminance in a circular (ring) pattern are shown in some cases. Also in a nanobeam electron diffraction pattern of the nc-OS layer, a plurality of spots is shown in a ring-like region in some cases (see FIG. 20B).

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The a-like OS has an unstable structure because it includes a void. To verify that an a-like OS has an unstable structure as compared with a CAAC-OS and an nc-OS, a change in structure caused by electron irradiation is described below.

An a-like OS (Sample A), an nc-OS (Sample B), and a CAAC-OS (Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 40:
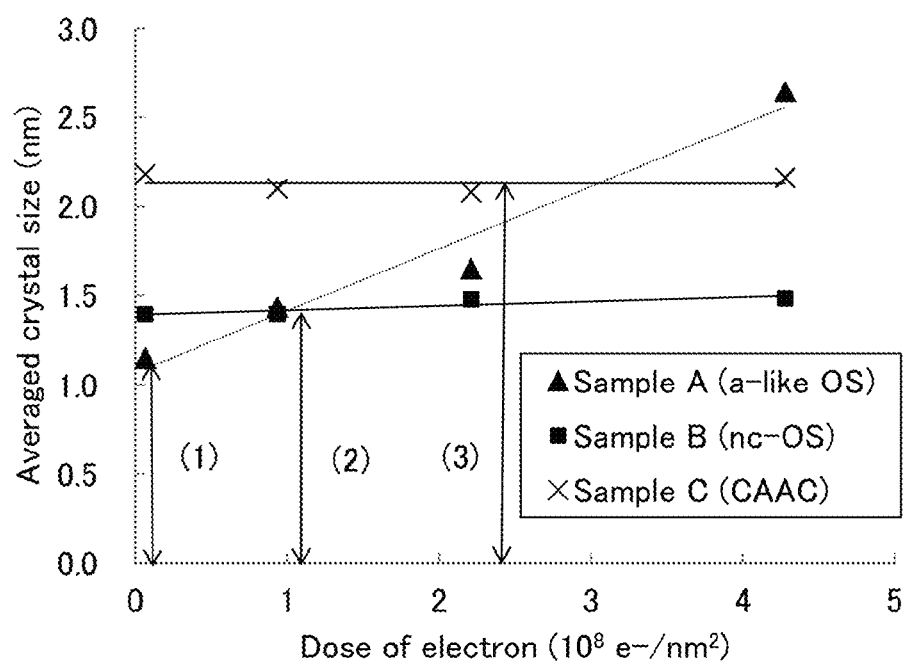
FIG. 40 shows a change in crystal part of an In—Ga—Zn oxide induced by electron irradiation.

FIG. 40 shows change in the average size of crystal parts (at 22 points to 45 points) in each sample. Note that the crystal part size corresponds to the length of a lattice fringe. FIG. 40 indicates that the crystal part size in the a-like OS increases with an increase in the cumulative electron dose. Specifically, as shown by (1) in FIG. 40, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. Specifically, as shown by (2) and (3) in FIG. 40, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

<Deposition Model>

Examples of deposition models of a CAAC-OS and an nc-OS are described below.

Figure 41A:
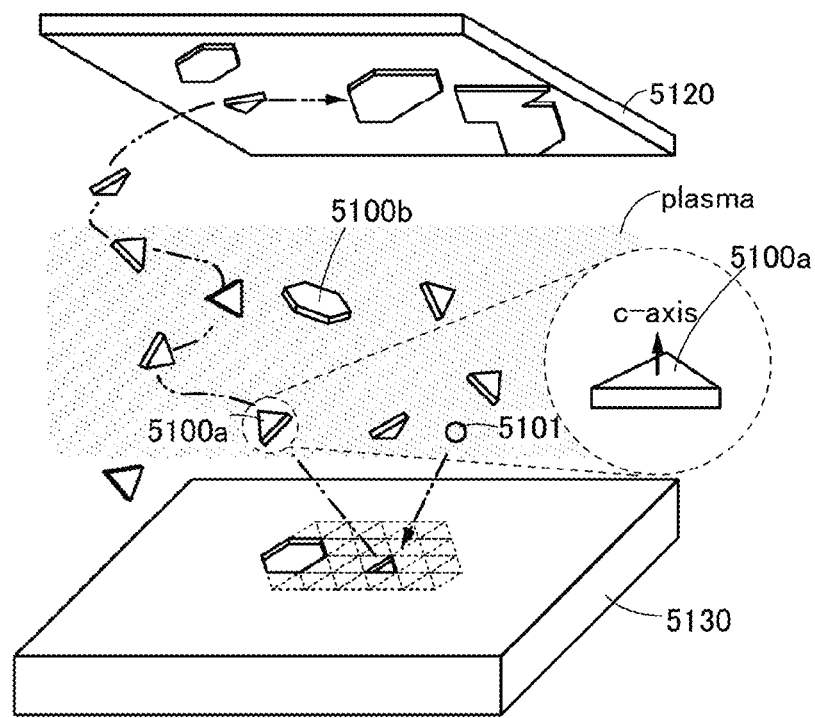
FIGS. 41A and 41B are schematic views showing deposition models of a CAAC-OS and an nc-OS.

FIG. 41A is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition speed is increased by utilizing a magnetic field of magnets is referred to as a magnetron sputtering method.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 42A:
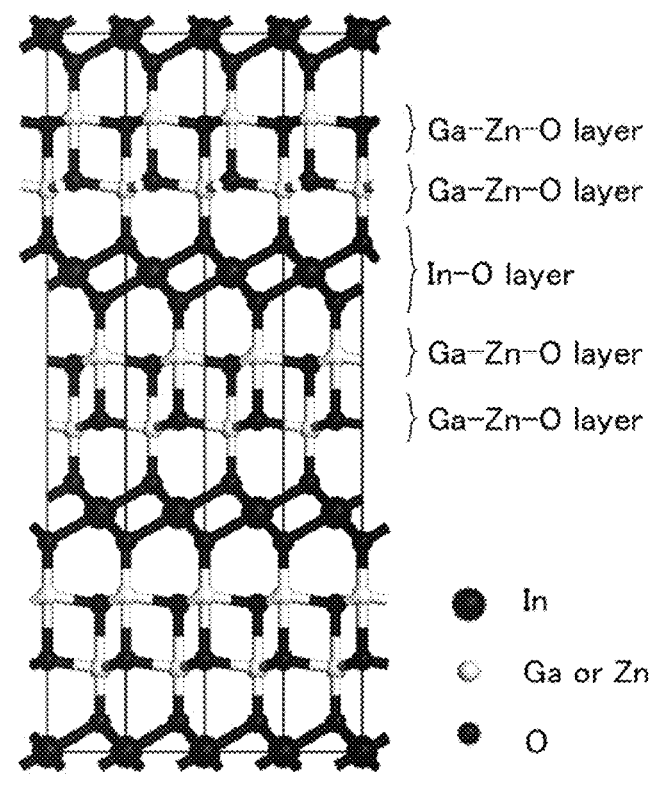
FIGS. 42A to 42C show an $InGaZnO_4$ crystal and a pellet.

Here, the target 5130 has a polycrystalline structure which includes a plurality of crystal grains and in which a cleavage plane exists in at least one crystal grain. FIG. 42A shows a structure of an $InGaZnO_4$ crystal included in the target 5130 as an example. Note that FIG. 42A shows a structure of the case where the $InGaZnO_4$ crystal is observed from a direction parallel to the b-axis when the c-axis is in an upward direction. FIG. 42A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 42B:
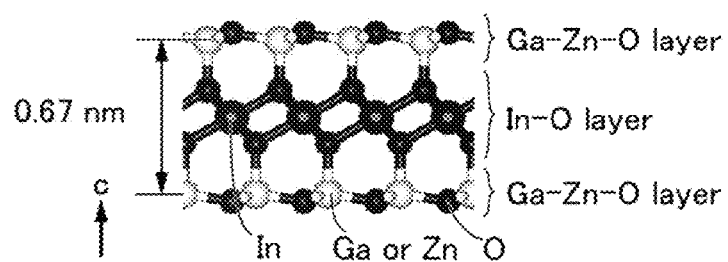
Figure 42C:
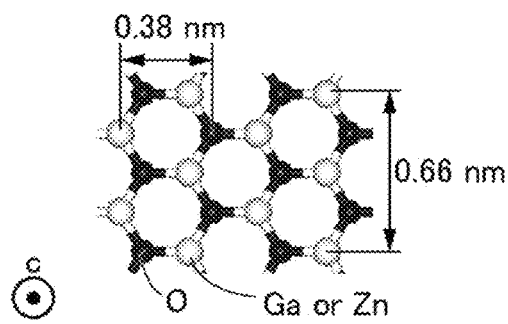

The thickness of the pellet 5100 is determined depending on the kind of deposition gas and the like. The thicknesses of the pellets 5100 are preferably uniform; the reasons thereof are described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 40. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 42B is separated. Note that FIG. 42C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 40 corresponds to the amount of growth in plasma. Here, in the case where the temperature of the substrate 5120 is at around room temperature, the pellet 5100 on the substrate 5120 hardly grows; thus, an nc-OS is formed (see FIG. 41B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 41B:
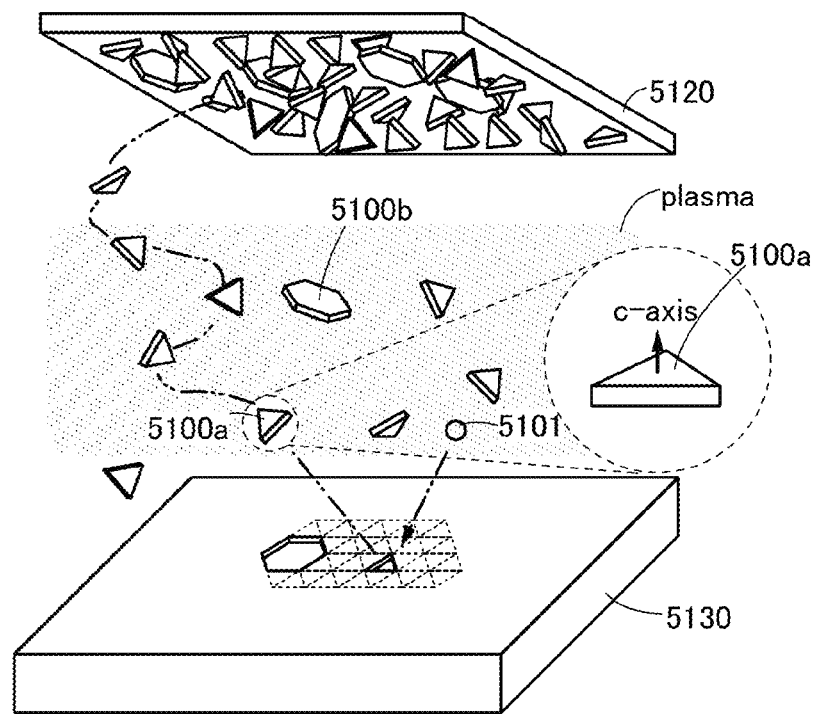

As shown in FIGS. 41A and 41B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 41A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where the flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancy in a CAAC-OS is filled in some cases; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 43A to 43D are cross-sectional schematic views.

Figure 43A:
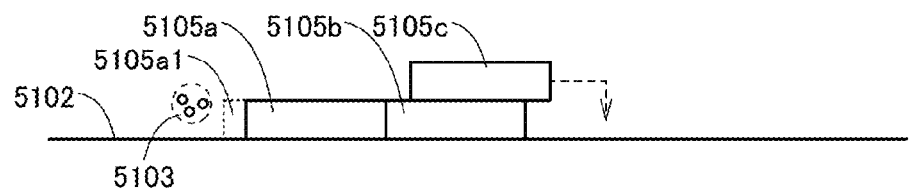
FIGS. 43A to 43D are schematic views showing a deposition model of a CAAC-OS.

As illustrated in FIG. 43A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 43B:
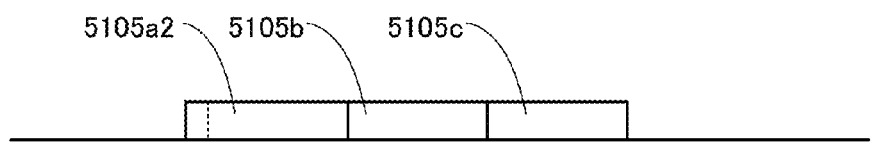

Then, as illustrated in FIG. 43B, the region 5105a1 grows to part of the pellet 5105a to form a pellet 5105a2. In addition, a side surface of the pellet 5105c is in contact with another side surface of the pellet 5105b.

Figure 43C:
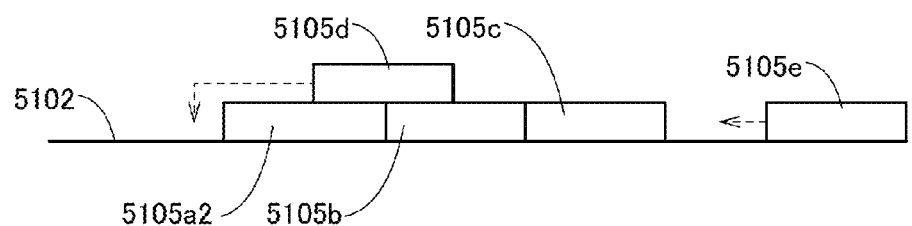

Next, as illustrated in FIG. 43C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 43D:
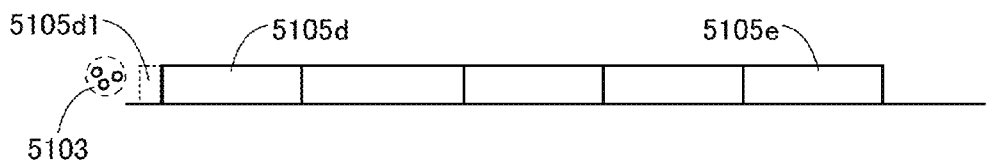

Then, as illustrated in FIG. 43D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 40 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed.

Since the CAAC-OS film is deposited in accordance with such a model, the sputtered particle preferably has a pellet shape with a small thickness. Note that when the sputtered particles has a dice shape with a large thickness, planes facing the substrate 5120 vary, which may lead to formation of a film whose thickness or crystal alignment is not uniformed.

According to the deposition model described above, a CAAC-OS with high crystallinity can be formed even on a film formation surface with an amorphous structure.

In the case where the oxide semiconductor film has a plurality of structures, the structures can be analyzed using nanobeam electron diffraction in some cases.

Figure 20C:
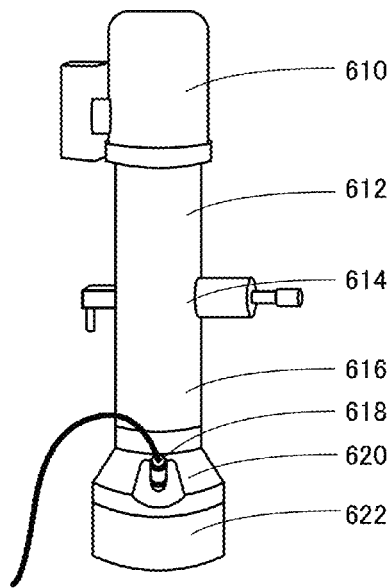

FIG. 20C illustrates a transmission electron diffraction measurement apparatus that includes an electron gun chamber 610, an optical system 612 below the electron gun chamber 610, a sample chamber 614 below the optical system 612, an optical system 616 below the sample chamber 614, an observation chamber 620 below the optical system 616, a camera 618 installed in the observation chamber 620, and a film chamber 622 below the observation chamber 620. The camera 618 is provided to face the inside of the observation chamber 620. Note that the film chamber 622 is not necessarily provided.

Figure 20D:
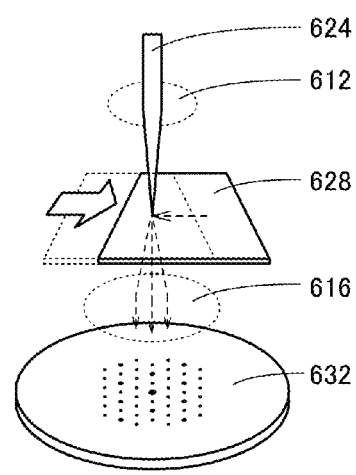

FIG. 20D illustrates an internal structure of the transmission electron diffraction measurement apparatus illustrated in FIG. 20C. In the transmission electron diffraction measurement apparatus, a substance 628 provided in the sample chamber 614 is irradiated with electrons ejected from an electron gun provided in the electron gun chamber 610 through the optical system 612. The electrons that have passed through the substance 628 enter a fluorescent plate 632 provided in the observation chamber 620 through the optical system 616. On the fluorescent plate 632, a pattern corresponding to the intensity of entered electron appears, which allows measurement of a transmission electron diffraction pattern.

The camera 618 is set toward the fluorescent plate 632 so that a pattern on the fluorescent plate 632 can be taken. An angle formed by a straight line that passes through the center of a lens of the camera 618 and the center of the fluorescent plate 632 and an upper surface of the fluorescent plate 632 is, for example, 15° or more and 80° or less, 30° or more and 75° or less, or 45° or more and 70° or less. As the angle is reduced, distortion of the transmission electron diffraction pattern taken by the camera 618 becomes larger. Note that if the angle is obtained in advance, the distortion of an obtained transmission electron diffraction pattern can be corrected. Note that the film chamber 622 may be provided with the camera 618. For example, the camera 618 may be set in the film chamber 622 so as to be opposite to the incident direction of electrons 624. In this case, a transmission electron diffraction pattern with less distortion can be taken from the rear surface of the fluorescent plate 632.

A holder for fixing the substance 628 that is a sample is provided in the sample chamber 614. The holder transmits electrons passing through the substance 628. The holder may have, for example, a function of moving the substance 628 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 628.

Then, a method for measuring a transmission electron diffraction pattern of a substance by the transmission electron diffraction measurement apparatus described above will be described.

For example, changes in the structure of a substance can be observed by changing the irradiation position of the electrons 624 that are a nanobeam in the substance (or by scanning), as illustrated in FIG. 20D. At this time, when the substance 628 is a CAAC-OS film, a diffraction pattern shown in FIG. 20A can be observed. When the substance 628 is an nc-OS film, a diffraction pattern shown in FIG. 20B can be observed.

Even when the substance 628 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region other than that of the CAAC region is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 21A:
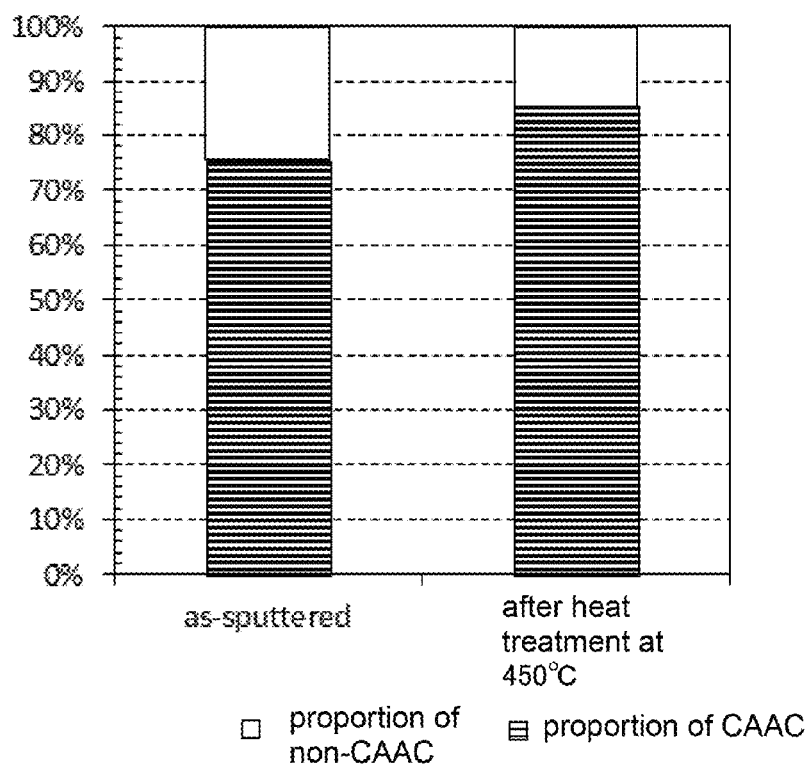
FIG. 21A shows an example of structural analysis by transmission electron diffraction measurement and FIGS. 21B and 21C show plan-view TEM images.

FIG. 21A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 21B:
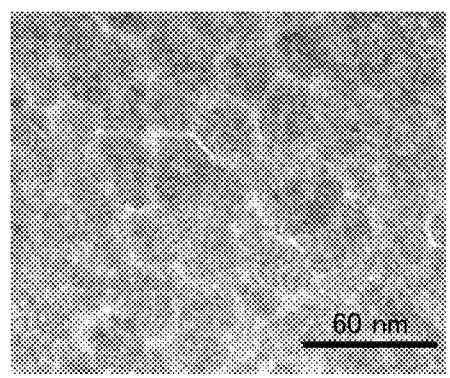
Figure 21C:
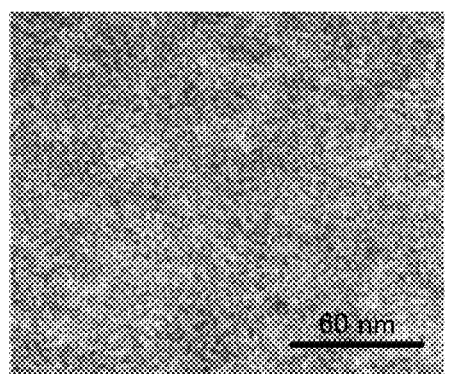

FIGS. 21B and 21C are planar TEM images of the CAAC-OS film obtained just after the deposition and the CAAC-OS film subjected to the heat treatment at 450° C., respectively. Comparison between FIGS. 21B and 21C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

The CAAC-OS film is formed, for example, by the following method.

For example, the CAAC-OS film is formed by a sputtering method using a polycrystalline oxide semiconductor sputtering target. As a sputtering method, an RF sputtering method, a DC sputtering method, an AC sputtering method, or the like can be used. To improve uniformity of film thickness of the oxide semiconductor film, film composition, and crystallinity, a DC sputtering method or an AC sputtering method is preferably used rather than an RF sputtering method.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like or pellet-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancy in the first oxide semiconductor film. In such a case, the heat treatment in an oxidation atmosphere can reduce the oxygen vacancy. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancy in the second oxide semiconductor film. In such a case, the heat treatment in an oxidation atmosphere can reduce the oxygen vacancy. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed.

At least part of this embodiment can be implemented in combination with any of the embodiments described in this specification as appropriate.

(Embodiment 3)

In this embodiment, an example of a circuit including the transistor of one embodiment of the present invention is described with reference to drawings.

[Circuit Configuration Example]

When a connection between transistors, wirings, or electrodes is changed from that described in Embodiment 1, a variety of circuits can be formed. Examples of circuit configurations that can be achieved by using a semiconductor device of one embodiment of the present invention are shown below.

[CMOS Circuit]

Figure 22A:
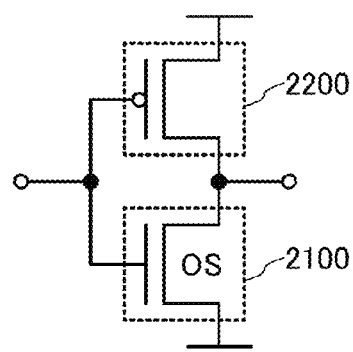
FIGS. 22A to 22D are circuit diagrams of an embodiment of the present invention.

A circuit diagram in FIG. 22A shows a configuration of a so-called CMOS circuit in which a p-channel transistor 2200 and an n-channel transistor 2100 are connected to each other in series and in which gates of them are connected to each other. Note that transistors including a second semiconductor material are denoted by "OS" in drawings.

[Analog Switch]

Figure 22B:
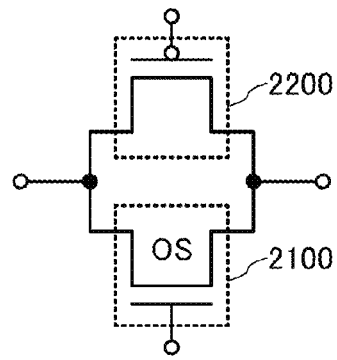

A circuit diagram in FIG. 22B shows a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 22C:
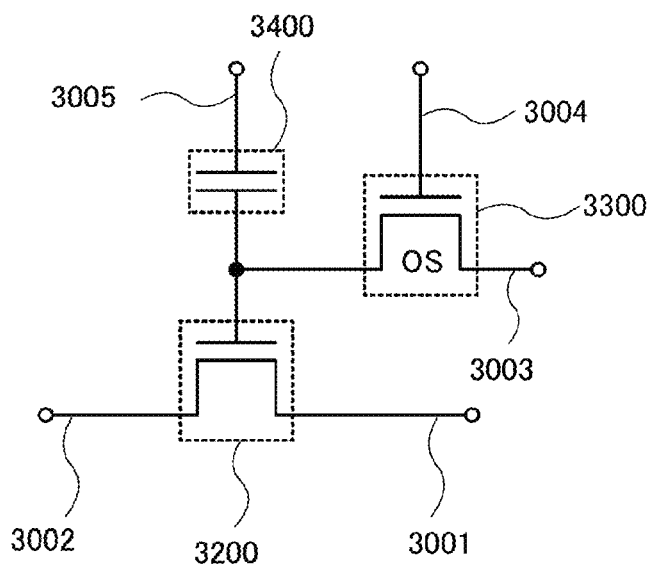

An example of a semiconductor device (memory device) that includes the transistor of one embodiment of the present invention, can retain stored data even when not powered, and has an unlimited number of write cycles is shown in FIG. 22C.

The semiconductor device illustrated in FIG. 22C includes a transistor 3200 using a first semiconductor material, a transistor 3300 including the second semiconductor material, and a capacitor 3400. Note that the transistor described in the above embodiment can be used as the transistor 3300.

In this embodiment, for example, the transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 22C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to the gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 22C has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0 (>V_{th\_H})$, the transistor 3200 is turned on. In the case where the low-level charge is supplied to the gate electrode of the transistor 3200 in writing, even when the potential of the fifth wiring 3005 is $V_0 (<V_{th\_L})$, the transistor 3200 remains off. Thus, the data retained in the gate electrode of the transistor 3200 can be read by determining the potential of the second wiring 3002.

Note that in the case where memory cells are arrayed, only data of desired memory cells need to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 22D:
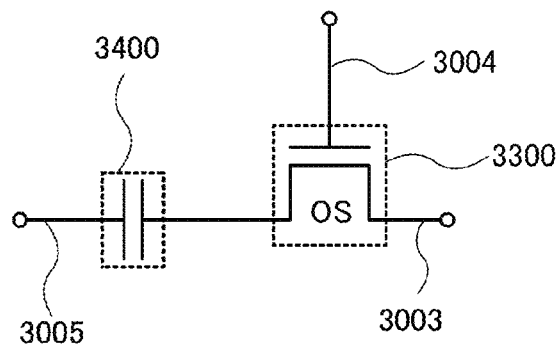

The semiconductor device illustrated in FIG. 22D is mainly different from the semiconductor device illustrated in FIG. 22C in that the transistor 3200 is not provided. Also in this case, writing and retaining operation of data can be performed in a manner similar to that of the semiconductor device illustrated in FIG. 22C.

Next, reading of data is described. When the transistor 3300 is turned on, the third wiring 3003 in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400.

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1 (= (C_B \times V_{B0} + C \times V_1)/(C_B + C))$ is higher than the potential of the third wiring 3003 in the case of retaining the potential $V_0 (= (C_B \times V_{B0} + C \times V_0)/(C_B + C))$.

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor having a channel formation region formed including an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

(Embodiment 4)

Figure 29:
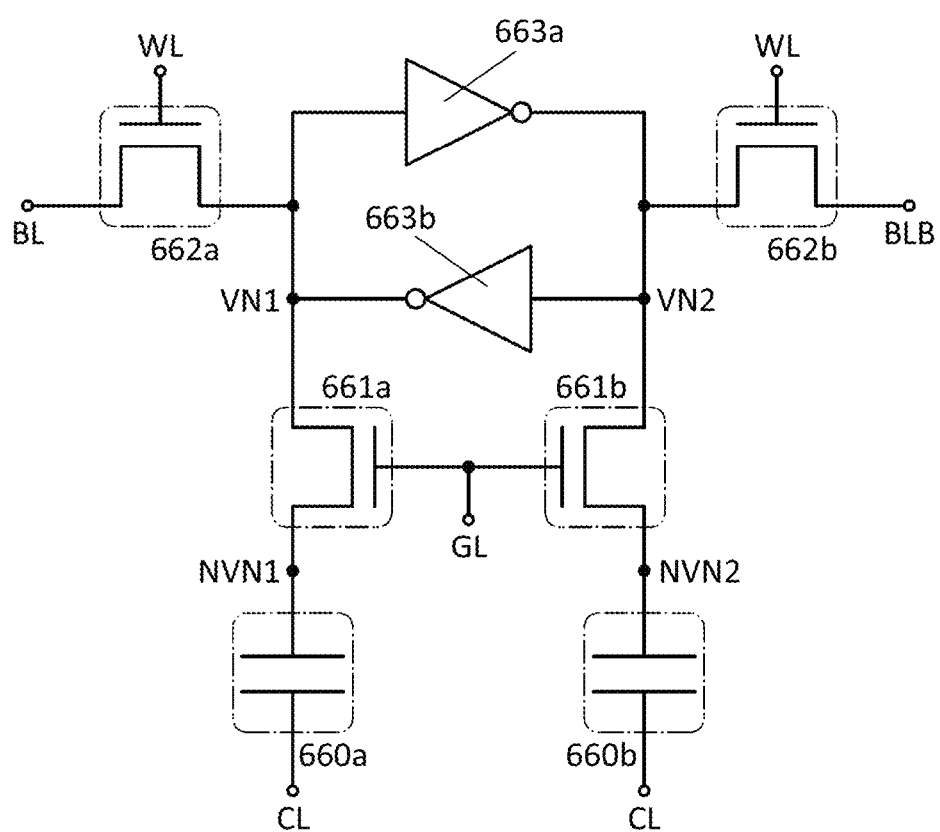
FIG. 29 is a circuit diagram illustrating an example of a semiconductor device of one embodiment of the present invention.

In this embodiment, an example of a semiconductor device including a transistor of one embodiment of the present invention is described with reference to drawings. FIG. 29 is an example of a circuit diagram of a semiconductor device of one embodiment of the present invention.

The semiconductor device in FIG. 29 includes a capacitor 660a, a capacitor 660b, a transistor 661a, a transistor 661b, a transistor 662a, a transistor 662b, an inverter 663a, an inverter 663b, a wiring BL, a wiring BLB, a wiring WL, a wiring CL, and a wiring GL.

The semiconductor device in FIG. 29 is a memory cell in which the inverter 663a and the inverter 663b are connected in a ring to form a flip-flop. A node to which an output signal of the inverter 663b is output is a node VN1, and a node to which an output signal of the inverter 663a is output is a node VN2. The memory cells are provided in a matrix, whereby a memory device (memory cell array) can be formed.

One of a source and a drain of the transistor 662a is electrically connected to the wiring BL, the other of the source and the drain thereof is electrically connected to the node VN1, and a gate thereof is electrically connected to the wiring WL. One of a source and a drain of the transistor 662b is electrically connected to the node VN2, the other of the source and the drain thereof is electrically connected to the wiring BLB, and a gate thereof is electrically connected to the wiring WL.

One of a source and a drain of the transistor 661a is electrically connected to the node VN1, the other of the source and the drain thereof is electrically connected to one of electrodes of the capacitor 660a, and a gate thereof is electrically connected to the wiring GL. A node between the other of the source and the drain of the transistor 661a and the one of electrodes of the capacitor 660a is a node NVN1. One of a source and a drain of the transistor 661b is electrically connected to the node VN2, the other of the source and the drain thereof is electrically connected to one of electrodes of the capacitor 660b, and a gate thereof is electrically connected to the wiring GL. A node between the other of the source and the drain of the transistor 661b and the one of electrodes of the capacitor 660b is a node NVN2.

The other of electrodes of the capacitor 660a is electrically connected to the wiring CL. The other of electrodes of the capacitor 660b is electrically connected to the wiring CL.

Conduction and non-conduction states of the transistor 662a and the transistor 662b can be controlled by a potential supplied to the wiring WL. Conduction and non-conduction states of the transistor 661a and the transistor 661b can be controlled by a potential supplied to the wiring GL.

Writing, retaining, and reading operations of the memory cell illustrated in FIG. 29 are described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 662a and 662b is applied to the wiring WL.

Next, the potential of the wiring WL is set to be lower than the threshold voltage of the transistors 662a and 662b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 662a and the inverter 663a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 662a and 662b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 662b and the inverter 663b to be a ground potential. The potential difference between the wiring BL and the wiring BLB is amplified by the sense amplifier, so that the retained data 0 can be read.

Accordingly, the semiconductor device in FIG. 29 serves as a so-called static random access memory (SRAM). An SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 29, data of the node VN1 can be written to the node NVN1 through the transistor 661a. Similarly, data of the node VN2 can be written to the node NVN2 through the transistor 661b. The written data is retained by turning off the transistor 661a or the transistor 661b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 29 can retain data even after supply of a power supply potential is stopped. Therefore, power consumption of the semiconductor device can be reduced by appropriately supplying or stopping a power supply potential. For example, the semiconductor device in FIG. 29 is used in a memory region of a CPU, whereby power consumption of the CPU can be reduced.

Note that the length of a period during which data is retained in the node NVN1 and the node NVN2 depends on the off-state current of the transistor 661a and the transistor 661b. Therefore, a transistor with small off-state current is preferably used as each of the transistor 661a and the transistor 661b in order to retain data for a long time. Alternatively, the capacitance of the capacitor 660a and the capacitor 660b is preferably increased.

For example, the transistor 100 and the capacitor 150 described in Embodiment 1 are used as the transistor 661a and the capacitor 660a, whereby data can be retained in the node NVN1 for a long time. Similarly, the transistor 100 and the capacitor 150 are used as the transistor 661b and the capacitor 660b, whereby data can be retained in the node NVN2 for a long time. Accordingly, the description of the transistor 100 is referred to for the transistor 661a and the transistor 661b. Furthermore, the description of the capacitor 150 is referred to for the capacitor 660a and the capacitor 660b.

As described in the above embodiment, when the plug 121 and the plug 122 are used in the transistor 100, the area occupied by the elements including the transistor 100 and the capacitor 150 can be reduced. The transistor 100 or the capacitor 150 described in the above embodiment can be used as, the transistor 661a, the transistor 661b, the capacitor 660a, and the capacitor 660b in FIG. 29. Accordingly, the semiconductor device in FIG. 29 can be formed without a significant increase in an occupation area in some cases as compared to a conventional SRAM. The description of the transistor 130 is referred to for the transistor 662a, the transistor 662b, the transistor included in the inverter 663a, and the transistor included in the inverter 663b.

As described above, the semiconductor device of one embodiment of the present invention has high performance for an occupation area. Furthermore, the semiconductor device can be manufactured with high productivity.

This embodiment can be combined as appropriate with any of the other embodiments in this specification.

(Embodiment 5)

In this embodiment, an RF tag that includes the transistor described in the above embodiment or the memory device described in the above embodiment is described with reference to FIG. 23.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF device is required to have extremely high reliability in order to be used for this purpose. Here, the RF tag may be an RFID tag which recognizes identification information called ID that is given to an article.

A configuration of the RF tag is described with reference to FIG. 23. FIG. 23 is a block diagram illustrating a configuration example of an RF tag.

Figure 23:
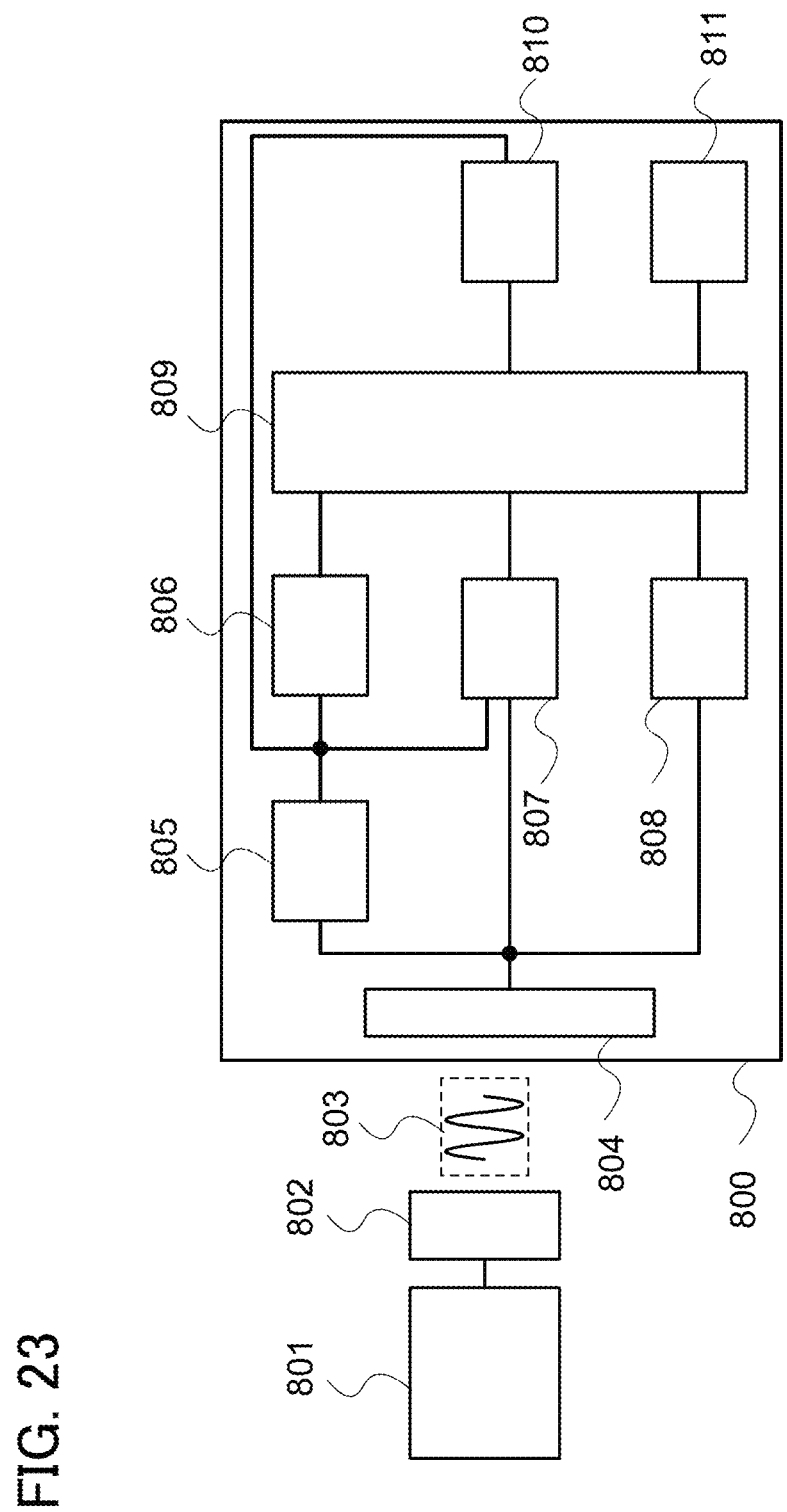
FIG. 23 illustrates an example of a configuration of an RF tag of one embodiment.

As shown in FIG. 23, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

(Embodiment 6)

In this embodiment, a CPU in which at least the transistor described in any of the above embodiments can be used and the memory device described in the above embodiment is included is described.

Figure 24:
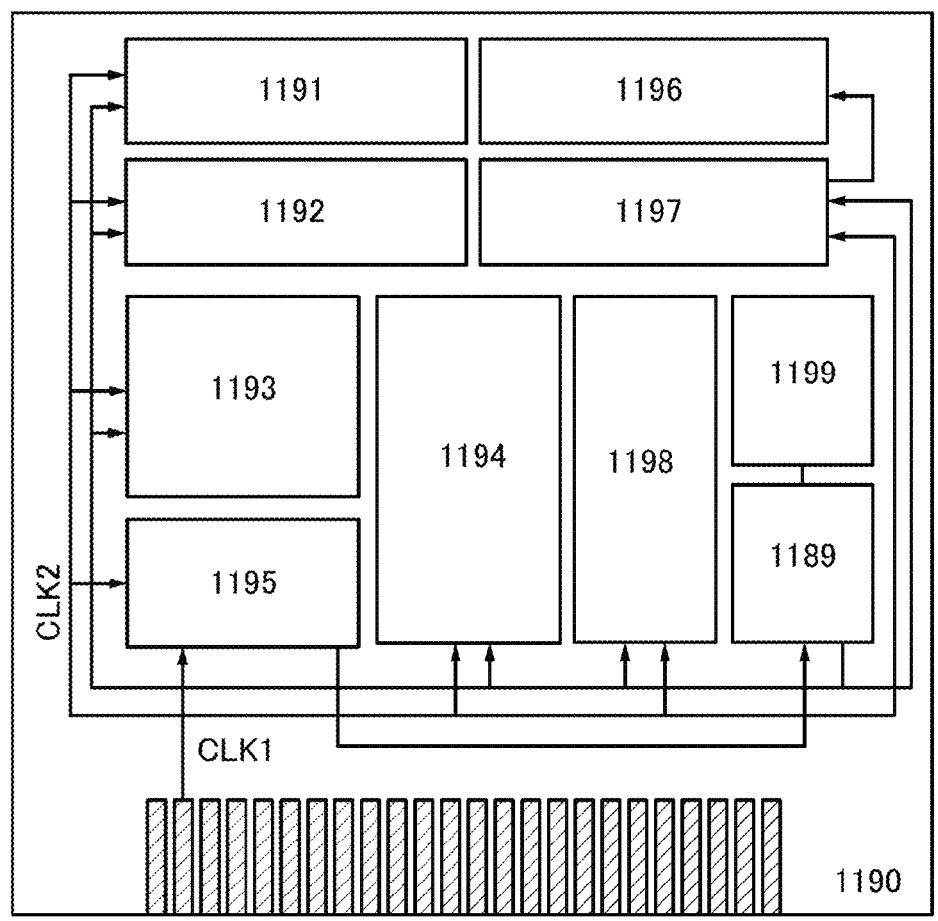
FIG. 24 illustrates a structure example of a CPU of an embodiment.

FIG. 24 is a block diagram illustrating a configuration example of a CPU at least partly including any of the transistors described in the above embodiments as a component.

The CPU illustrated in FIG. 24 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip.

Needless to say, the CPU in FIG. 24 is just an example in which the configuration is simplified, and an actual CPU may have a variety of configurations depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 24, a memory cell is provided in the register 1196. For the memory cell of the register 1196, any of the transistors described in the above embodiments can be used.

In the CPU illustrated in FIG. 24, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 25:
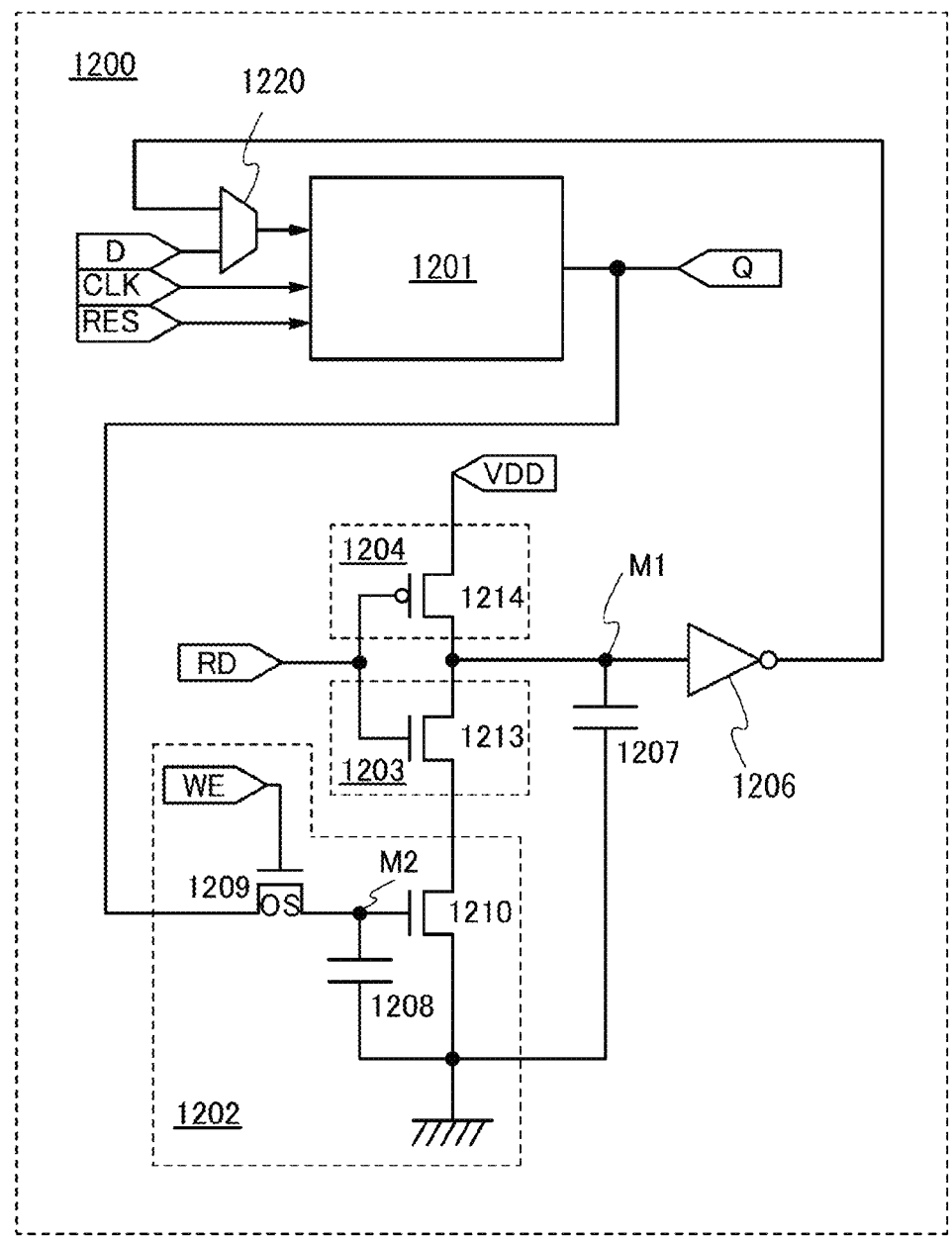
FIG. 25 is a circuit diagram of a memory element of an embodiment.

FIG. 25 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed. The transistor 1209 is preferably a transistor in which a channel is formed in an oxide semiconductor layer.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 25 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 25, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 25, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 25, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

(Embodiment 7)

In this embodiment, a structure example of a display panel of one embodiment of the present invention is described.

[Structure Example]

Figure 26A:
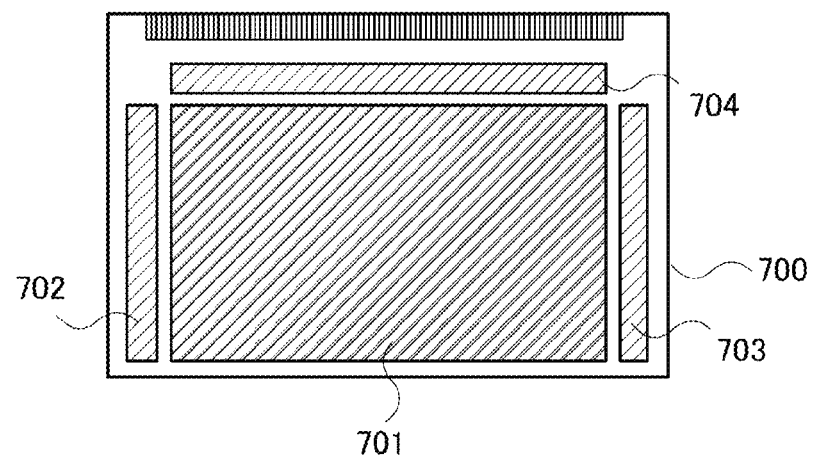
FIGS. 26A to 26C are a top view and circuit diagrams of a display device of an embodiment.
Figure 26B:
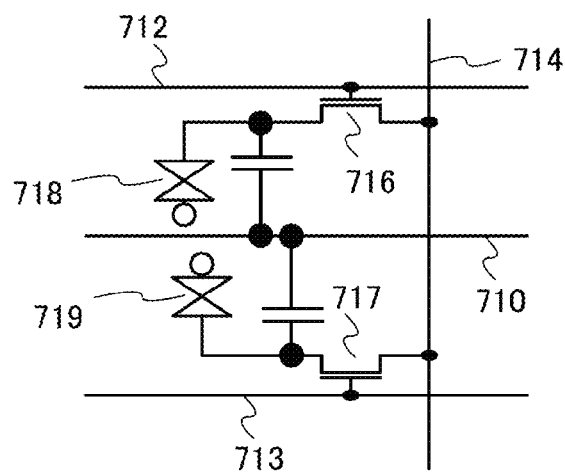
Figure 26C:
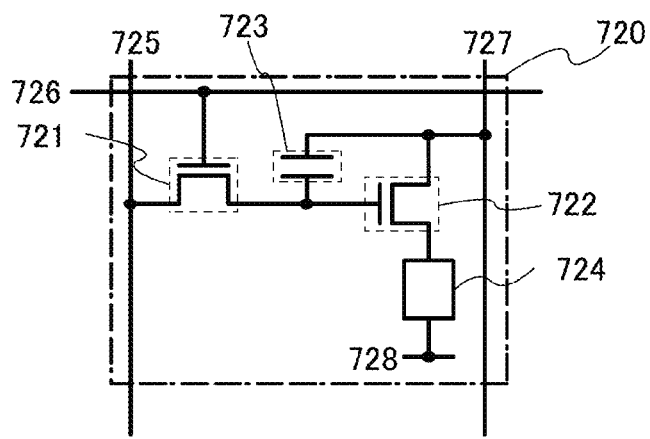

FIG. 26A is a top view of the display panel of one embodiment of the present invention. FIG. 26B is a circuit diagram illustrating a pixel circuit that can be used in the case where a liquid crystal element is used in a pixel in the display panel of one embodiment of the present invention. FIG. 26C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 26A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 26A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 26B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor 100 described the above embodiment can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 26B. For example, a switch, a resistor, a capacitor, a transistor, a sensor, a logic circuit, or the like may be added to the pixel shown in FIG. 26B.

[Organic EL Panel]

FIG. 26C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 26C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor 100 described in the above embodiment can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, voltage greater than or equal to voltage that is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 26C. For example, a switch, a resistor, a capacitor, a sensor, a transistor, a logic circuit, or the like may be added to the pixel circuit shown in FIG. 26C.

In the case where the transistor described in the above embodiments is used for the circuit shown in FIGS. 26A to 26C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

(Embodiment 8)

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 27A to 27F illustrate specific examples of these electronic appliances.

Figure 27A:
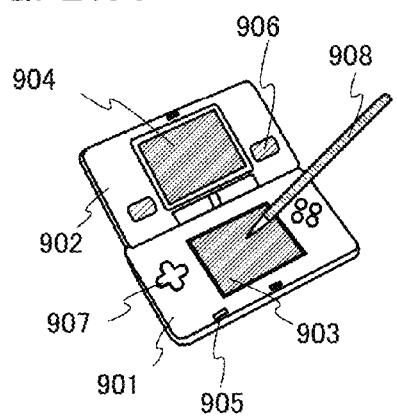
FIGS. 27A to 27F illustrate electronic appliances of an embodiment.

FIG. 27A illustrates a portable game machine, which includes a housing 901, a housing 902, a display portion 903, a display portion 904, a microphone 905, a speaker 906, an operation key 907, a stylus 908, and the like. Although the portable game machine in FIG. 27A has the two display portions 903 and 904, the number of display portions included in a portable game machine is not limited to this.

Figure 27B:
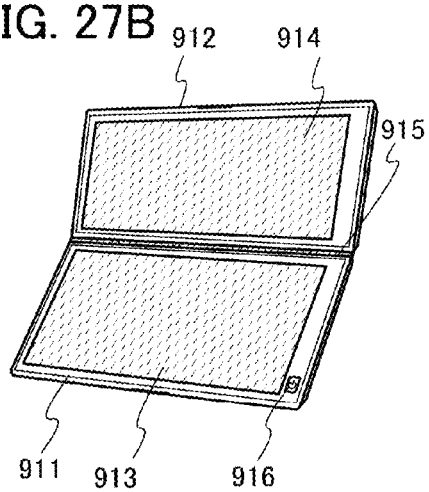

FIG. 27B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 27C:
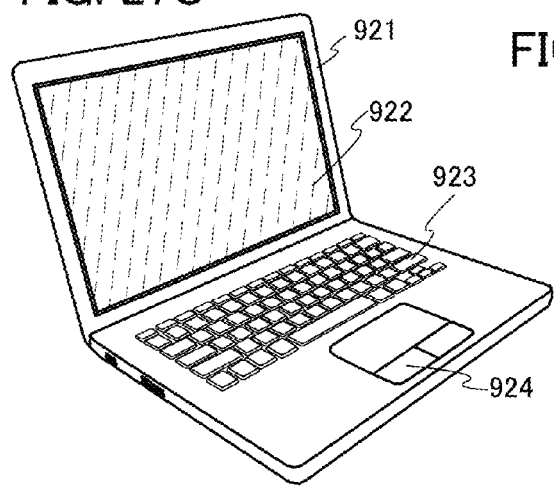

FIG. 27C illustrates a laptop personal computer, which includes a housing 921, a display portion 922, a keyboard 923, a pointing device 924, and the like.

Figure 27D:
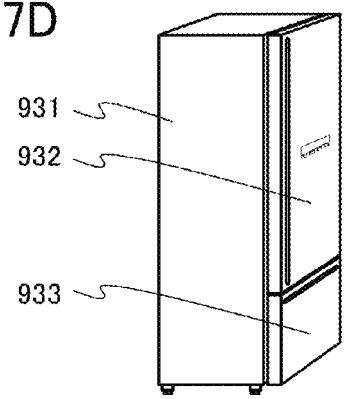

FIG. 27D illustrates an electric refrigerator-freezer, which includes a housing 931, a refrigerator door 932, a freezer door 933, and the like.

Figure 27E:
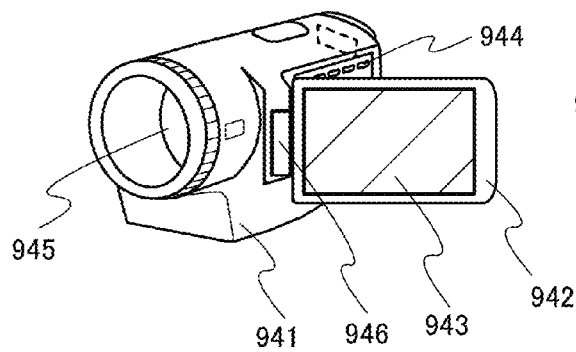

FIG. 27E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 27F:
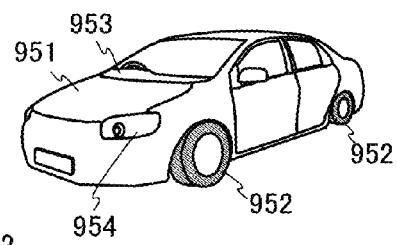
Figure 28A:
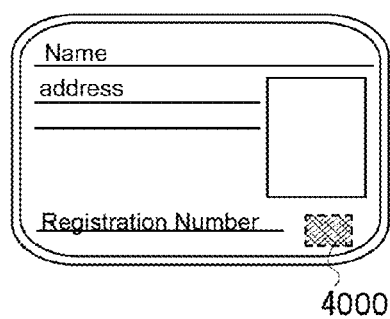
FIGS. 28A to 28F illustrate application examples of an RFID of an embodiment.
Figure 28B:
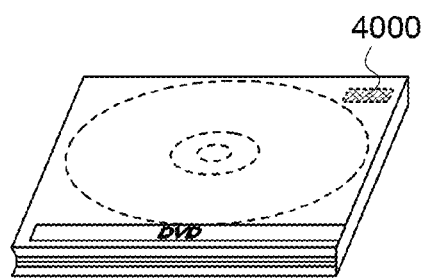
Figure 28C:
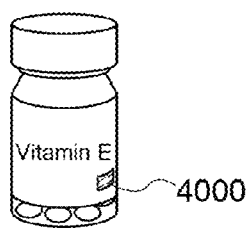
Figure 28D:
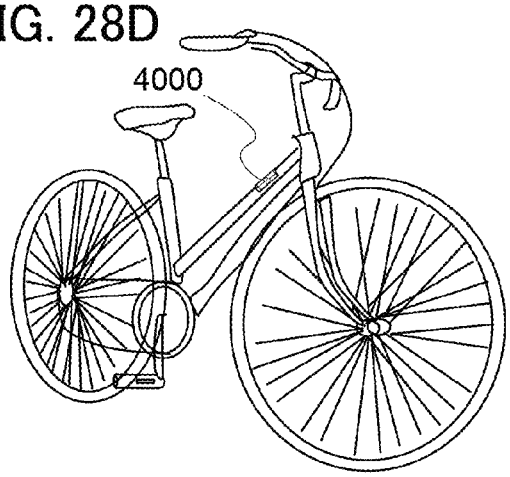
Figure 28E:
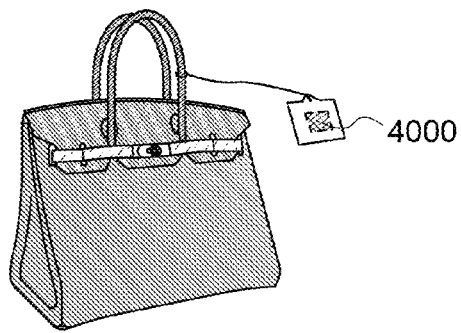
Figure 28F:
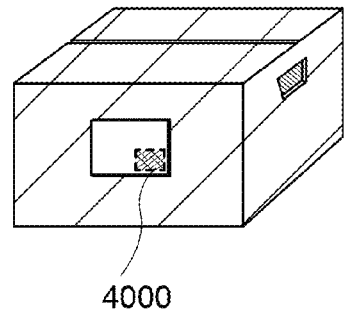

FIG. 27F illustrates a passenger car, which includes a car body 951, wheels 952, a dashboard 953, lights 954, and the like.

At least part of this embodiment can be implemented in combination with any of the other embodiments described in this specification as appropriate.

(Embodiment 9)

In this embodiment, application examples of an RFID of one embodiment of the present invention are described with reference to FIGS. 28A to 28F. The RFID is widely used and can be provided for, for example, products such as bills, coins, securities, bearer bonds, documents (e.g., driver's licenses or residence cards, see FIG. 28A), packaging containers (e.g., wrapping paper or bottles, see FIG. 28C), recording media (e.g., DVDs or video tapes, see FIG. 28B), vehicles (e.g., bicycles, see FIG. 28D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 28E and 28F).

An RFID 4000 of one embodiment of the present invention is fixed to a product by being attached to a surface thereof or embedded therein. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic appliances, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RFID can be preferably used for application in which data is not frequently written or read.

At least part of this embodiment can be implemented in combination with any of the other embodiments described in this specification as appropriate.

EXPLANATION OF REFERENCE

624: electron; 628: substance; 100: transistor; 101: semiconductor layer; 101a: semiconductor layer; 101b: semiconductor layer; 101c: semiconductor layer; 102: gate insulating film; 103: gate electrode; 104a: conductive layer; 104b: conductive layer; 105: conductive layer; 111: barrier film; 111a: barrier film; 111b: barrier film; 111c: barrier film; 111d: barrier film; 111e: barrier film; 111f: barrier film; 111g: barrier film; 112: insulating film; 113: insulating film; 114: insulating film; 115a: insulating film; 115b: insulating film; 115c: insulating film; 115d: insulating film; 115e: insulating film; 116: insulating film; 121: plug; 122: plug; 123: plug; 124: wiring; 125: conductive layer; 126: plug; 127: plug; 128: plug; 129a: plug; 129b: plug; 129c: plug; 129d: plug; 130: transistor; 131: semiconductor substrate; 132: semiconductor layer; 133a: low-resistance layer; 133b: low-resistance layer; 134: gate insulating film; 135: gate electrode; 136: insulating film; 137: insulating film; 138: insulating film; 139: plug; 140: plug; 141: plug; 142: wiring; 143: conductive layer; 144: conductive layer; 145: plug; 146: conductive layer; 147: plug; 150: capacitor; 151: conductive layer; 152: conductive layer; 152b: conductive layer; 153a: conductive layer; 153b: conductive layer; 154a: conductive layer; 154b: conductive layer; 154c: conductive layer; 154d: conductive layer; 154e: conductive layer; 160: transistor; 164: plug; 165: plug; 166: wiring; 176a: region; 176b: region; 171a: low-resistance region; 171b: low-resistance region; 181: conductive film; 190: transistor; 191: transistor; 211a: barrier film; 211b: barrier film; 211c: barrier film; 211d: barrier film; 211e: barrier film; 211f: barrier film; 215a: insulating film; 215b: insulating film; 215c: insulating film; 215d: insulating film; 215e: insulating film; 215f: insulating film; 251: conductive layer; 251a: conductive layer; 251b: conductive layer; 251c: conductive layer; 251d: conductive layer; 251e: conductive layer; 261: insulating film; 281: layer; 282: layer; 283: layer; 284: layer; 285: layer; 286: layer; 287: layer; 288: layer; 289: layer; 290: layer; 291: layer; 292: layer; 293: layer; 294: layer; 295: layer; 321: plug; 322: plug; 610: electron gun chamber; 612: optical system; 614: sample chamber; 616: optical system; 618: camera; 620: observation chamber; 622: film chamber; 632: fluorescent plate; 660a: capacitor; 660b: capacitor; 661a: transistor; 661b: transistor; 662a: transistor; 662b: transistor; 663a: inverter; 663b: inverter; 700: substrate; 701: pixel portion; 702: scan line driver circuit; 703: scan line driver circuit; 704: signal line driver circuit; 710: capacitor wiring; 712: gate wiring; 713: gate wiring; 714: drain electrode layer; 716: transistor; 717: transistor; 718: liquid crystal element; 719: liquid crystal element; 720: pixel; 721: switching transistor; 722: driver transistor; 723:

capacitor; 724: light-emitting element; 725: signal line; 726: scan line; 727: power supply line; 728: common electrode; 800: RF tag; 801: communication device; 802: antenna; 803: radio signal; 804: antenna; 805: rectifier circuit; 806: constant voltage circuit; 807: demodulation circuit; 808: modulation circuit; 809: logic circuit; 810: memory circuit; 811: ROM; 901: housing; 902: housing; 903: display portion; 904: display portion; 905: microphone; 906: speaker; 907: operation key; 908: stylus; 911: housing; 912: housing; 913: display portion; 914: display portion; 915: joint; 916: operation key; 921: housing; 922: display portion; 923: keyboard; 924: pointing device; 931: housing; 932: refrigerator door; 933: freezer door; 941: housing; 942: housing; 943: display portion; 944: operation key; 945: lens; 946: operation keys; 951: car body; 952: wheel; 953: dashboard; 954: light; 1189: ROM interface; 1190: substrate; 1191: ALU; 1192: ALU controller; 1193: instruction decoder; 1194: interrupt controller; 1195: timing controller; 1196: register; 1197: register controller; 1198: bus interface; 1199: ROM; 1200: memory element; 1201: circuit; 1202: circuit; 1203: switch; 1204: switch; 1206: logic element; 1207: capacitor; 1208: capacitor; 1209: transistor; 1210: transistor; 1213: transistor; 1214: transistor; 1220: circuit; 2100: transistor; 2200: transistor; 3001: wiring; 3002: wiring; 3003: wiring; 3004: wiring; 3005: wiring; 3200: transistor; 3300: transistor; 3400: capacitor; 4000: RFID; 5100: pellet; 5100*a*: pellet; 5100*b*: pellet; 5101: ion; 5102: zinc oxide layer; 5103: particle; 5105*a*: pellet; 5105*a*1: region; 5105*a*2: pellet; 5105*b*: pellet; 5105*c*: pellet; 5105*d*: pellet; 5105*d*1: region; 5105*e*: pellet; 5120: substrate; 5130: target; 5161: region.

This application is based on Japanese Patent Application serial no. 2013-272190 filed with Japan Patent Office on Dec. 27, 2013, the entire contents of which are hereby incorporated by reference.

The invention claimed is:

1. A semiconductor device comprising:
a first transistor;
a capacitor over the first transistor; and
a second transistor over the capacitor, the second transistor overlapping with at least part of the capacitor,
wherein the second transistor includes an oxide semiconductor layer,
wherein the capacitor includes an electrode which is electrically connected to the second transistor,
wherein the oxide semiconductor layer includes an opening, and
wherein the electrode is in contact with the oxide semiconductor layer in the opening.

2. The semiconductor device according to claim 1, wherein the first transistor includes single crystal silicon.

3. The semiconductor device according to claim 1,
wherein the second transistor includes a first conductive layer and a second conductive layer which are in contact with the oxide semiconductor layer,
wherein the first conductive layer includes the opening, and
wherein the electrode is in contact with the first conductive layer in the opening.

4. A semiconductor device comprising:
a first transistor;
a capacitor over the first transistor; and
a second transistor over the capacitor,
wherein the capacitor includes n insulating films and k conductive layers,
wherein n is a natural number and k is a natural number of 2 or more,
wherein each of the n insulating films is between at least two conductive layers of the k conductive layers,
wherein the second transistor includes an oxide semiconductor layer,
wherein the capacitor includes an electrode which is electrically connected to one of a source and a drain of the second transistor,
wherein the oxide semiconductor layer includes an opening, and
wherein the electrode is in contact with the oxide semiconductor layer in the opening.

5. The semiconductor device according to claim 4, wherein the first transistor includes single crystal silicon.

6. The semiconductor device according to claim 4,
wherein the second transistor includes a first conductive layer and a second conductive layer which are in contact with the oxide semiconductor layer,
wherein the first conductive layer includes the opening, and
wherein the electrode is in contact with the first conductive layer in the opening.

7. The semiconductor device according to claim 4, wherein the n insulating films have a function of blocking at least one of hydrogen, water, and oxygen.

8. The semiconductor device according to claim 4, wherein the n insulating films include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

9. The semiconductor device according to claim 4, wherein the capacitor and the second transistor overlap each other.

10. A semiconductor device comprising:
a first transistor;
a capacitor over the first transistor; and
a second transistor over the capacitor,
wherein the capacitor includes m conductive layers and n insulating films,
wherein m is a natural number of 3 or more, and n is a natural number,
wherein a first insulating film of the n insulating films is between a first conductive layer and a second conductive layer of the m conductive layers,
wherein a second insulating film of the n insulating films is between the second conductive layer and a third conductive layer of the m conductive layers,
wherein the first conductive layer is electrically connected to the third conductive layer and the second transistor,
wherein the third conductive layer is electrically connected to the second transistor by a plug,
wherein a semiconductor layer of the second transistor includes an opening, and
wherein the plug is in contact with the semiconductor layer in the opening.

11. The semiconductor device according to claim 10, wherein the first transistor includes single crystal silicon.

12. The semiconductor device according to claim 10, wherein the second transistor includes an oxide semiconductor layer.

13. The semiconductor device according to claim 10,
wherein the second transistor includes a source or drain electrode which is in contact with a semiconductor layer of the second transistor,
wherein the source or drain electrode includes the opening, and
wherein the plug is in contact with the source or drain electrode in the opening.

14. The semiconductor device according to claim 10, wherein the n insulating films have a function of blocking at least one of hydrogen, water, and oxygen.

15. The semiconductor device according to claim 10, wherein the n insulating films include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

16. The semiconductor device according to claim 10, wherein the capacitor and the second transistor overlap each other.

\* \* \* \* \*